US012568827B2

(12) United States Patent
Chen et al.

(10) Patent No.: US 12,568,827 B2
(45) Date of Patent: Mar. 3, 2026

(54) METHOD FOR FABRICATING DEVICE DIE

(71) Applicant: Taiwan Semiconductor Manufacturing Company, Ltd., Hsinchu (TW)

(72) Inventors: Shih-Wei Chen, Hsinchu (TW); Tzuan-Horng Liu, Taoyuan City (TW); Chia-Hung Liu, Hsinchu City (TW); Hao-Yi Tsai, Hsinchu City (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 0 days.

(21) Appl. No.: 18/418,318

(22) Filed: Jan. 21, 2024

(65) Prior Publication Data

US 2024/0162171 A1     May 16, 2024

Related U.S. Application Data

(62) Division of application No. 17/401,318, filed on Aug. 13, 2021, now Pat. No. 11,916,025.

(51) Int. Cl.
| | |
|---|---|
| *H01L 21/56* | (2006.01) |
| *H01L 23/00* | (2006.01) |
| *H01L 23/31* | (2006.01) |
| *H01L 23/60* | (2006.01) |
| *H01L 25/065* | (2023.01) |

(52) U.S. Cl.
CPC ............ *H01L 23/60* (2013.01); *H01L 21/568* (2013.01); *H01L 23/3135* (2013.01); *H01L 24/32* (2013.01); *H01L 24/83* (2013.01);

*H01L 25/0657* (2013.01); *H01L 24/20* (2013.01); *H01L 24/96* (2013.01); *H01L 2224/32145* (2013.01)

(58) Field of Classification Search
None
See application file for complete search history.

(56) References Cited

U.S. PATENT DOCUMENTS

| | | | |
|---|---|---|---|
| 9,000,584 | B2 | 4/2015 | Lin et al. |
| 9,048,222 | B2 | 6/2015 | Hung et al. |
| 9,048,233 | B2 | 6/2015 | Wu et al. |
| 9,064,879 | B2 | 6/2015 | Hung et al. |
| 9,111,949 | B2 | 8/2015 | Yu et al. |
| 9,263,511 | B2 | 2/2016 | Yu et al. |
| 9,281,254 | B2 | 3/2016 | Yu et al. |
| 9,368,460 | B2 | 6/2016 | Yu et al. |
| 9,372,206 | B2 | 6/2016 | Wu et al. |

(Continued)

OTHER PUBLICATIONS

"Semiconductor Wafer—Overview and Facts." AnySilicon, Apr. 13, 2021, https://anysilicon.com/semiconductor-wafer/ (Year: 2023).*

*Primary Examiner* — Jay C Chang
(74) *Attorney, Agent, or Firm* — JCIPRNET

(57) ABSTRACT

A device die including a first semiconductor die, a second semiconductor die, an anti-arcing layer and a first insulating encapsulant is provided. The second semiconductor die is stacked over and electrically connected to the first semiconductor die. The anti-arcing layer is in contact with the second semiconductor die. The first insulating encapsulant is disposed over the first semiconductor die and laterally encapsulates the second semiconductor die. Furthermore, methods for fabricating device dies are provided.

20 Claims, 92 Drawing Sheets

(56)             References Cited

U.S. PATENT DOCUMENTS

| | | | |
|---|---|---|---|
| 9,496,189 B2 | 11/2016 | Yu et al. | |
| 2011/0278703 A1 * | 11/2011 | Pagaila | H01L 24/19 |
| | | | 257/659 |
| 2015/0287697 A1 * | 10/2015 | Tsai | H01L 24/97 |
| | | | 257/773 |
| 2021/0090966 A1 * | 3/2021 | Kuo | H01L 23/60 |

* cited by examiner

METHOD FOR FABRICATING DEVICE DIE

CROSS-REFERENCE TO RELATED APPLICATION

This application is a divisional application of and claims the priority benefit of a prior application Ser. No. 17/401, 318, filed on Aug. 13, 2021 and now allowed. The entirety of the above-mentioned patent application is hereby incorporated by reference herein and made a part of this specification.

BACKGROUND

Semiconductor devices are used in a variety of electronic applications, such as personal computers, cell phones, digital cameras, and other electronic equipment, as examples. Semiconductor devices are typically fabricated by sequentially depositing insulating or dielectric layers, conductive layers, and semi-conductive layers of material over a semiconductor substrate, and patterning the various material layers using lithography to form circuit components and elements thereon. Dozens or hundreds of integrated circuits are typically manufactured on a single semiconductor wafer. The individual dies are singulated by sawing the integrated circuits along a scribe line. The individual dies are then packaged separately, in multi-chip modules, or in other types of packaging, for example.

In semiconductor fabrication, charges may be accumulated and cause electro-static discharge (ESD). Accordingly, semiconductor devices may be damaged due to ESD and yields of the semiconductor devices may be decreased.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIGS. 1A through 1M are cross-sectional views schematically illustrating a process flow for fabricating System on Integrated Circuit or System-on-Integrated-Chips (SoIC) structures in accordance with some embodiments of the present disclosure.

FIGS. 2A through 2I are cross-sectional views schematically illustrating a process flow for fabricating a Package-on-Package (PoP) structure in accordance with some embodiments of the present disclosure.

FIGS. 7A through 7L are cross-sectional views schematically illustrating a process flow for fabricating SoIC structures in accordance with some other embodiments of the present disclosure.

FIGS. 8A through 8I are cross-sectional views schematically illustrating a process flow for fabricating a PoP structure in accordance with some alternative embodiments of the present disclosure.

DETAILED DESCRIPTION

Figure 1A:
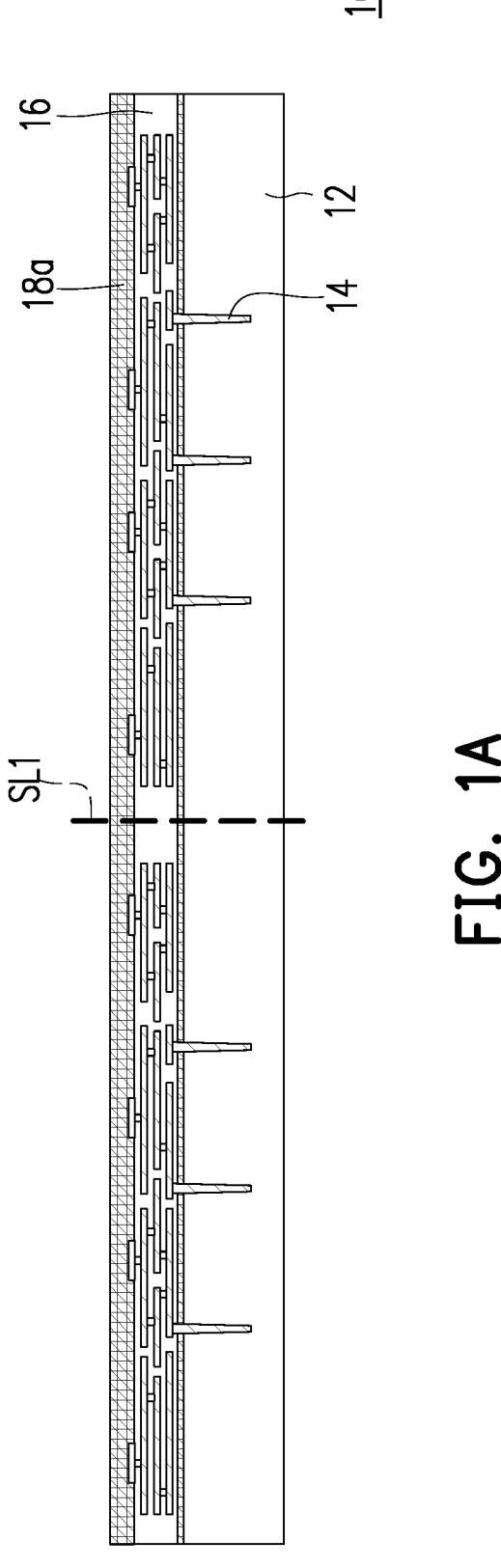

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Other features and processes may also be included. For example, testing structures may be included to aid in the verification testing of the 3D packaging or 3DIC devices. The testing structures may include, for example, test pads formed in a redistribution layer or on a substrate that allows the testing of the 3D packaging or 3DIC, the use of probes and/or probe cards, and the like. The verification testing may be performed on intermediate structures as well as the final structure. Additionally, the structures and methods disclosed herein may be used in conjunction with testing methodologies that incorporate intermediate verification of known good dies to increase yields and decrease costs.

Package and the method of forming the same are provided in accordance with various exemplary embodiments. The intermediate stages of forming the package are illustrated. The variations of the embodiments are discussed. Throughout the various views and illustrative embodiments, like reference numbers are used to designate like elements.

FIGS. 1A through 1M are cross-sectional views schematically illustrating a process flow for fabricating SoIC structures in accordance with some embodiments of the present disclosure.

Referring to FIG. 1A, a wafer 10 including semiconductor dies is provided. The semiconductor dies may be logic dies, System-on-Chip (SoC) dies or other suitable semiconductor dies. The wafer 10 may include a semiconductor substrate 12 (e.g., a semiconductor substrate), through substrate vias 14 embedded in the semiconductor substrate 12, an interconnect structure 16 disposed on the semiconductor substrate 12, and a bonding dielectric layer 18a disposed on the interconnect structure 16, wherein the through substrate vias 14 are electrically connected to the interconnect structure 116. The semiconductor substrate 12 of the semiconductor wafer 10 may include a crystalline silicon wafer. The semiconductor substrate 12 may include various doped regions depending on design requirements (e.g., p-type substrate or n-type substrate). In some embodiments, the doped regions may be doped with p-type or n-type dopants. The doped regions may be doped with p-type dopants, such as boron or $BF_2$; n-type dopants, such as phosphorus or arsenic; and/or combinations thereof. The doped regions may be configured for n-type Fin-type Field Effect Transistors (FinFETs) and/or p-type FinFETs. In some alternative embodiments, the semiconductor substrate 12 may be made of some other suitable elemental semiconductor, such as diamond or germanium; a suitable compound semiconductor, such as gallium arsenide, silicon carbide, indium arsenide, or indium phosphide; or a suitable alloy semiconductor, such as silicon germanium carbide, gallium arsenic phosphide, or gallium indium phosphide.

The through substrate vias 14 may be formed by forming recesses in the semiconductor substrate 12 by, for example, etching, milling, laser techniques, a combination thereof, or the like. A thin barrier layer may be conformally deposited over the front side of the semiconductor substrate 12 and in the openings, such as by chemical vapor deposition (CVD), atomic layer deposition (ALD), physical vapor deposition (PVD), thermal oxidation, a combination thereof, or the like. The barrier layer may comprise a nitride or an oxynitride, such as titanium nitride, titanium oxynitride, tantalum nitride, tantalum oxynitride, tungsten nitride, a combination thereof, or the like. A conductive material is deposited over the thin barrier layer and in the openings. The conductive material may be formed by an electro-chemical plating process, CVD, ALD, PVD, a combination thereof, or the like. Examples of conductive materials are copper, tungsten, aluminum, silver, gold, a combination thereof, or the like. Excess conductive material and barrier layer may be removed from the front side of the semiconductor substrate 12 by, for example, chemical mechanical polishing. Thus, in some embodiments, the through substrate vias 14 may comprise a conductive material and a thin barrier layer between the conductive material and the semiconductor substrate 12.

The interconnect structure 16 may include one or more dielectric layers (for example, one or more interlayer dielectric (ILD) layers, intermetal dielectric (IMD) layers, or the like) and interconnect wirings embedded in the one or more dielectric layers, and the interconnect wirings are electrically connected to the semiconductor devices (e.g., FinFETs) formed in the semiconductor substrate 12 and/or the through substrate vias 14. The material of the one or more dielectric layers may include silicon oxide ($SiO_x$, where x>0), silicon nitride ($SiN_x$, where x>0), silicon oxynitirde ($SiO_xN_y$, where x>0 and y>0) or other suitable dielectric material. The interconnect wirings may include metallic wirings. For example, the interconnect wirings include copper wirings, copper pads, aluminum pads or combinations thereof. In some embodiments, the through substrate vias 14 may extend through one or more layers of the interconnect structure 16 and into the semiconductor substrate 12.

The material of the bonding dielectric layer 18a may be silicon oxide ($SiO_x$, where x>0), silicon nitride ($SiN_x$, where x>0), silicon oxynitirde ($SiO_xN_y$, where x>0 and y>0) or other suitable dielectric material. The bonding dielectric layer 18a may be formed by depositing a dielectric material through a chemical vapor deposition (CVD) process (e.g., a plasma enhanced CVD process or other suitable process).

Figure 1B:
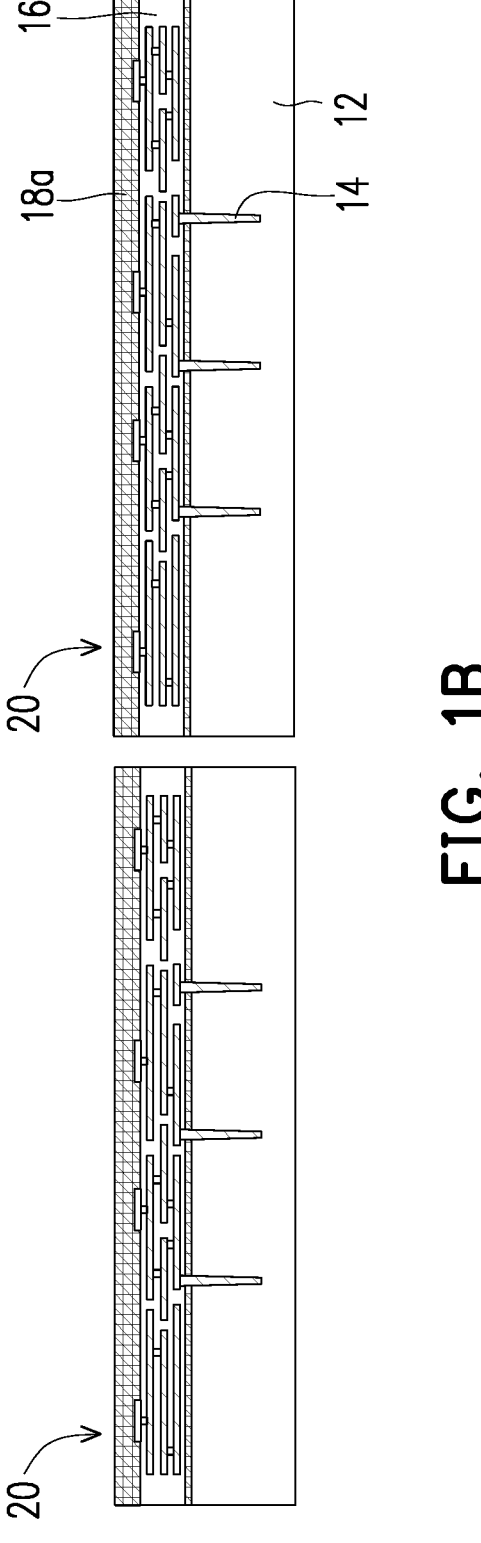

Referring to FIG. 1A and FIG. 1B, the semiconductor wafer 10 is singulated by a wafer sawing process performed along scribe lines SL1 such that singulated semiconductor dies 20 are obtained. Each of the singulated semiconductor dies 20 may include a semiconductor substrate 12, through substrate vias 14 embedded in the semiconductor substrate 12, an interconnect structure 16 disposed on the semiconductor substrate 12, and a bonding dielectric layer 18a disposed on the interconnect structure 16. As illustrated in FIG. 1B, the through substrate vias 14 are buried in the semiconductor substrate 12 and the interconnect structure 16. The through semiconductor vias 14 are not revealed from a back surface of the semiconductor substrate 12 at this stage.

Figure 1C:
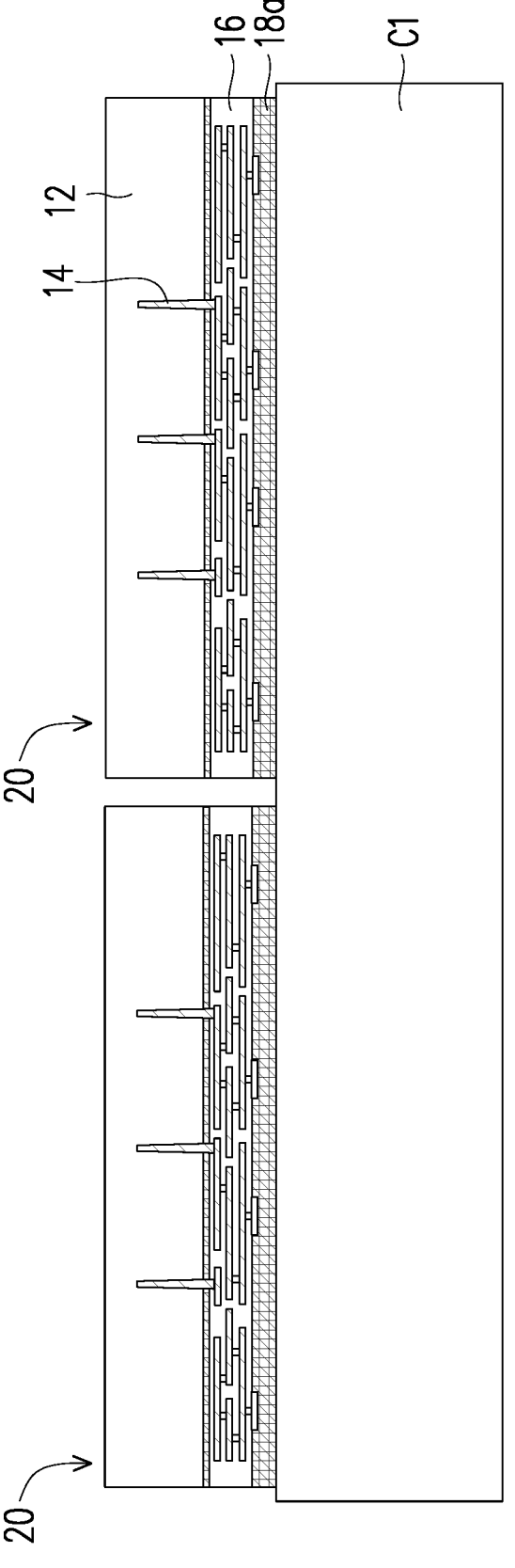

Referring to FIG. 1C, the singulated semiconductor dies 20 are picked-up and placed on a carrier C1 in side-by-side manner such that front surfaces of the singulated semiconductor dies 20 are bonded to the carrier C1. The carrier C1 may be a semiconductor wafer such as a silicon wafer. The carrier C1 may have a round top-view shape and a size of a silicon wafer. For example, carrier C1 may have an 8-inch diameter, a 12-inch diameter, or the like. The singulated semiconductor dies 20 are bonded to the carrier C1 through a chip-to-wafer bonding process. A bonding process is performed to bond the bonding dielectric layers 18a of the singulated semiconductor dies 20 with the carrier C1. The bonding process may be a direct bonding process. After performing the above-mentioned direct bonding process, a semiconductor-to-dielectric bonding interface such as silicon-to-nitride (Si—$SiN_x$) bonding interface may be formed between the bonding dielectric layer 18a and the carrier C1.

Figure 1D:
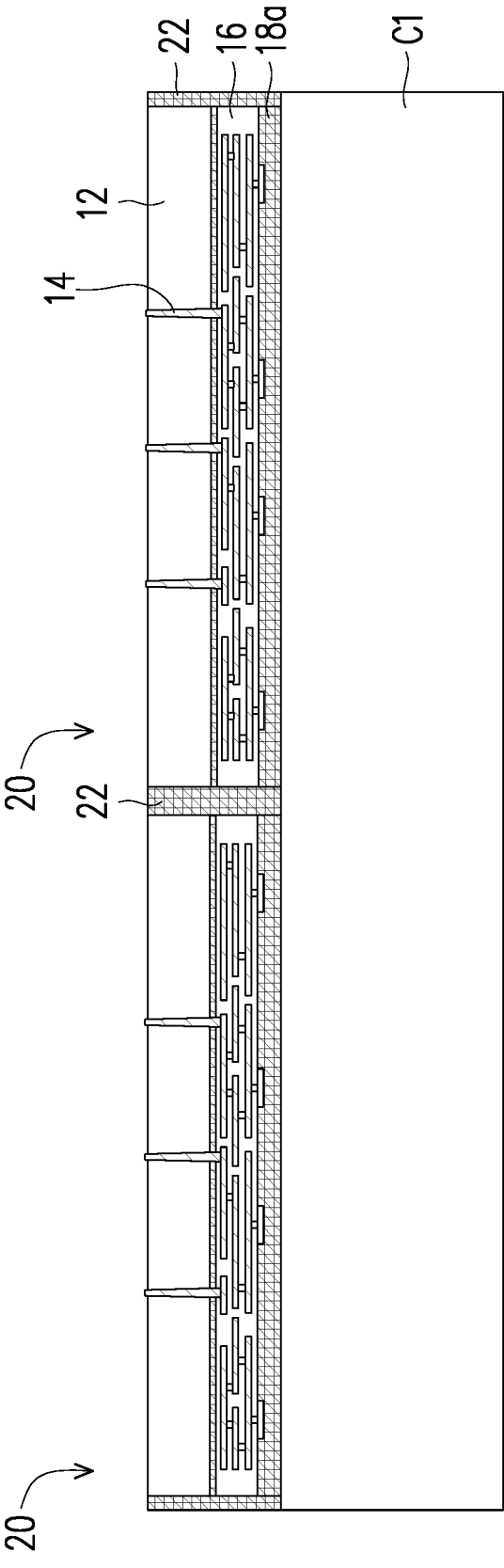

Referring to FIG. 1D, an insulating encapsulation material is formed over the carrier C1 to cover the singulated semiconductor dies 20 which are bonded with the carrier C1. The insulating encapsulation material may be a molding compound (e.g., epoxy or other suitable resin) formed through an over-molding process. The insulating encapsulation material fills the gaps between neighboring semiconductor dies 20 and covers back surfaces of the singulated semiconductor dies 20. After forming the insulating encapsulation material over the carrier C1, the insulating encapsulation material and the semiconductor substrates 12 of the semiconductor dies 20 are partially remove such that the semiconductor substrates 12 of the semiconductor dies 20 are thinned and an insulating encapsulant 22 are formed to laterally encapsulate the semiconductor dies 20. The insulating encapsulation material and the semiconductor substrate 12 of the semiconductor dies 20 may be partially remove through a planarization process such as a Chemical Mechanical Polish (CMP) process and/or a mechanical grinding process. After performing the above-mentioned planarization process, the thickness of the insulating encapsulant 22 is substantially equal to that of the semiconductor dies 20. In other words, the top surface of the insulating encapsulant 22 is substantially level with back surfaces of the semiconductor dies 20. As illustrated in FIG. 1D, after performing the above-mentioned planarization process, the through semiconductor vias 14 are revealed from the back surfaces of the semiconductor substrates 12 at this stage. The through semiconductor vias 14 may protrude from the back surfaces of the semiconductor substrates 12.

Figure 1E:
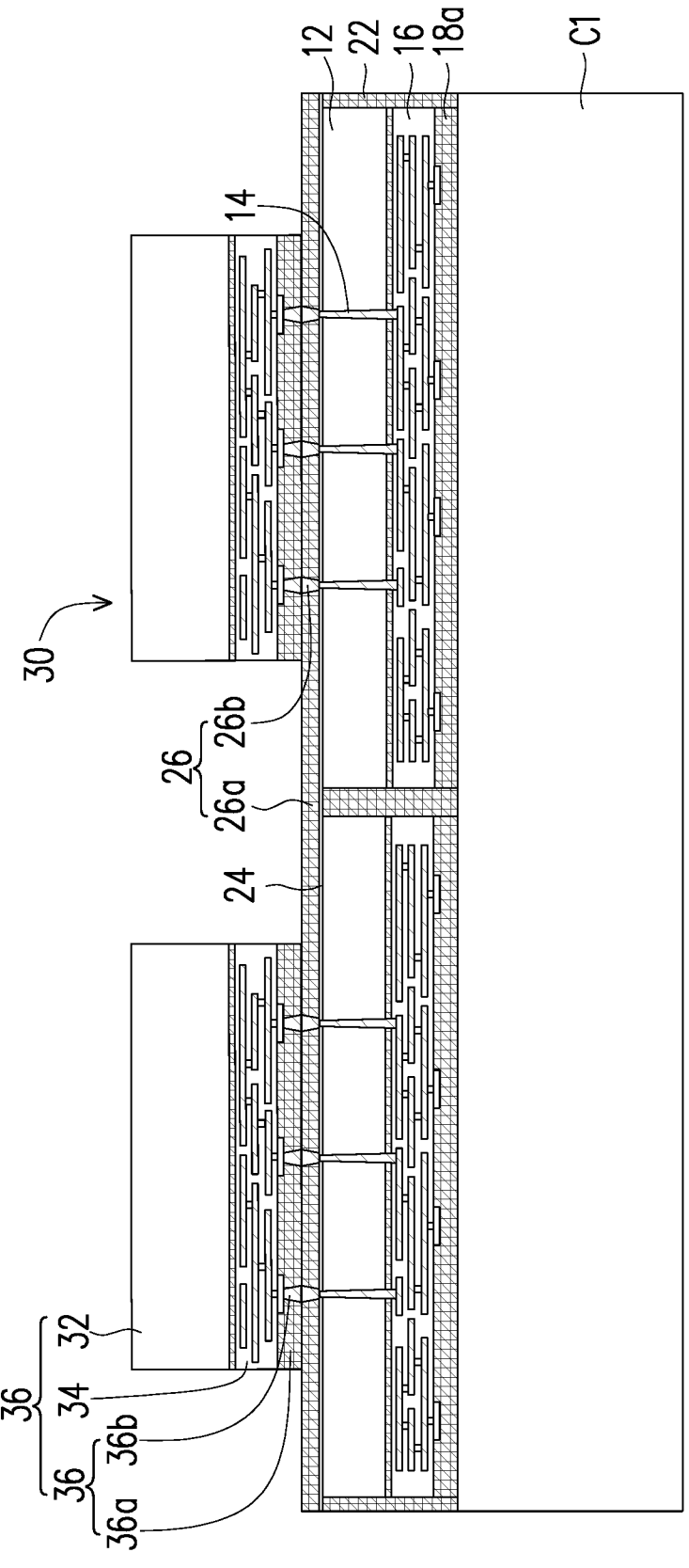

Referring to FIG. 1E, a dielectric material may be formed over the back surfaces of the semiconductor substrates 12 and the top surface of the insulating encapsulant 22 to cover the revealed through semiconductor vias 14. The dielectric material may be or include silicon oxide (SiO$_x$, where x>0), silicon nitride (SiN$_x$, where x>0), silicon oxynitirde (Si-O$_x$N$_y$, where x>0 and y>0) or other suitable dielectric material. A planarization process such as a Chemical Mechanical Polish (CMP) process and/or a mechanical grinding process may be performed to partially remove the dielectric material such that a planarization layer 24 is formed on the back surfaces of the semiconductor substrates 12 and the top surface of the insulating encapsulant 22. The top surface of the planarization layer 24 is substantially level with top ends of the through semiconductor vias 14.

After forming the planarization layer 24, a bonding structure 26 including a bonding dielectric layer 26a and bonding conductors 26b embedded in the bonding dielectric layer 26a. The material of the bonding dielectric layer 26a may be silicon oxide (SiO$_x$, where x>0), silicon nitride (SiN$_x$, where x>0), silicon oxynitirde (SiO$_x$N$_y$, where x>0 and y>0) or other suitable dielectric material, and the bonding conductors 26b may be conductive vias (e.g., copper vias), conductive pads (e.g., copper pads) or combinations thereof. The bonding structure 26 may be formed by depositing a dielectric material through a chemical vapor deposition (CVD) process (e.g., a plasma enhanced CVD process or other suitable process); patterning the dielectric material to form the bonding dielectric layer 26a including openings or through holes; and filling conductive material in the openings or through holes defined in the bonding dielectric layer 26a to form the bonding conductors 26b embedded in the bonding dielectric layer 26a. In some embodiments, the conductive material for forming the bonding conductors 26b may be formed through a chemical vapor deposition (CVD) process (e.g., a plasma enhanced CVD process or other suitable process) followed by a planarization process (e.g., a Chemical Mechanical Polish (CMP) process and/or a mechanical grinding process).

After forming the bonding structure 26, semiconductor dies 30 are provided. The semiconductor dies 30 may be logic dies, System-on-Chip (SoC) dies or other suitable semiconductor dies. The semiconductor dies 30 and the semiconductor dies 20 may perform the same function or different functions. In some embodiments, the semiconductor dies 30 and the semiconductor dies 30 are System on Chip (SoC) dies. Each of the semiconductor dies 30 may include a semiconductor substrate 32 and an interconnect structure 34 disposed on the semiconductor substrate 32 respectively. Furthermore, bonding structures 36 may be formed on the interconnect structures 34 of the semiconductor dies 30. The bonding structure 36 includes a bonding dielectric layer 36a and bonding conductors 36b embedded in the bonding dielectric layer 36a. The material of the bonding dielectric layer 36a may be silicon oxide (SiO$_x$, where x>0), silicon nitride (SiN$_x$, where x>0), silicon oxynitirde (SiO$_x$N$_y$, where x>0 and y>0) or other suitable dielectric material, and the bonding conductors 36b may be conductive vias (e.g., copper vias), conductive pads (e.g., copper pads) or combinations thereof. The bonding structure 36 may be formed by depositing a dielectric material through a chemical vapor deposition (CVD) process (e.g., a plasma enhanced CVD process or other suitable process); patterning the dielectric material to form the bonding dielectric layer 36a including openings or through holes; and filling conductive material in the openings or through holes defined in the bonding dielectric layer 36a to form the bonding conductors 36b embedded in the bonding dielectric layer 36a. In some embodiments, the conductive material for forming the bonding conductors 36b may be formed through a chemical vapor deposition (CVD) process (e.g., a plasma enhanced CVD process or other suitable process) followed by a planarization process (e.g., a Chemical Mechanical Polish (CMP) process and/or a mechanical grinding process).

A bonding process (e.g., a chip-to-wafer bonding process) is performed to bond the bonding structures 36 formed on the semiconductor dies 30 with bonding regions of the bonding structure 26. The bonding process may be a hybrid bonding process that includes dielectric-to-dielectric bonding and metal-to-metal bonding. After performing the above-mentioned bonding process, a dielectric-to-dielectric bonding interface is formed between the bonding dielectric layer 26a and the bonding dielectric layer 36a, and metal-to-metal bonding interfaces are formed between the bonding conductors 26b and bonding conductors 36b. After performing the bonding process, the semiconductor dies 30 are electrically connected to the semiconductor dies 20 through the bonding structures 36 and the bonding structure 26.

As illustrated in FIG. 1E, the semiconductor dies 30 may be disposed above the semiconductor dies 20. The lateral dimension (e.g., width and/or length) of the semiconductor dies 20 may be greater than the lateral dimension (e.g., width and/or length) of the semiconductor dies 30. Since the bonding structures 36 are merely bonded with bonding regions of the bonding structure 26, portions of the bonding dielectric layer 26a are not covered by the bonding structures 36.

Figure 1F:
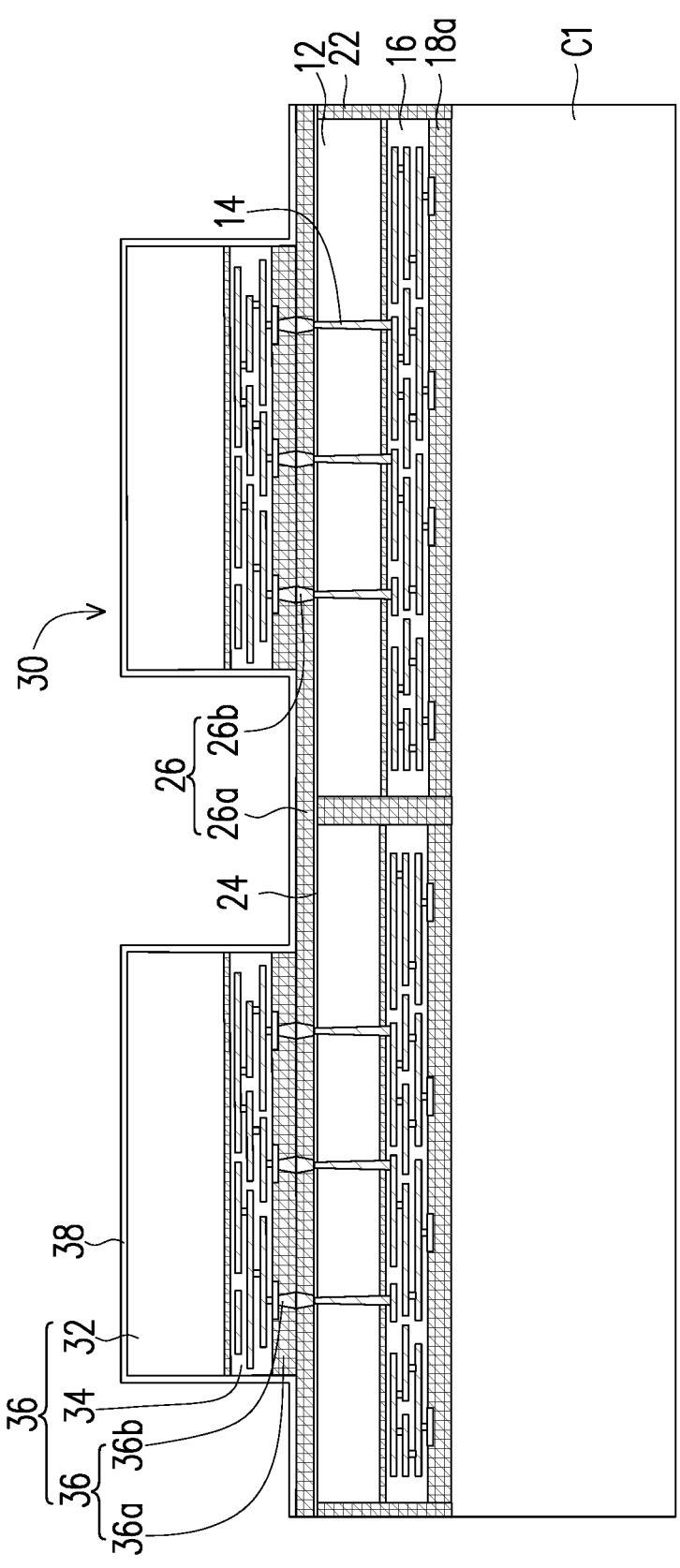

Referring FIG. 1F, an anti-arcing material layer 38 is formed to cover the semiconductor dies 30 and the portions of the bonding dielectric layer 26a which are not covered by the bonding structures 36. The anti-arcing material layer 38 is capable of reducing charge accumulation such that discharging or arcing phenomenon during the subsequently performed processes can be minimized. In some embodiments, the anti-arcing material layer 38 conformally covers the back surface of the semiconductor dies 30, sidewalls of the semiconductor dies 30, sidewalls of the bonding structures 26 and the portions of the bonding dielectric layer 26a which are not covered by the bonding structures 36. The anti-arcing material layer 38 may be deposited through a chemical vapor deposition (CVD) process (e.g., a plasma enhanced CVD process or other suitable process), ALD process, PVD process, a combination thereof, or the like. The thickness of the anti-arcing material layer 38 may range from about 500 angstroms to about 1000 angstroms. The anti-arcing material layer 38 may be or include titanium layer or other suitable metallic layer.

Figure 1G:
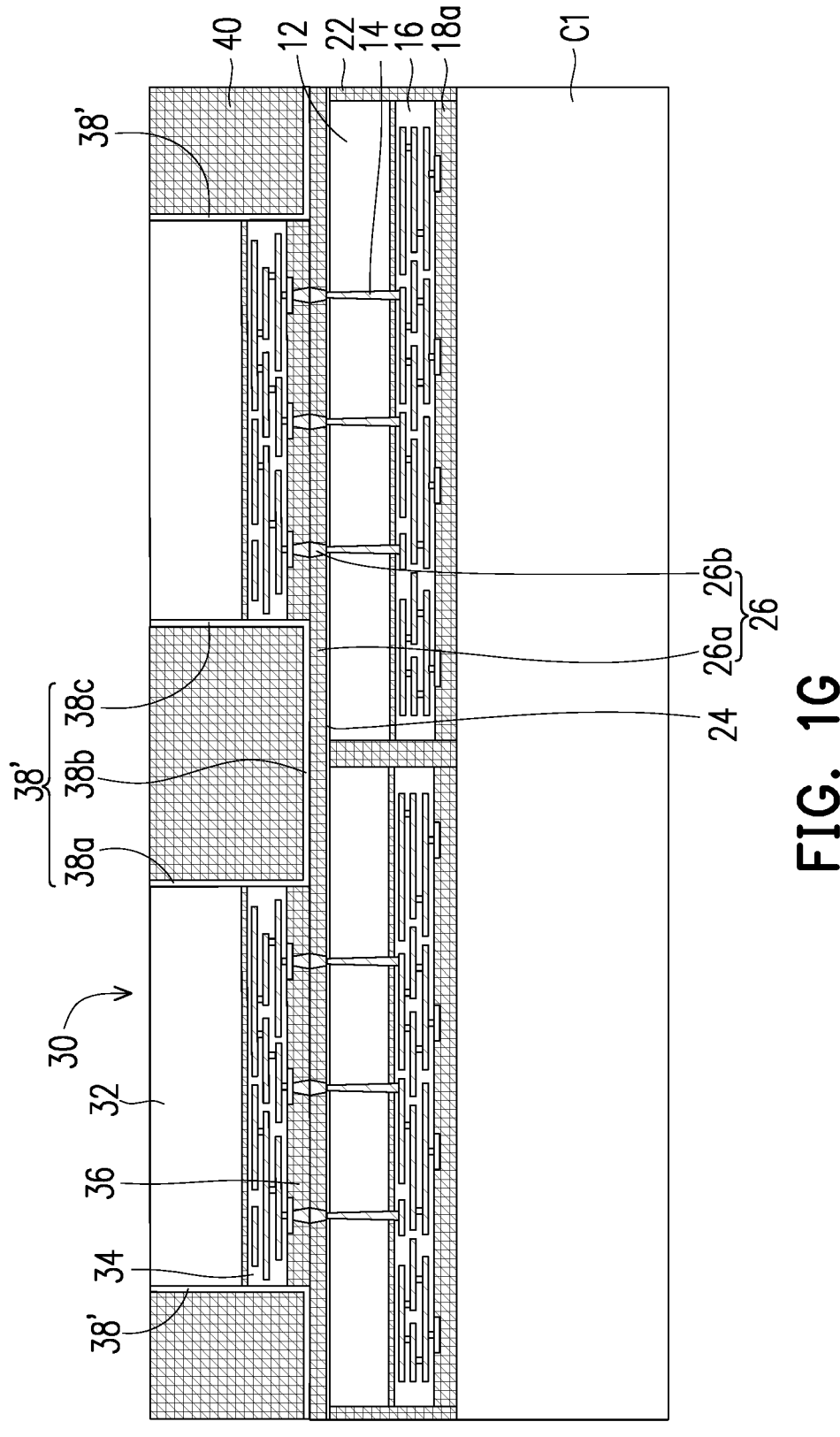

Referring to FIG. 1F and FIG. 1G, an insulating encapsulation material is formed over the anti-arcing material layer 38. The insulating encapsulation material may be a molding compound (e.g., epoxy or other suitable resin) formed through an over-molding process. The insulating encapsulation material fills the gaps between neighboring semiconductor dies 30. After forming the insulating encapsulation material over the anti-arcing material layer 38, the insulating encapsulation material and the anti-arcing material layer 38 are partially remove until the semiconductor substrates 32 of the semiconductor dies 30 are revealed such that anti-arcing layers 38' and an insulating encapsulant 40 are formed. The anti-arcing layers 38' may be considered as charge releasing layers for minimizing discharging or arcing phenomenon. The insulating encapsulation material and the anti-arcing material layer 38 may be partially remove through a planarization process such as a Chemical Mechanical Polish (CMP) process and/or a mechanical grinding process. After performing the above-mentioned planarization process, top ends of the anti-arcing layers 38' are substantially level with the top surface of the insulating encapsulant 40 and back surfaces of the semiconductor dies 30. As illustrated in FIG. 1G, after performing the above-mentioned planarization process, the top ends of the anti-arcing layers 38' are revealed.

Each of the anti-arcing layers 38' may respectively include first portions 38a and a second portion 38b connected to the first portions 38a. The first portions 38a extend vertically to cover sidewalls of the semiconductor dies 30, and the second portions 38b extend horizontally to cover the bonding structure 26. As illustrated in FIG. 1G, the first portions 38a cover sidewalls of the semiconductor substrates 32, sidewalls of the interconnect structures 34 and sidewalls of the bonding structures 36. The semiconductor die 30 is spaced apart from the insulating encapsulant 40 by the first portions 38a, and the semiconductor dies 20 and the bonding structure 26 are spaced apart from the insulating encapsulant 40 by the second portions 38b. In some embodiments, top ends of the first portions 38a of the anti-arcing layers 38' are substantially level with the top surface of the insulating encapsulant 40 and the back surfaces of the semiconductor dies 30.

Charge accumulation can be released by the anti-arcing layers 38' during fabrication processes illustrated in FIGS. 1G through 1M. Accordingly, the anti-arcing layers 38' may protect the semiconductor dies 20 and 30 from being damaged by ESD occurred during subsequently performed bonding and de-bonding processes, such as the bonding process illustrated in FIG. 1H, the de-bonding process illustrated in FIG. 1I, the de-bonding process and the frame mount process illustrated in FIG. 1L, and the frame mount process illustrated in FIG. 1M.

Figure 1H:
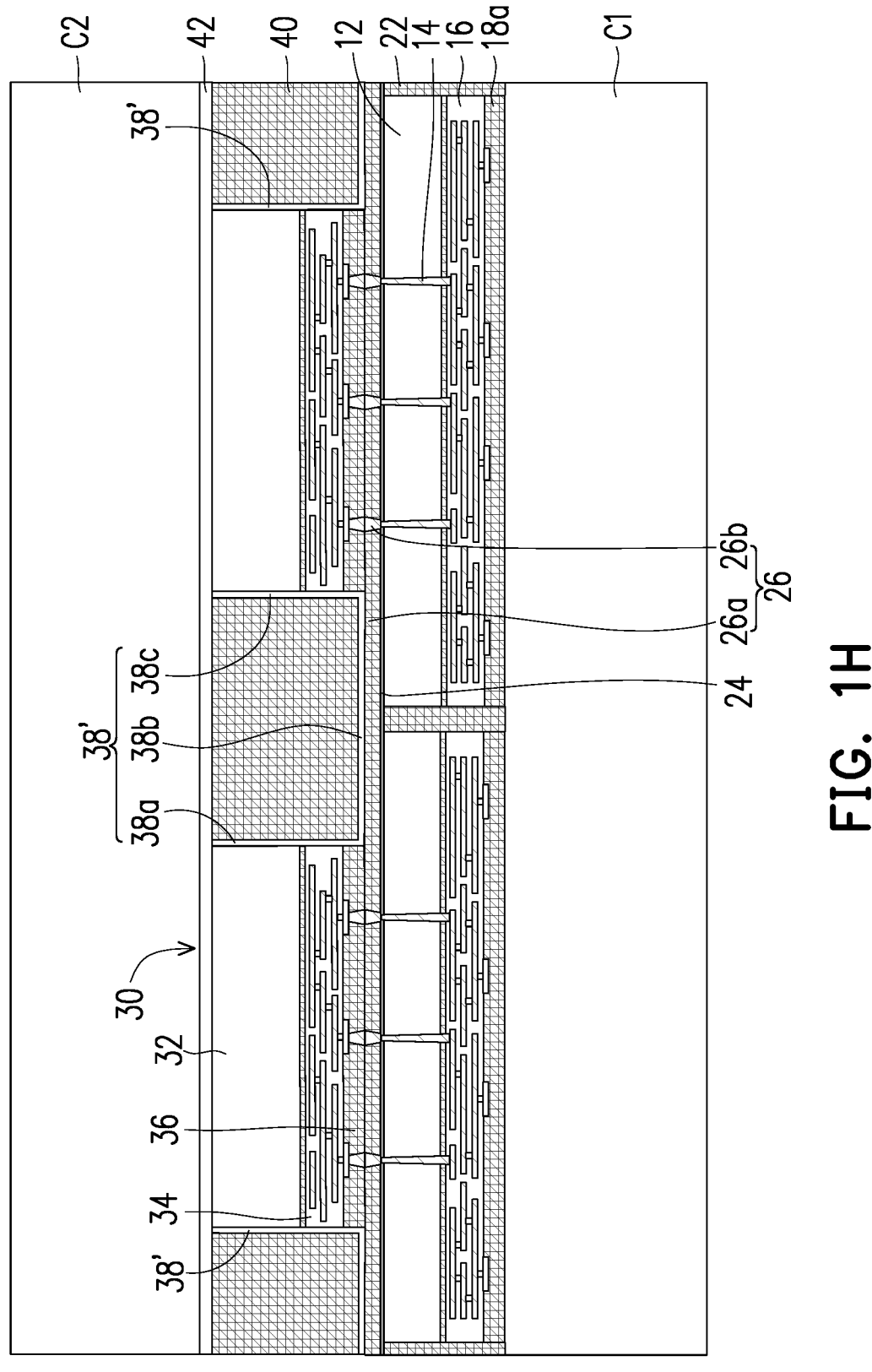

Referring to FIG. 1H, a carrier C2 including a de-bonding layer 42 formed thereon is provided. In some embodiments, the carrier C2 is a glass substrate, a ceramic carrier, or the like. The carrier C2 may have a round top-view shape and a size of a glass substrate. For example, carrier C2 may have an 8-inch diameter, a 12-inch diameter, or the like. The de-bonding layer 42 may be formed of a polymer-based material (e.g., a Light To Heat Conversion (LTHC) material), which may be subsequently removed along with the carrier C2. In some embodiments, the de-bonding layer 42 is formed of an epoxy-based thermal-release material. In other embodiments, the de-bonding layer 42 is formed of an ultra-violet (UV) glue. The de-bonding layer 42 may be dispensed as a liquid and cured. In alternative embodiments, the de-bonding layer 42 is a laminate film and is laminated onto the carrier C2. The top surface of the de-bonding layer 42 is substantially planar.

A bonding process (e.g., a wafer-to-wafer bonding process) is performed to bond the resulted structure formed on the carrier C1 with the de-bonding layer 42 carried by the carrier C2. After the resulted structure formed on the carrier C1 is bonded with the de-bonding layer 42 carried by the carrier C2, the top ends of the first portions 38a of the anti-arcing layers 38', the top surface of the insulating encapsulant 40 and the back surfaces of the semiconductor dies 30 are in contact with the de-bonding layer 42.

Referring to FIG. 1H and FIG. 1I, after the resulted structure formed on the carrier C1 is bonded with the de-bonding layer 42 carried by the carrier C2, the carrier C1 is de-bonded from the bonding dielectric layers 18a and the insulating encapsulant 22 such that the bonding dielectric layers 18a and the insulating encapsulant 22 are revealed.

Figure 1J:
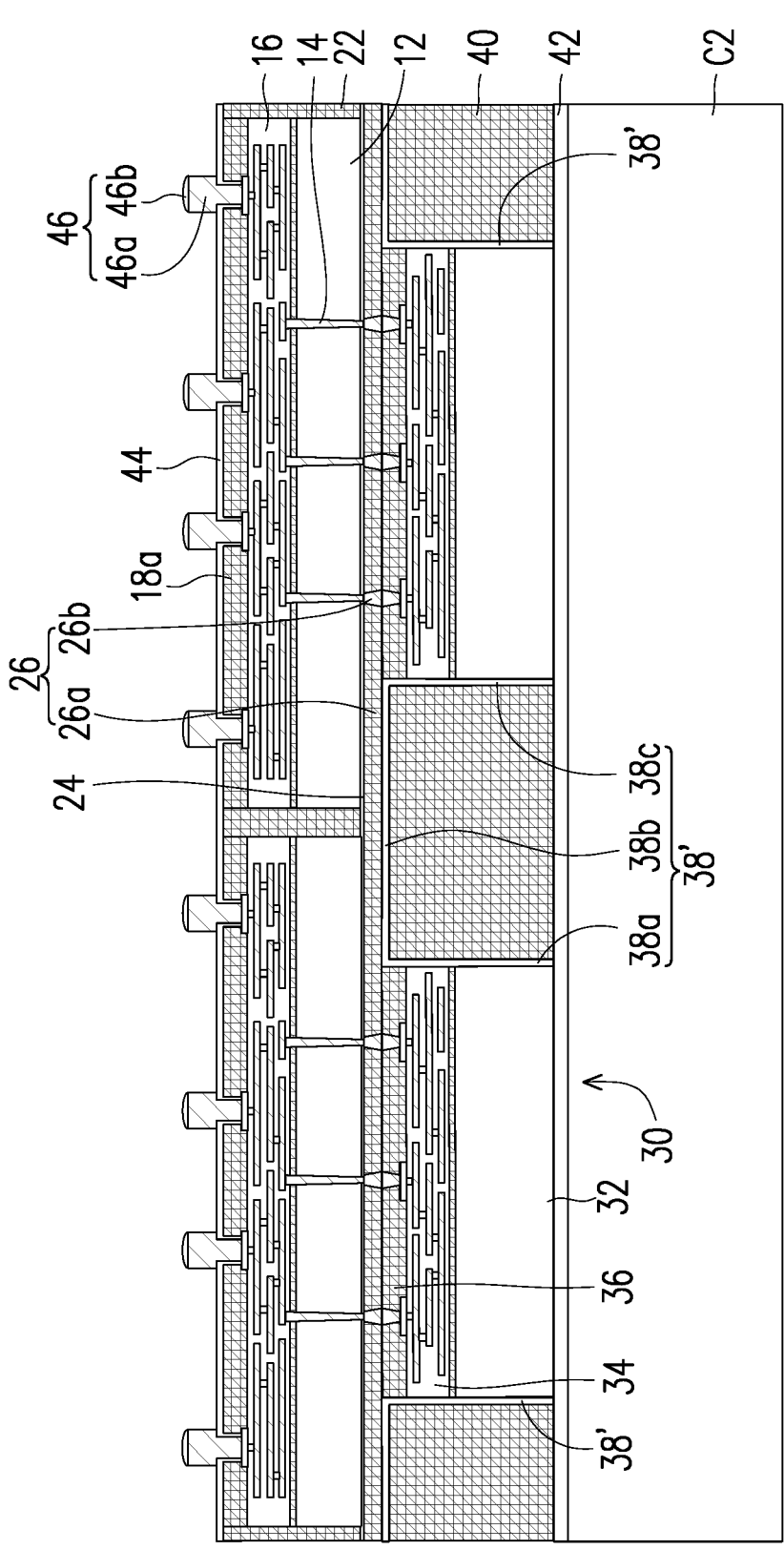

Referring to FIG. 1I and FIG. 1J, the bonding dielectric layers 18a is patterned to form openings such that the topmost interconnect wirings of the interconnect structures 16 are revealed by the openings formed in the bonding dielectric layers 18a. The formation of the openings in the bonding dielectric layers 18a may be performed through a photolithography process. A passivation layer 44 including openings formed therein may be formed to cover the bonding dielectric layers 18a such that the topmost interconnect wirings of the interconnect structures 16 revealed by the openings of the passivation layer 44. The formation of the openings in the passivation layer 44 may be performed through a photolithography process. The width of the openings defined in the passivation layer 44 may be smaller than the width of the openings defined in the bonding dielectric layers 18a. The passivation layer 44 may cover the top surfaces of the bonding dielectric layers 18a and the insulating encapsulant 22. The passivation layer 44 may further extend into the openings defined in the bonding dielectric layers 18a such that the passivation layer 44 is in contact with the topmost interconnect wirings of the interconnect structures 16.

After forming the passivation layer 44, conductive terminals 46 are formed over the passivation layer 44. The conductive terminals 46 are electrically connected to the interconnect wirings of the interconnect structures 16 and protrude from the passivation layer 44. Each of the conductive terminals 46 may respectively include a conductive pillar 46a and a solder cap 46b disposed on the conductive pillar 46a. The conductive pillars 46a fill the openings defined in the passivation layer 44 and protrude from the passivation layer 44. The solder caps 46b covers the top surfaces of the conductive pillars 46a. After forming the conductive terminals 46, a chip probing process may be performed to increase yields. The formation of the conductive terminals 46 may include forming a seed layer (not shown) over the passivation layer 44, forming a patterned mask (not shown) such as a photoresist layer over the seed layer, and then performing a plating process on the exposed seed layer. The patterned mask and the portions of the seed layer covered by the patterned mask are then removed, leaving the conductive terminals 46. A reflow process may be further performed to re-shape the profile of the solder caps 46a. In accordance with some embodiments, the seed layer includes a titanium layer and a copper layer over the titanium layer. The seed layer may be formed using, for example, Physical Vapor Deposition (PVD). The plating may be performed using, for example, electroless plating.

Figure 1K:
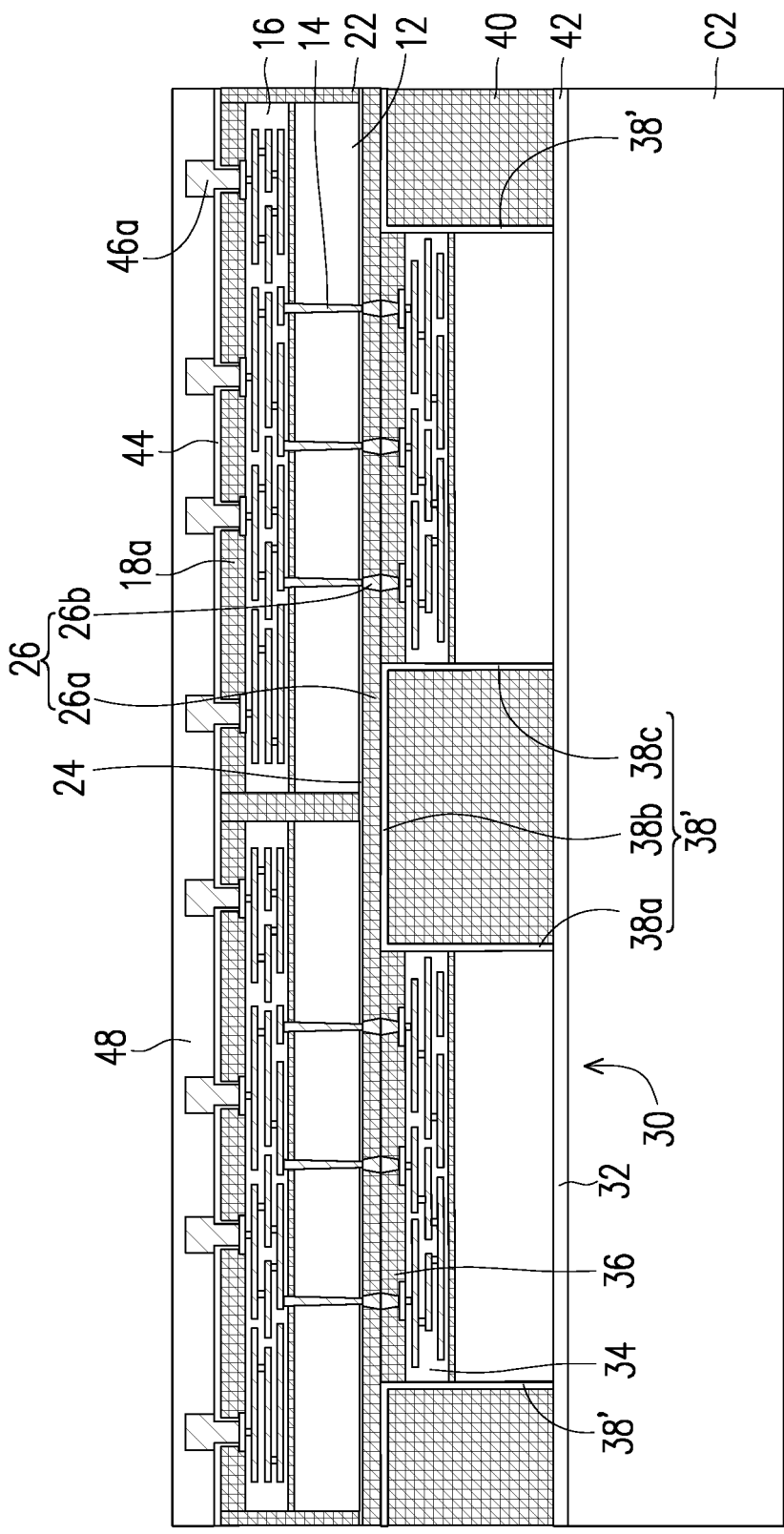

Referring to FIG. 1J and FIG. 1K, after performing the chip probing process, the solder caps 46b are removed and a dielectric layer 48 is formed over the passivation layer 44 to cover the conductive pillars 46a. In some embodiments, the dielectric layer 48 is formed of a polymer, which may be a photo-sensitive material such as polybenzoxazole (PBO), polyimide, benzocyclobutene (BCB), or the like. In some other embodiments, the dielectric layer 48 is formed of a nitride such as silicon nitride, an oxide such as silicon oxide, PhosphoSilicate Glass (PSG), BoroSilicate Glass (BSG), Boron-doped PhosphoSilicate Glass (BPSG), or the like.

Figure 1L:
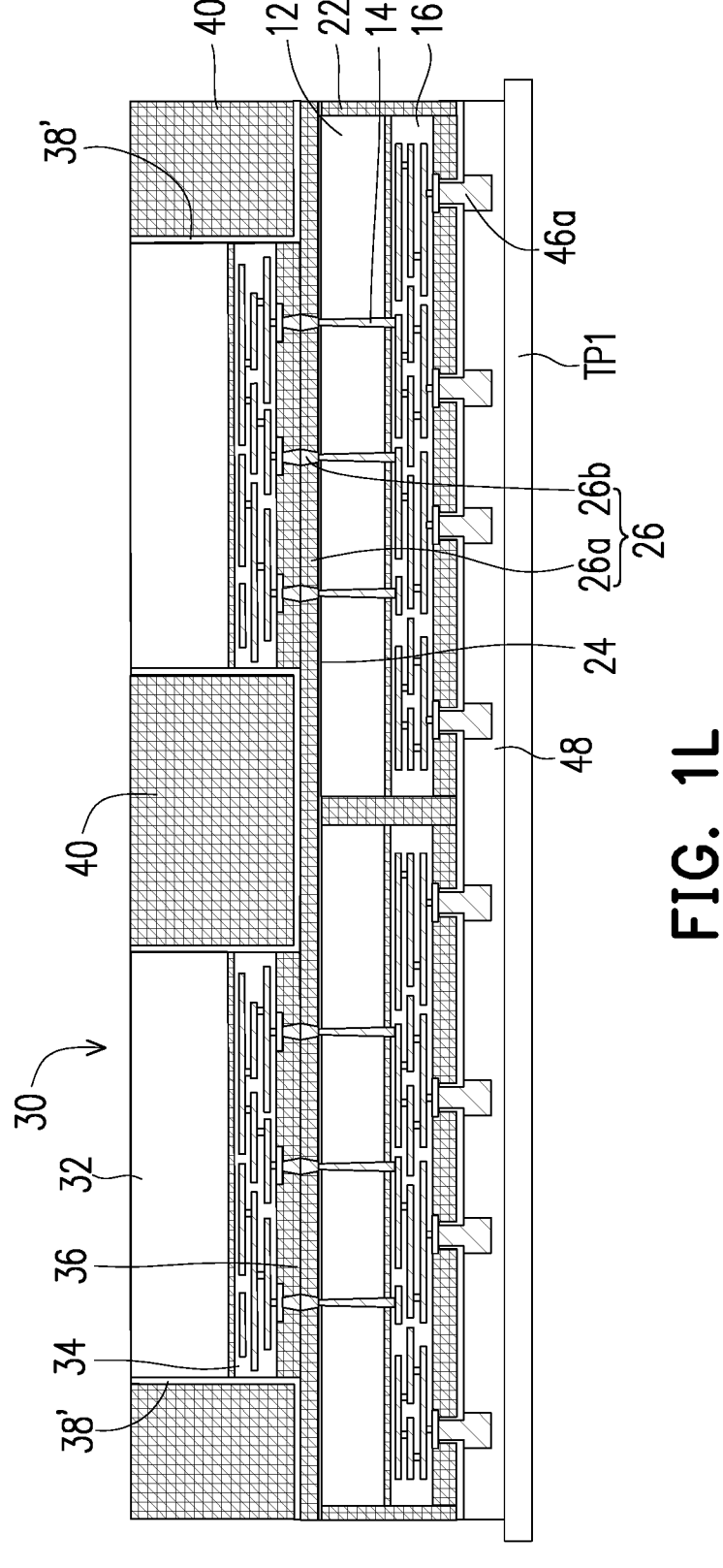

Referring to FIG. 1K and FIG. 1L, a frame mount process is performed such that the resulted structure carried by the carrier C2 is mounted on a tape TP1 carried by a frame. After performing the frame mount process, the dielectric layer 48 is attached on the tape TP1, and a de-bonding process is then performed such that the carrier C2 is de-bonded from the semiconductor dies 30 and the insulating encapsulant 40. After performing the de-bonding process, the back surfaces of the semiconductor dies 30 and the insulating encapsulant 40 are revealed. During the de-bonding process, the de-bonding layer 42 is also cleaned from the semiconductor dies 30 and the insulating encapsulant 40. The de-bonding may be performed by irradiating a light such as UV light or laser on the de-bonding layer 42 to decompose the de-bonding layer 42.

Figure 1M:
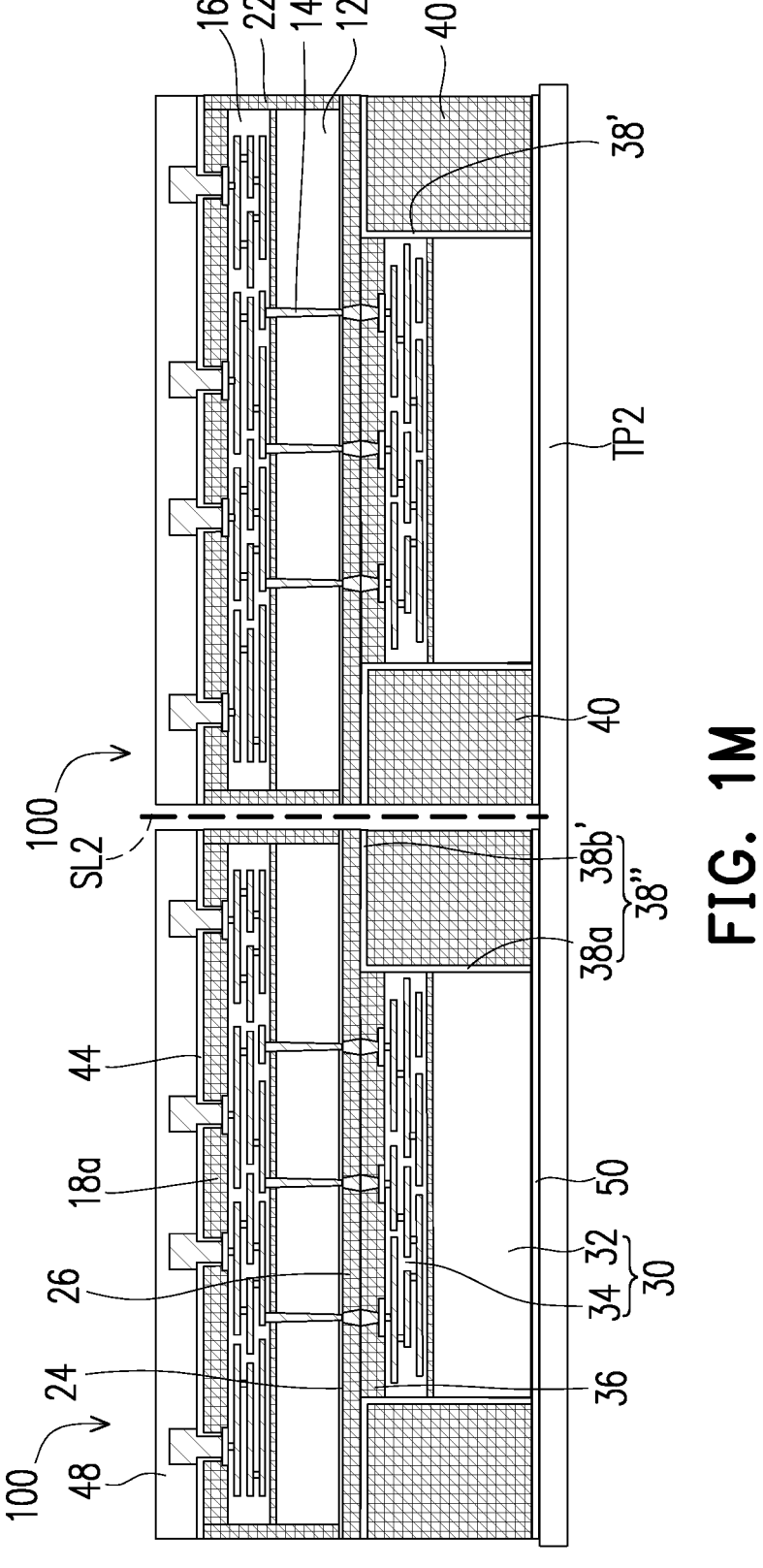

Referring to FIG. 1L and FIG. 1M, a tape TP2 carried by another frame is provided, wherein an attachment film 50 is formed on the tape TP. The resulted structure carried by the tape TP1 is transfer bonded onto the attachment film 50. Then, a singulation process is performed along scribe lines SL2 such that singulated SoIC structures 100 (i.e., device dies) are obtained. During the singulation process, the dielectric layer 48, the passivation layer 44, the insulating encapsulant 22, the planarization layer 24, the bonding structure 26, the anti-arcing layer 38', the insulating encapsulant 40 and the attachment film 50 are cut along scribe lines SL2. In some embodiments, the insulating encapsulant 22 laterally encapsulating the semiconductor die 20, wherein sidewalls of the 40 insulating encapsulant are substantially aligned with sidewalls of the insulating encapsulant 22. After performing the singulation process, each of the singulated SoIC structures 100 includes anti-arcing layers 38'' in contact with the semiconductor die 30, and the anti-arcing material layer 38'' may be or include titanium layer or other suitable metallic layer. Each of the anti-arcing layer 38'' respectively includes a first portion 38a and a second portion 38b' connected to the first portion 38a. The first portions 38a extend vertically to cover sidewalls of the semiconductor dies 30, and the second portions 38b' extend horizontally to cover the bonding structure 26. Each second portion 38b' may include an inner end and an outer end opposite to the inner end, the inner end of the second portion 38b' are connected to bottom ends of the first portion 38a, and the outer end of the second portion 38b' is substantially aligned with sidewalls of the insulating encapsulant 40.

As illustrated in FIG. 1M, in the singulated SoIC structure 100, the first portions 38a cover sidewalls of the semiconductor substrates 32, sidewalls of the interconnect structures 34 and sidewalls of the bonding structures 36. In the singulated SoIC structure 100, the semiconductor die 30 is spaced apart from the insulating encapsulant 40 by the first portions 38a. In the singulated SoIC structure 100, the semiconductor die 20 and the bonding structure 26 are spaced apart from the insulating encapsulant 40 by the second portions 38b'. In some embodiments, in the singulated SoIC structure 100, top ends of the first portions 38a of the anti-arcing layers 38'' are substantially level with a surface of the insulating encapsulant 40 and the back surfaces of the semiconductor dies 30. Furthermore, in the singulated SoIC structure 100, the attachment film 50 is in contact with a surface of the insulating encapsulant 40, the back surface of the semiconductor die 30 and ends of the first portions 38a.

FIGS. 2A through 2I are cross-sectional views schematically illustrating a process flow for fabricating a PoP structure in accordance with some embodiments of the present disclosure.

Figure 2A:
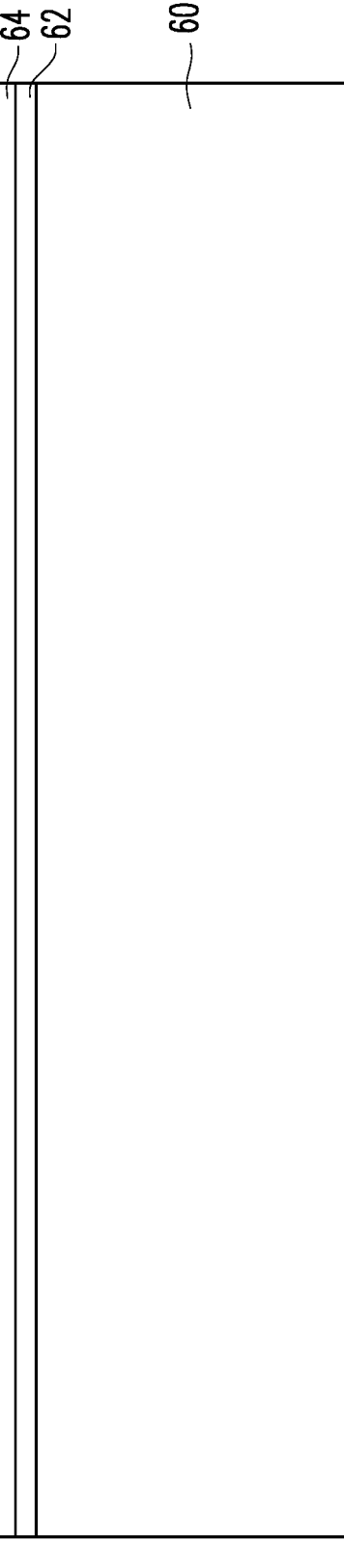

Referring to FIG. 2A, a carrier 60 including a de-bonding layer 62 formed thereon is provided. In some embodiments, the carrier 60 is a glass substrate, a ceramic carrier, or the like. The carrier 60 may have a round top-view shape and a size of a silicon wafer. For example, carrier 60 may have an 8-inch diameter, a 12-inch diameter, or the like. The de-bonding layer 62 may be formed of a polymer-based material (e.g., a Light To Heat Conversion (LTHC) material), which may be subsequently removed along with the carrier 60 from the overlying structures that will be formed in subsequent steps. In some embodiments, the de-bonding layer 62 is formed of an epoxy-based thermal-release material. In other embodiments, the de-bonding layer 62 is formed of an ultra-violet (UV) glue. The de-bonding layer 62 may be dispensed as a liquid and cured. In alternative embodiments, the de-bonding layer 62 is a laminate film and is laminated onto the carrier 60. The top surface of the de-bonding layer 62 is substantially planar.

Figure 2B:
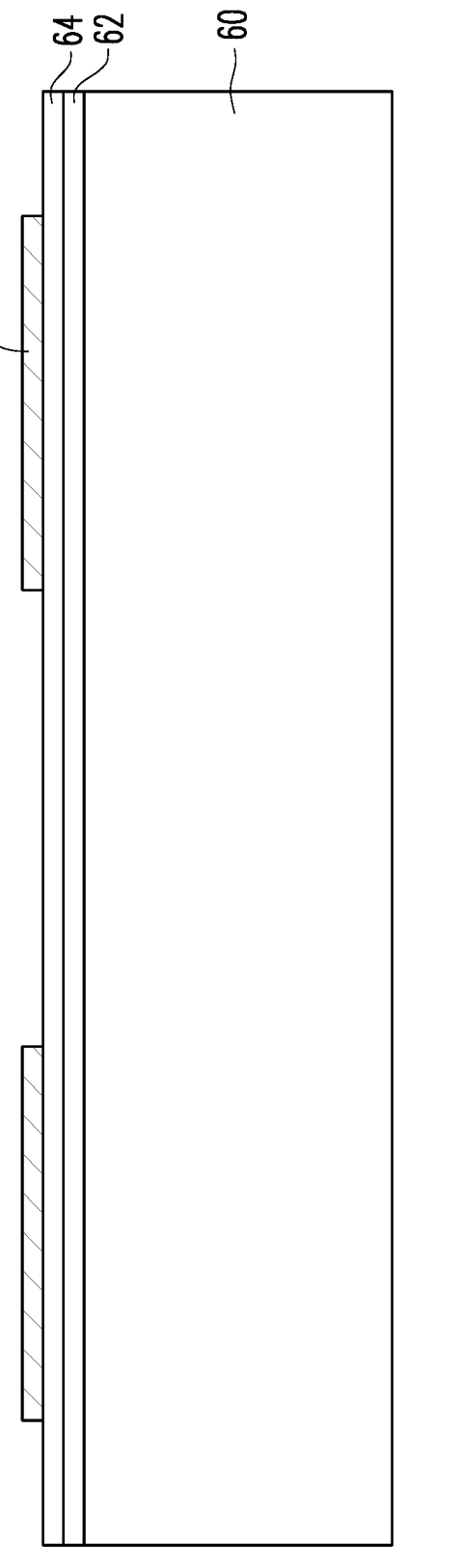
Figure 2C:
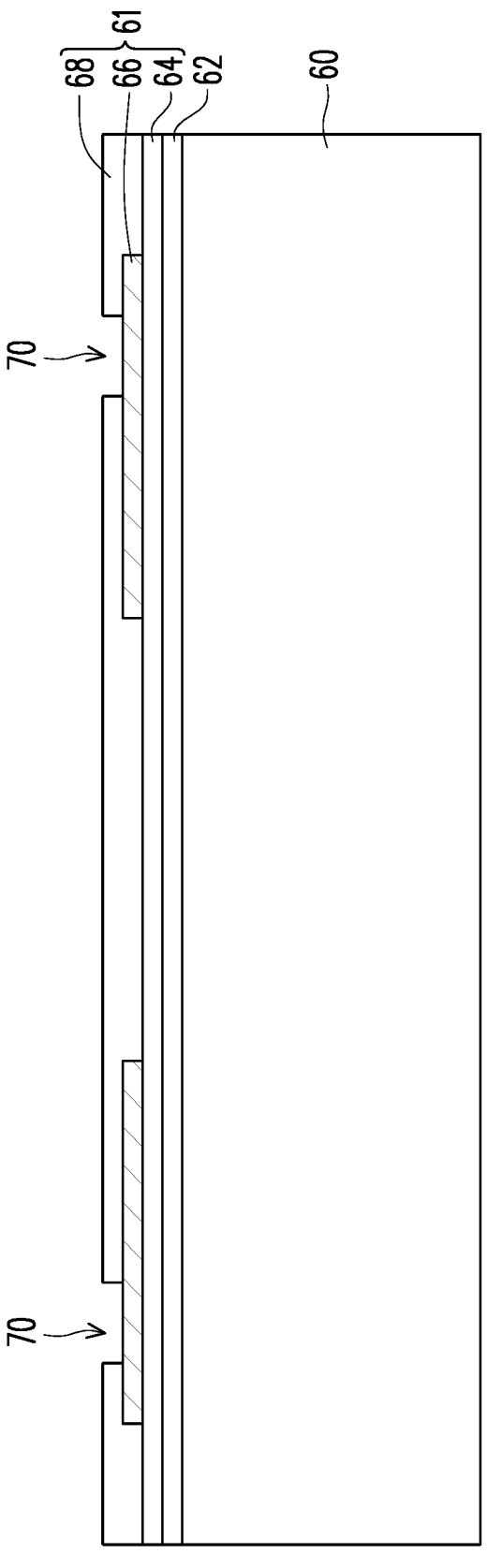

Referring to FIGS. 2A through 2C, a redistribution circuit structure 61 including a dielectric layer 64, redistribution wirings 66 and a dielectric layer 68 is formed on the de-bonding layer 62 such that the de-bonding layer 62 is between the carrier 60 and the dielectric layer 64 of the redistribution circuit structure 61. As shown in FIG. 2A, the dielectric layer 64 is formed on the de-bonding layer 62. In some embodiments, the dielectric layer 64 is formed of a polymer, which may also be a photo-sensitive material such as polybenzoxazole (PBO), polyimide, benzocyclobutene (BCB), or the like, which may be easily patterned using a photolithography process. In some embodiments, the dielectric layer 64 is formed of a nitride such as silicon nitride, an oxide such as silicon oxide, PhosphoSilicate Glass (PSG), BoroSilicate Glass (BSG), Boron-doped PhosphoSilicate Glass (BPSG), or the like. As shown in FIG. 2B, the redistribution wirings 66 are formed over the dielectric layer 64. The formation of the redistribution wirings 66 may include forming a seed layer (not shown) over the dielectric layer 64, forming a patterned mask (not shown) such as a photoresist layer over the seed layer, and then performing a plating process on the exposed seed layer. The patterned mask and the portions of the seed layer covered by the patterned mask are then removed, leaving the redistribution wirings 66 as shown in FIG. 2B. In accordance with some embodiments, the seed layer includes a titanium layer and a copper layer over the titanium layer. The seed layer may be formed using, for example, Physical Vapor Deposition (PVD). The plating may be performed using, for example, electroless plating. As shown in FIG. 2C, the dielectric layer 68 is formed over the dielectric layer 64 to cover the redistribution wirings 66. The bottom surface of the dielectric layer 68 is in contact with the top surfaces of the redistribution wirings 66 and the dielectric layer 64. In accordance with some embodiments of the present disclosure, the dielectric layer 68 is formed of a polymer, which may be a photo-sensitive material such as PBO, polyimide, BCB, or the like. In some embodiments, the dielectric layer 68 is formed of a nitride such as silicon nitride, an oxide such as silicon oxide, PSG, BSG, BPSG, or the like. The dielectric layer 68 is then patterned to form openings 70 therein. Hence, portions of the redistribution wirings 66 are exposed through the openings 70 in the dielectric layer 68. FIG. 2C and the subsequent figures illustrate a single redistribution circuit structure 61 having a single layer redistribution wirings 66 for illustrative purposes and some embodiments may have a plurality of layers of redistribution wirings 66 by repeating the process discussed above.

Figure 2D:
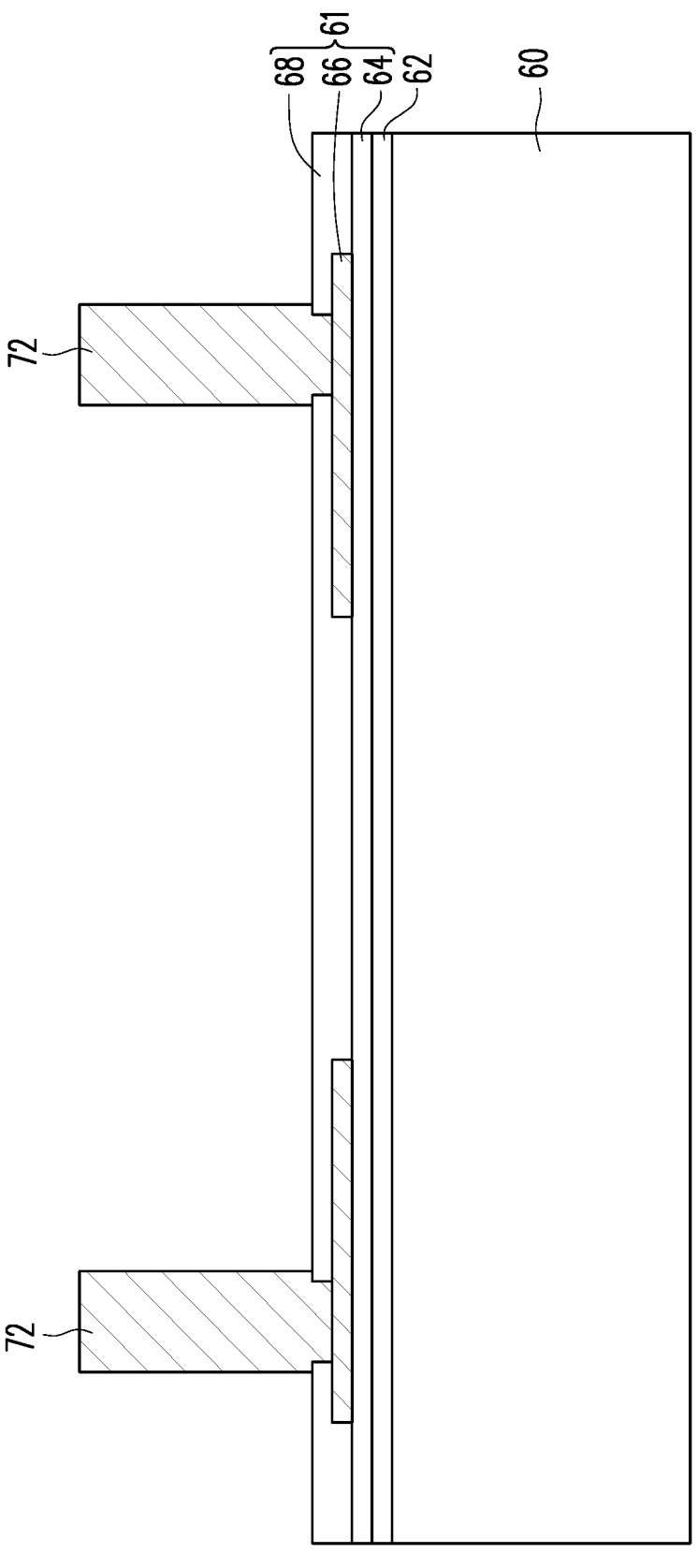

Referring to FIG. 2D, after forming the redistribution circuit structure 61 over the de-bonding layer 62 carried by the carrier 60, metal posts 72 are formed on the redistribution circuit structure 61 and electrically connected to the redistribution wirings 66 of the redistribution circuit structure 61. Throughout the description, the metal posts 72 are alternatively referred to as conductive through vias 72 since the metal posts 72 penetrate through the subsequently formed molding material (shown in FIG. 2G). In some embodiments, the conductive through vias 72 are formed by plating. The plating of the conductive through vias 72 may include forming a blanket seed layer (not shown) over the dielectric layer 68 and extending into the openings 70 shown in FIG. 2C, forming and patterning a photoresist (not shown), and plating the conductive through vias 72 on the portions of the seed layer that are exposed through the openings in the photoresist. The photoresist and the portions of the seed layer that were covered by the photoresist are then removed. The material of the conductive through vias 72 may include copper, aluminum, or the like. The conductive through vias 72 may have the shape of rods. The top-view shapes of the conductive through vias 72 may be circles, rectangles, squares, hexagons, or the like.

Figure 2E:
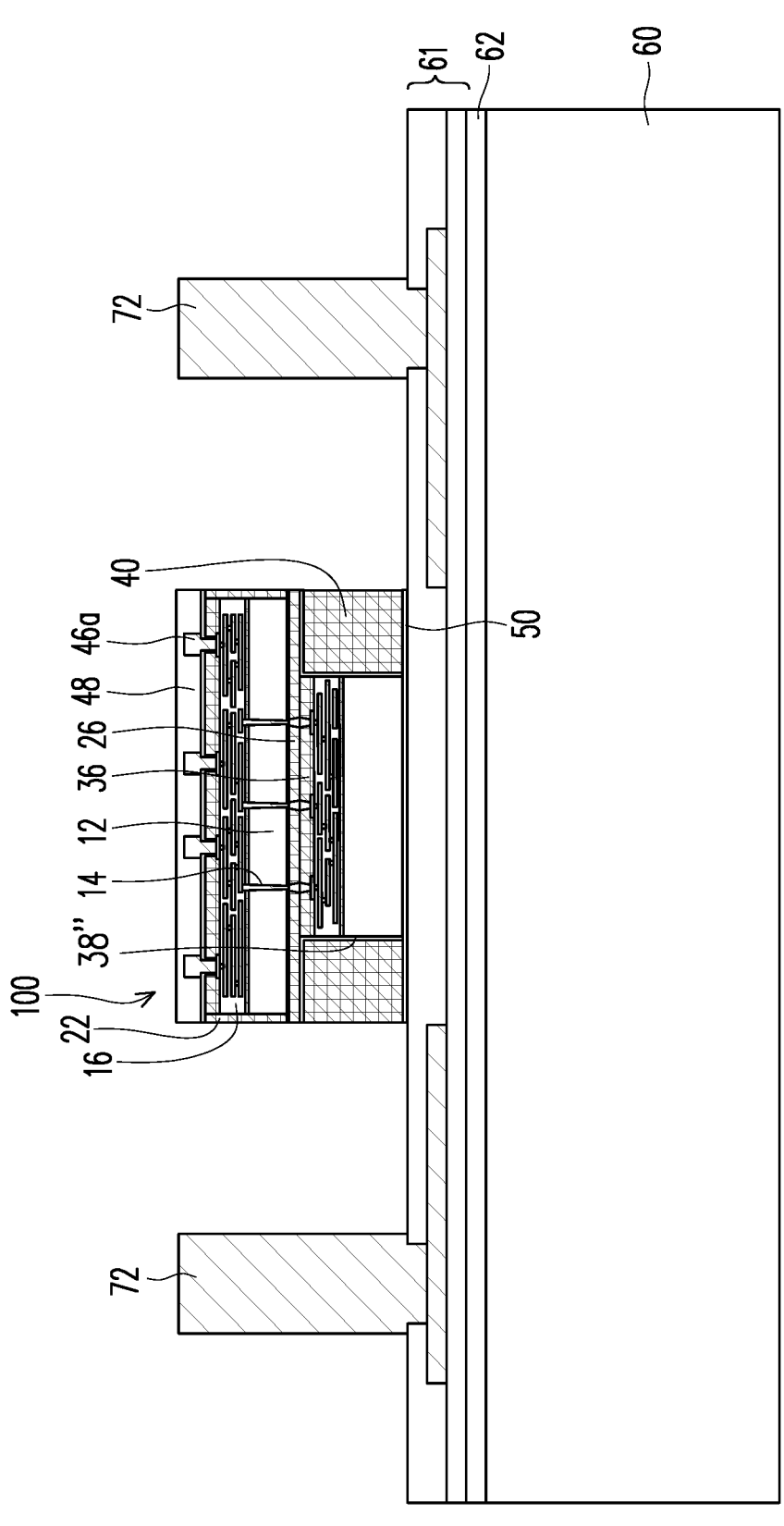

Referring FIG. 2E, after forming the conductive through vias 72, at least one singulated SoIC structure 100 is picked-up and placed over the dielectric layer 68 of the redistribution circuit structure 61. Only a single SoIC structure 100 and its surrounding conductive through vias 72 are illustrated in FIG. 2E for illustrative purposes. It is noted, however, that the process steps shown in FIGS. 2A through 2I may be performed at wafer level, and are performed on multiple SoIC structure 100 and the conductive through vias 72 disposed over the carrier 60. As illustrated in FIG. 2E, the attachment film 50 in the SoIC structure 100 is adhered to the dielectric layer 68.

Figure 2F:
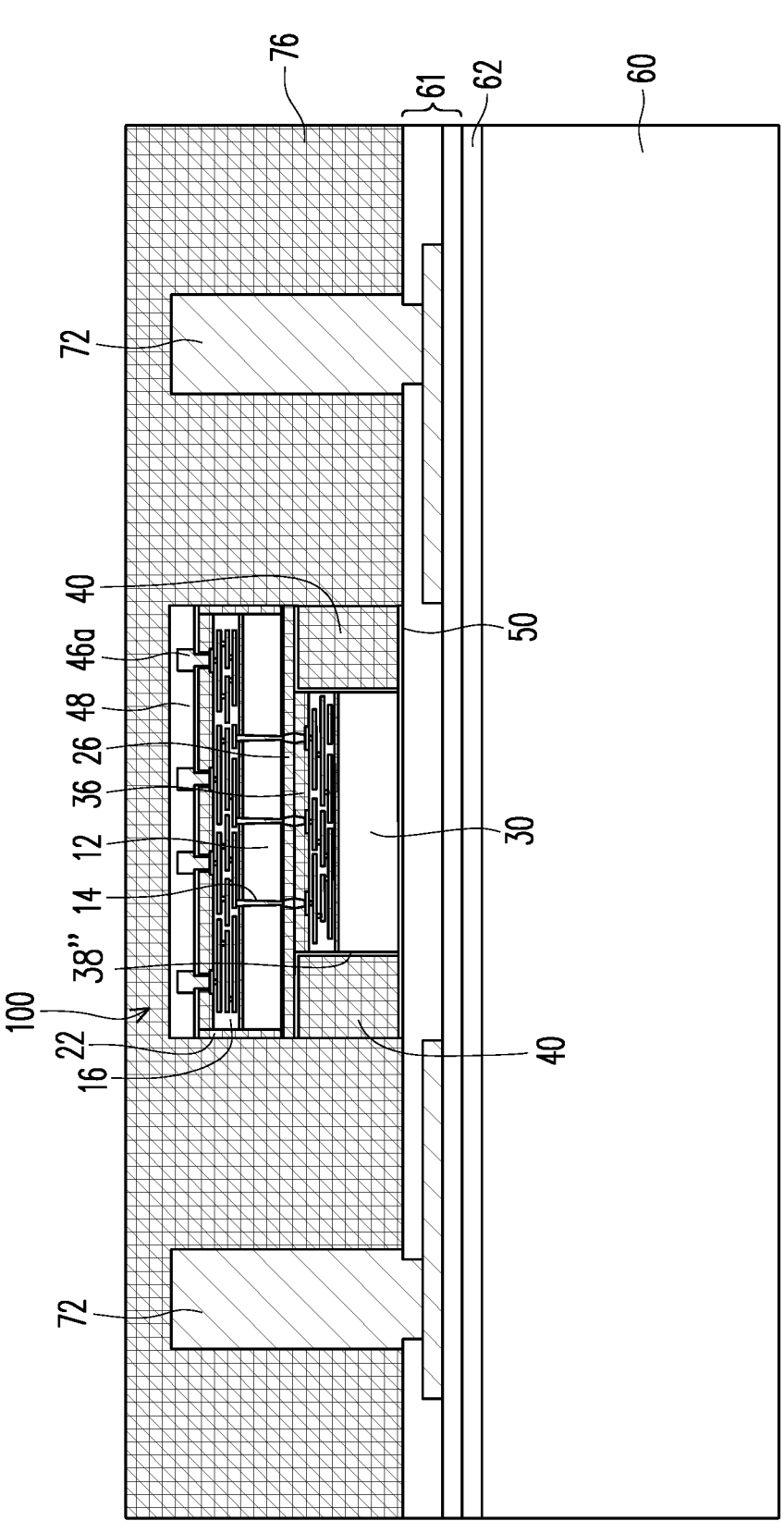

Referring to FIG. 2F, an insulating encapsulation material 76 is formed over the redistribution circuit structure 61 to cover the SoIC structure 100 and the conductive through vias 72. The insulating encapsulation material 76 may be a molding compound (e.g., epoxy or other suitable resin) formed through an over-molding process. The insulating encapsulation material 76 fills the gaps between neighboring conductive through vias 72 as well as the gaps between the conductive through vias 72 and the SoIC structure 100. The insulating encapsulation material 76 covers the top surface of the dielectric layer 48 of the SoIC structure 100.

Figure 2G:
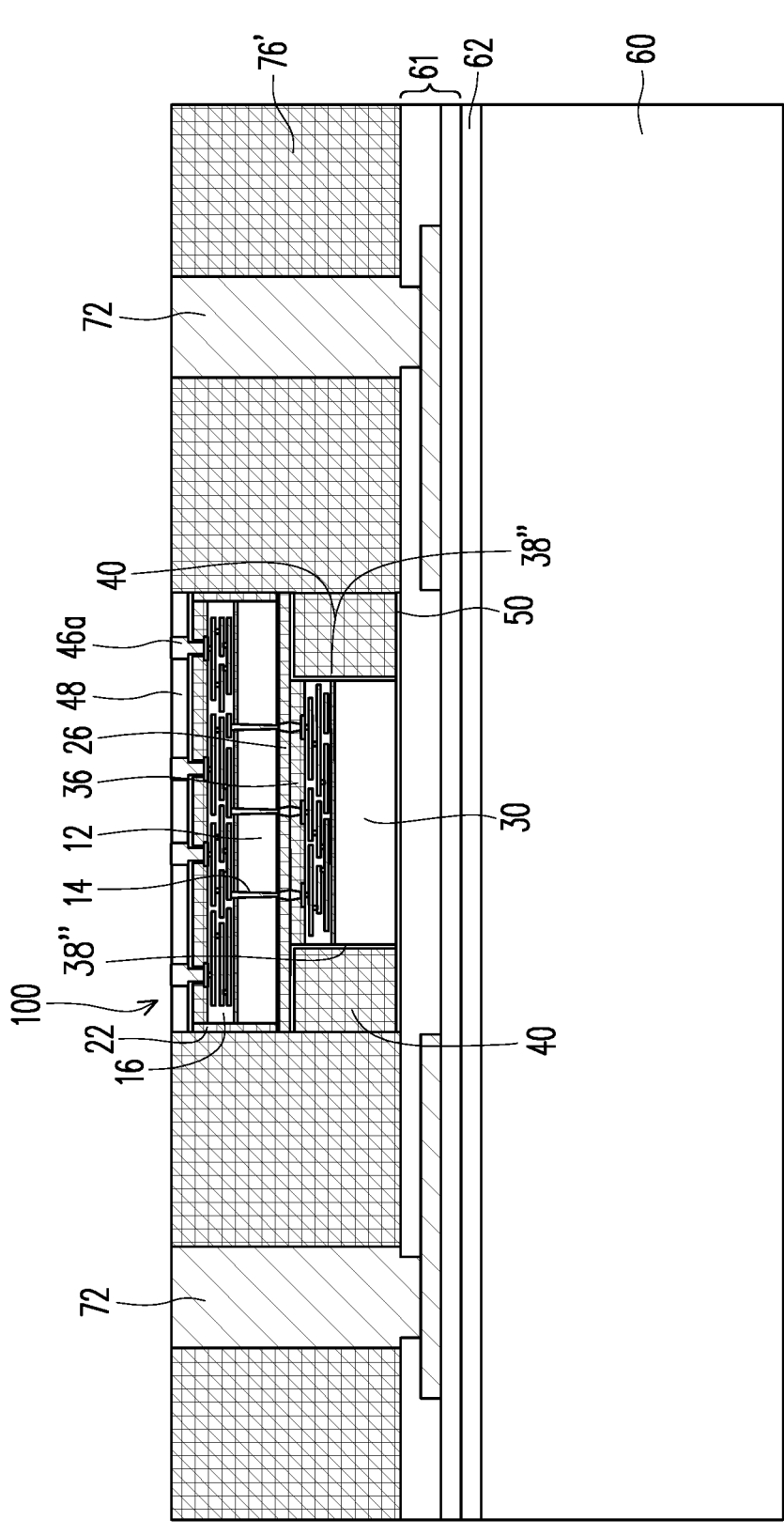

Next, as shown in FIG. 2G, a planarization such as a Chemical Mechanical Polish (CMP) process and/or a mechanical grinding process is performed to partially remove the insulating encapsulation material 76 and the dielectric layer 48 of the SoIC structure 100 until the conductive through vias 72 and the conductive pillars 46a of the SoIC structure 100 are revealed. After the insulating encapsulation material 76 is thinned, an insulating encapsulant 76' is formed to laterally encapsulate the SoIC structure 100 and the conductive through vias 72. Due to the planarization, the top ends of conductive through vias 72 are substantially level or coplanar with the top surface of the dielectric layer 48, and are substantially level or coplanar with the top surface of the insulating encapsulant 76', within process variations. In the illustrated exemplary embodiments, the planarization is performed until the conductive through vias 72 and the conductive pillars 46a of the SoIC structure 100 are revealed.

Figure 2H:
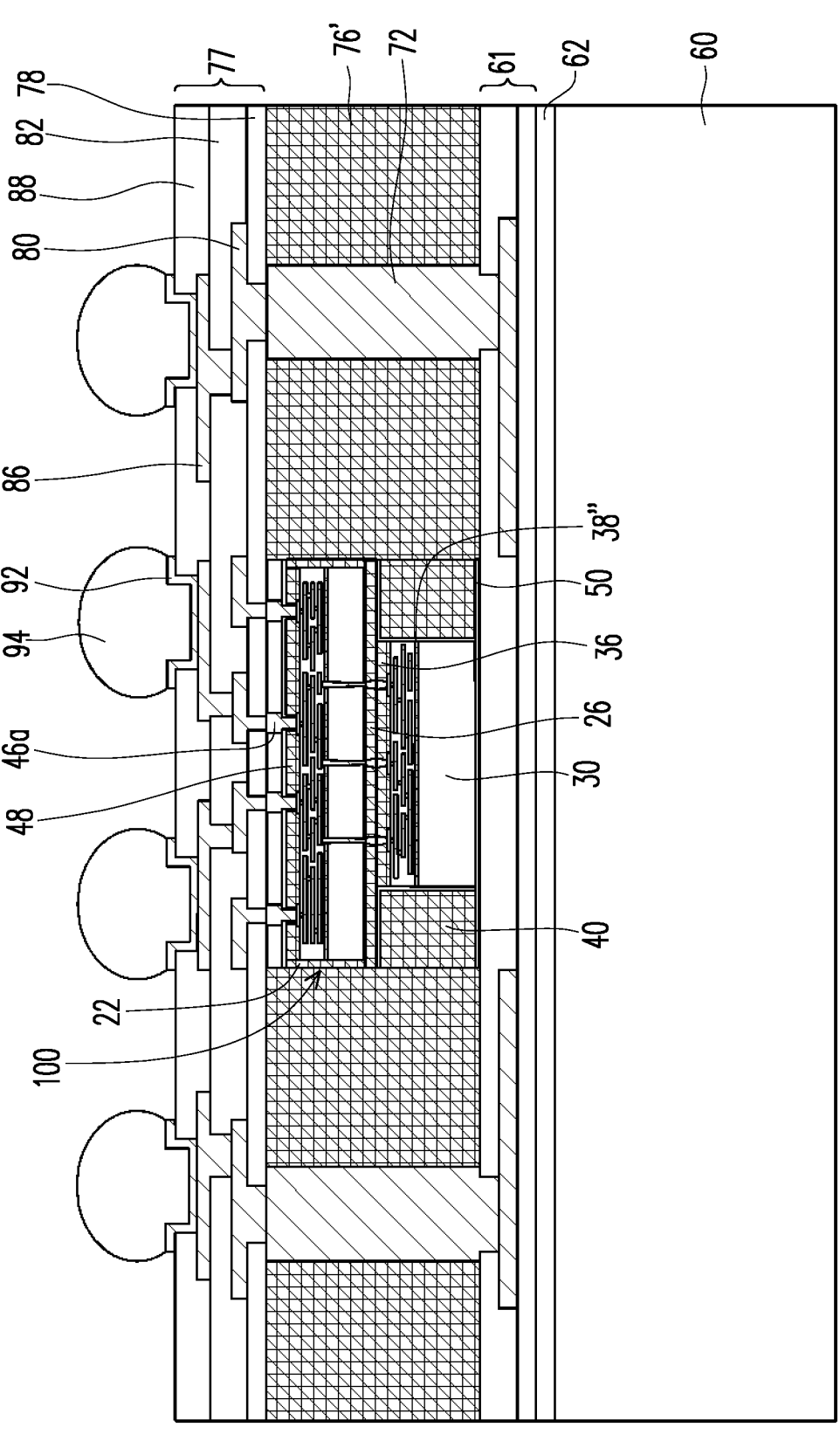
Figure 21:
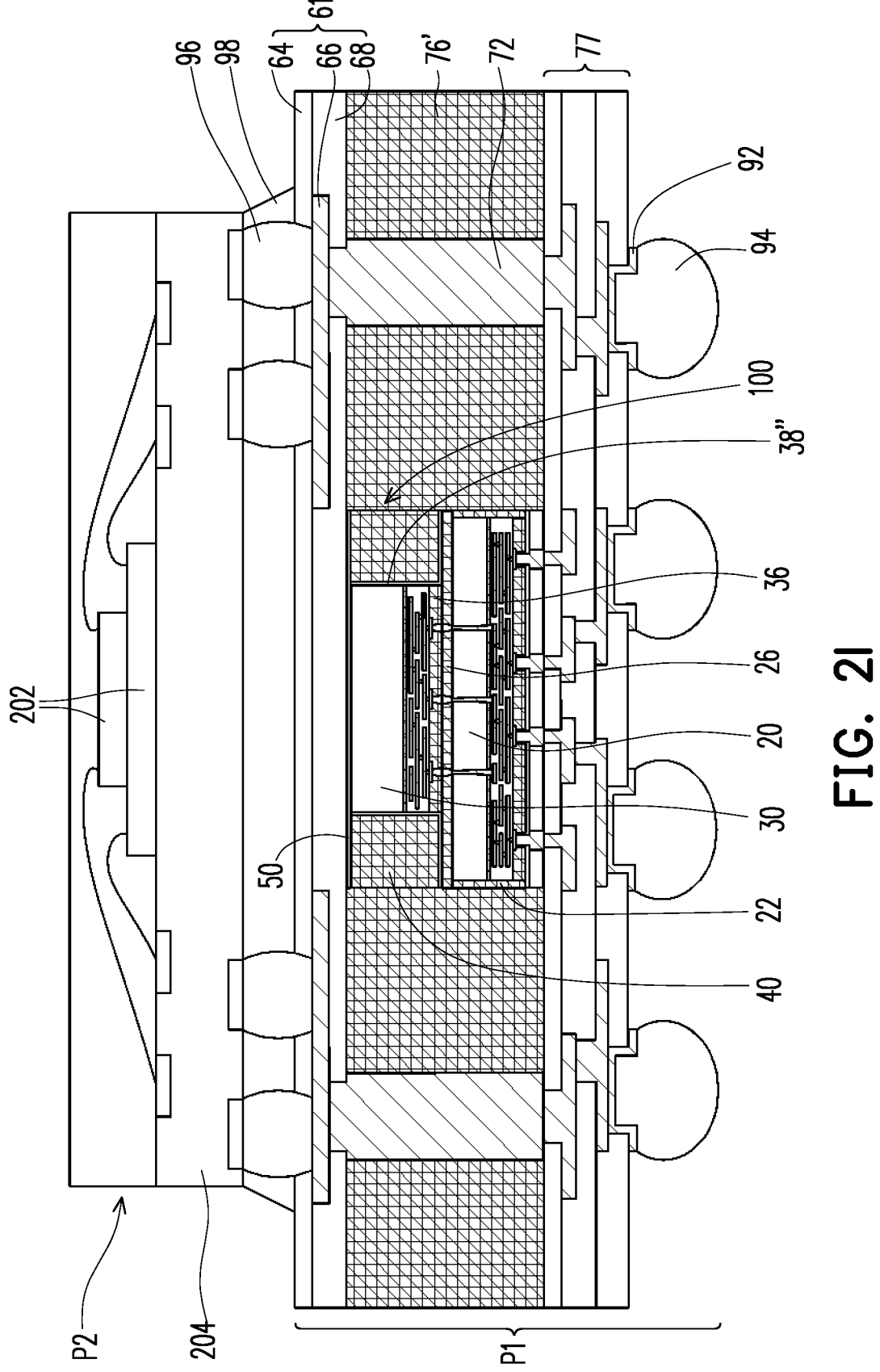

Referring to FIGS. 2H, a redistribution circuit structure 77 including a dielectric layer 78, redistribution wirings 80, a dielectric layer 82, redistribution wirings 86, and a dielectric layer 88 is formed on the SoIC structure 100 and the insulating encapsulant 76'. After forming the redistribution circuit structure 77, solder regions including Under-Bump Metallurgies (UBMs) 92 and electrical connectors 94 disposed on the UBMs 92 are formed on the redistribution circuit structure 77.

The dielectric layer 78 is formed to cover the dielectric 48, the conductive pillars 46a and the insulating encapsulant 76'. In some embodiments, the dielectric layer 78 is formed of a polymer such as PBO, polyimide, or the like. In some other embodiments, dielectric layer 78 is formed of silicon nitride, silicon oxide, or the like. Openings may be formed in the dielectric layer 78 to expose conductive through vias 72 and the conductive pillars 46a. The formation of the openings in the dielectric layer 78 may be performed through a photolithography process.

Next, the redistribution wirings 80 are formed to connect to the conductive pillars 46a and the conductive through vias 72. The redistribution wirings 80 may also interconnect the conductive pillars 46a and the conductive through vias 72. The redistribution wirings 80 may include metal traces (metal lines) over the dielectric layer 78 as well as metal vias extending into the openings defined in the dielectric layer 78 so as to electrically connect to the conductive through vias 72 and the conductive pillars 46a. In some embodiments, the redistribution wirings 80 are formed by a plating process, wherein each of the redistribution wirings 80 includes a seed layer (not shown) and a plated metallic material over the seed layer. The seed layer and the plated material may be formed of the same material or different materials. The redistribution wirings 80 may include a metal or a metal alloy including aluminum, copper, tungsten, and alloys thereof. The redistribution wirings 80 may be formed of non-solder materials. The via portions of the redistribution wirings 80 may be in physical contact with the top surfaces of the conductive through vias 72 and the conductive pillars 46a.

The dielectric layer 82 is then formed over the redistribution wirings 80 and the dielectric layer 78. The dielectric layer 82 may be formed using a polymer, which may be selected from the same candidate materials as those of the dielectric layer 78. For example, the dielectric layer 82 may include PBO, polyimide, BCB, or the like. In some embodiments, the dielectric layer 82 may include non-organic dielectric materials such as silicon oxide, silicon nitride, silicon carbide, silicon oxynitride, or the like. Openings may be also formed in the dielectric layer 82 to expose the redistribution wirings 80. The formation of the openings defined in the dielectric layer 82 may be performed through a photolithography process. The formation of the redistribution wirings 86 may adopt similar methods and materials to those for forming the redistribution wirings 80.

The dielectric layer 88, which may be a polymer layer, may be formed to cover the redistribution wirings 86 and the dielectric layer 82. The dielectric layer 88 may be selected from the same candidate polymers used for forming the dielectric layers 78 and 82. Openings may be formed in the dielectric layer 88 to expose the metal pad portions of redistribution wirings 86. The formation of the openings defined in the dielectric layer 88 may be performed through a photolithography process.

The formation of the UBMs 92 may include deposition and patterning. The formation of the electrical connectors 94 may include placing solder on the exposed portions of the UBMs 92 and then reflowing the solder to form solder balls. In some embodiments, the formation of the electrical connectors 94 includes performing a plating step to form solder regions over redistribution wirings 86 and then reflowing the solder regions. In some other embodiments, the electrical connectors 94 include metal pillars or metal pillars and solder caps, which may also be formed through plating. Throughout the description, the combined structure including the SoIC structure 100, the conductive through vias 72, the insulating encapsulant 76', the redistribution circuit structure 61, the redistribution circuit structure 77, the UBMs 92 and the electrical connectors 94 will be referred to as a wafer level package, which may be a composite wafer with a round top-view shape.

Referring to FIG. 2H and FIG. 2I, a de-bonding process is then performed such that the carrier C2 is de-bonded from the wafer level package. After performing the de-bonding process, the dielectric layer 34 of the redistribution circuit structure 61 are revealed. During the de-bonding process, the de-bonding layer 62 is also cleaned from the wafer level package. The de-bonding may be performed by irradiating a light such as UV light or laser on the de-bonding layer 62 to decompose the de-bonding layer 62. In the de-bonding process, a tape (not shown) may be adhered onto the dielectric layer 88 and the electrical connectors 94. In subsequent steps, the carrier 60 and the de-bonding layer 62 are removed from the wafer level package. A singulation process is performed to saw the wafer level package illustrated in FIG. 2H into multiple singulated integrated fanout packages P1 illustrated in FIG. 2I.

A patterning process is performed to form openings in the dielectric layer 64 to expose the redistribution wirings 66. The formation of the openings defined in the dielectric layer 64 may be performed through a photolithography process. A package P2 is provided and bonded with the integrated fanout package P1 such that a PoP structure is formed. In some embodiments of the present disclosure, the bonding between the package P2 and the integrated fanout package P1 is performed through solder regions 96, which joins the metal pad portions of the redistribution wirings 66 to the metal pads in the package P2. An underfill 98 may be formed to fill the gap between the package P2 and the integrated fanout package P1 such that the solder regions 96 are laterally encapsulated by the underfill 98 and reliability of the solder regions 96 can be enhanced. In some embodiments, the package P2 includes semiconductor dies 202, which may be memory dies such as Static Random Access Memory (SRAM) dies, Dynamic Random Access Memory (DRAM) dies, or the like. The memory dies may also be bonded to package substrate 204 in some exemplary embodiments.

As illustrated in FIG. 2I, the integrated fanout package P1 includes an SoIC structure 100 (i.e., a device die), conductive through vias 72, an insulating encapsulant 76', a redistribution circuit structure 61 and a redistribution circuit structure 77. The SoIC structure 100 and the conductive through vias 72 are laterally encapsulated by the insulating encapsulant 76'. The redistribution circuit structure 61 and the redistribution circuit structure 77 are respectively disposed on opposite sides of the insulating encapsulant 76'. The SoIC structure 100 include a semiconductor die 20 (i.e., a bottom tier semiconductor die), an insulating encapsulant 22, a semiconductor die 30 (i.e., a top tier semiconductor die), an anti-arcing layer 38" and an insulating encapsulant 40. The semiconductor die 20 is laterally encapsulated by the insulating encapsulant 22. The insulating encapsulant 22 and the insulating encapsulant 40 are in contact with the insulating encapsulant 76' respectively. The semiconductor die 30 is stacked over and electrically connected to the semiconductor die 20. The anti-arcing layer 38" is in contact with the semiconductor die 30, the bonding structure 26 and the bonding structure 26. The insulating encapsulant 40 is spaced apart from the semiconductor die 30, the bonding structure 26 and the bonding structure 26 by the anti-arcing layer 38". The first insulating encapsulant 40 is disposed over the semiconductor die 20 and laterally encapsulates the semiconductor die 30.

In some embodiments, the integrated fanout package P1 further includes a bonding structure 26 and a bonding structure 36, the bonding structure 26 is disposed on the back surface of the semiconductor die 20, the bonding structure 36 is disposed on the front surface of the semiconductor die 30, wherein the bonding structure 26 and the bonding structure 36 are disposed between the semiconductor die 20 and the semiconductor die 30, and the semiconductor die 30 is electrically connected to the semiconductor die 20 through the bonding structure 26 and the bonding structure 36. Furthermore, the insulating encapsulant 22 and the insulating encapsulant 40 are spaced apart from each other by the bonding structure 26.

Figure 3:
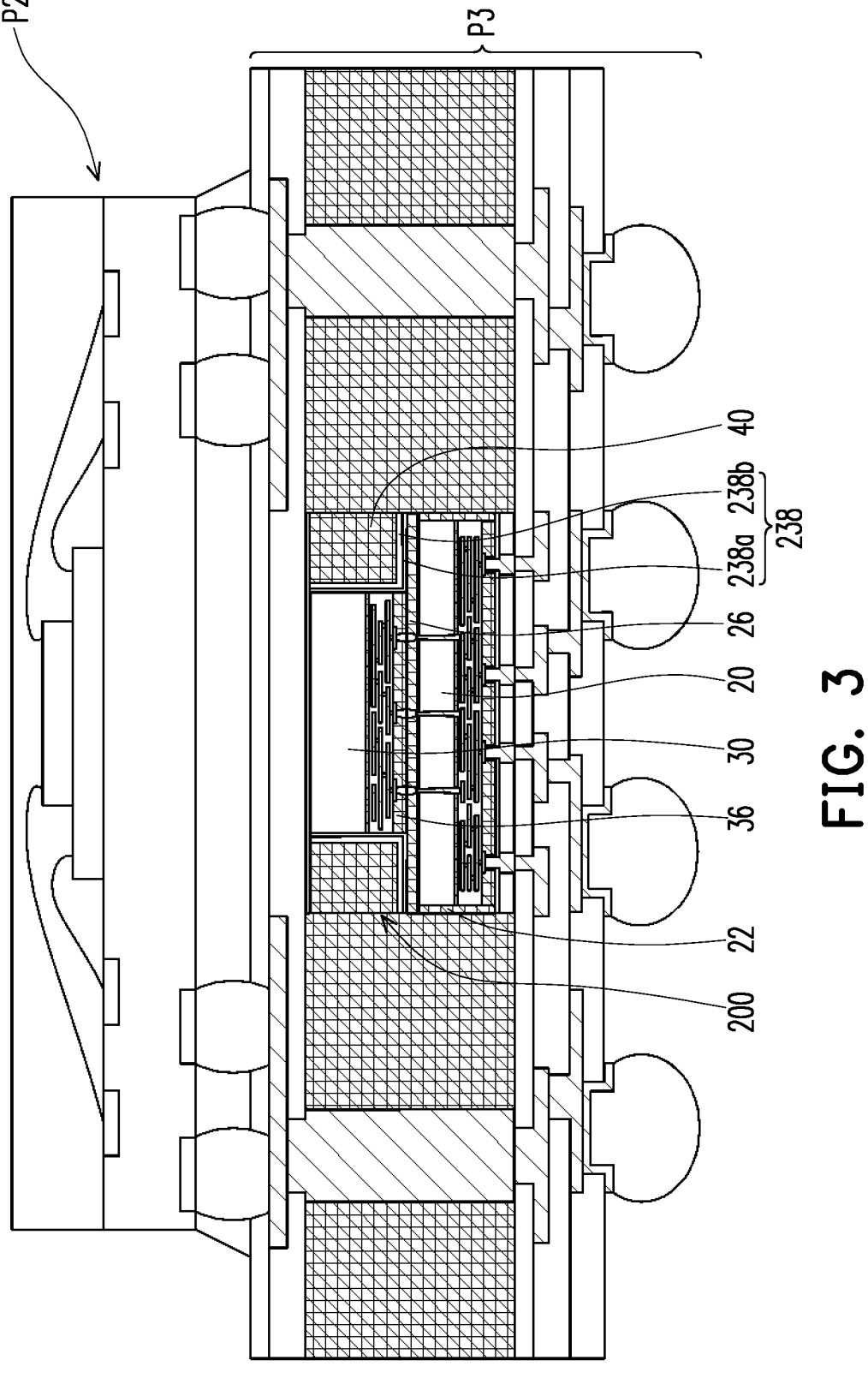
FIG. 3 is a cross-sectional view schematically illustrating an integrated fanout package structure of a SoIC structure in accordance with some other embodiments of the present disclosure.

FIG. 3 is a cross-sectional view schematically illustrating an integrated fanout package structure of a SoIC structure in accordance with some other embodiments of the present disclosure.

Referring to FIG. 2I and FIG. 3, the integrated fanout package structure P3 illustrated in FIG. 3 is similar with the integrated fanout package structure P1 illustrated in FIG. 2I except that the integrated fanout package structure P3 includes an SoIC structure 200 including an multi-layered anti-arcing layer 238, and the multi-layered anti-arcing layer 238 includes a metallic layer 238a in contact with the semiconductor die 30 and a dielectric 238b layer covering the metallic layer 238a. Since the SoIC structure 200 is similar to the SoIC structure 100 except for the multi-layered anti-arcing layer 238, detailed descriptions regarding to other elements (e.g., the insulating encapsulant 22, the semiconductor die 20, bonding structure 26, the semiconductor die 30, the bonding structure 36, and the insulating encapsulant 40) in the SoIC structure 200 are thus omitted.

FIGS. 4A through 4L are cross-sectional views schematically illustrating a process flow for fabricating SoIC structures in accordance with some other embodiments of the present disclosure.

Figure 4A:
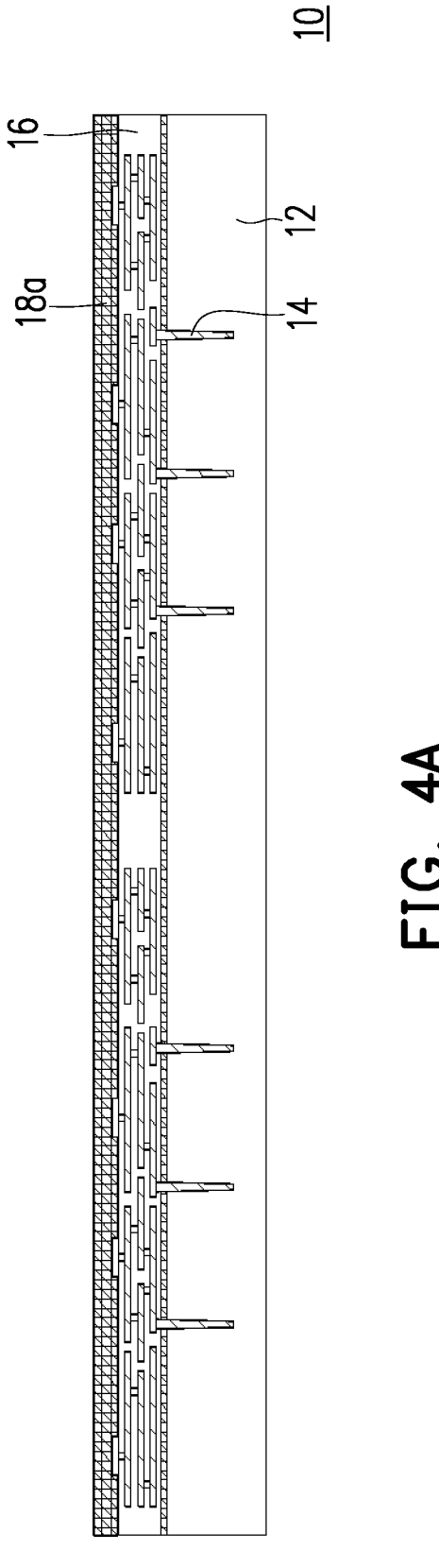
FIGS. 4A through 4L are cross-sectional views schematically illustrating a process flow for fabricating SoIC structures in accordance with some other embodiments of the present disclosure.

Referring to FIG. 4A, a wafer 10 including semiconductor dies is provided. Since the process illustrated in FIG. 4A is the same as that illustrated in FIG. 1A, detailed descriptions regarding to the process illustrated in FIG. 4A are thus omitted.

Figure 4B:
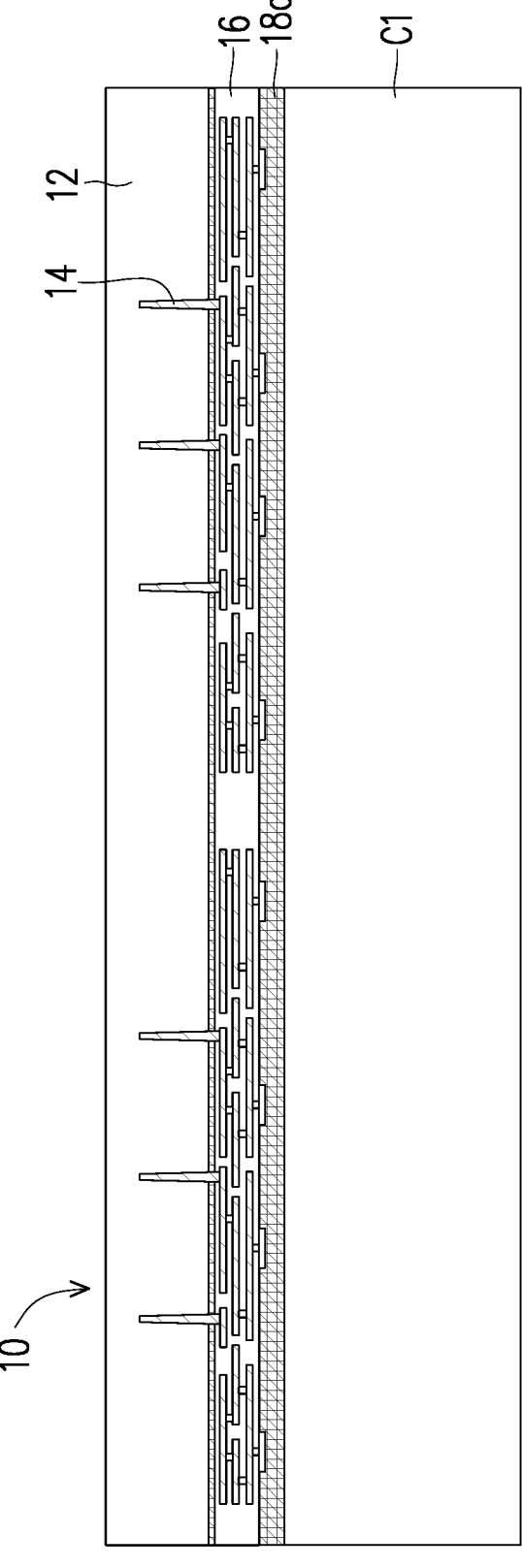

Referring to FIG. 4B, the wafer 10 is picked-up and placed on and bonded to a carrier C1. The carrier C1 may be a semiconductor wafer such as a silicon wafer. The carrier C1 may have a round top-view shape and a size of a silicon wafer. For example, carrier C1 may have an 8-inch diameter, a 12-inch diameter, or the like. The wafer 10 is bonded to the carrier C1 through a wafer-to-wafer bonding process. A bonding process is performed to bond the bonding dielectric layers 18a of the wafer 10 with the carrier C1. The bonding process may be a direct bonding process. After performing the above-mentioned direct bonding process, a semiconductor-to-dielectric bonding interface such as silicon-to-nitride (Si—SiN$_x$) bonding interface may be formed between the bonding dielectric layer 18a and the carrier C1.

Figure 4C:
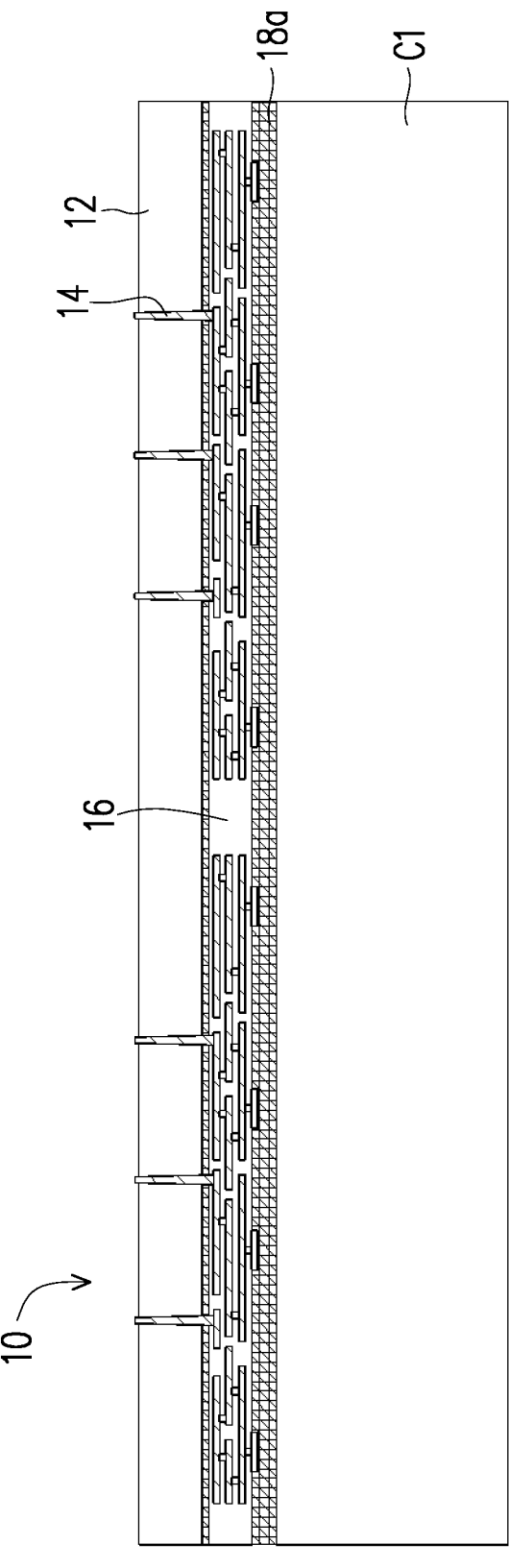
Figure 4D:
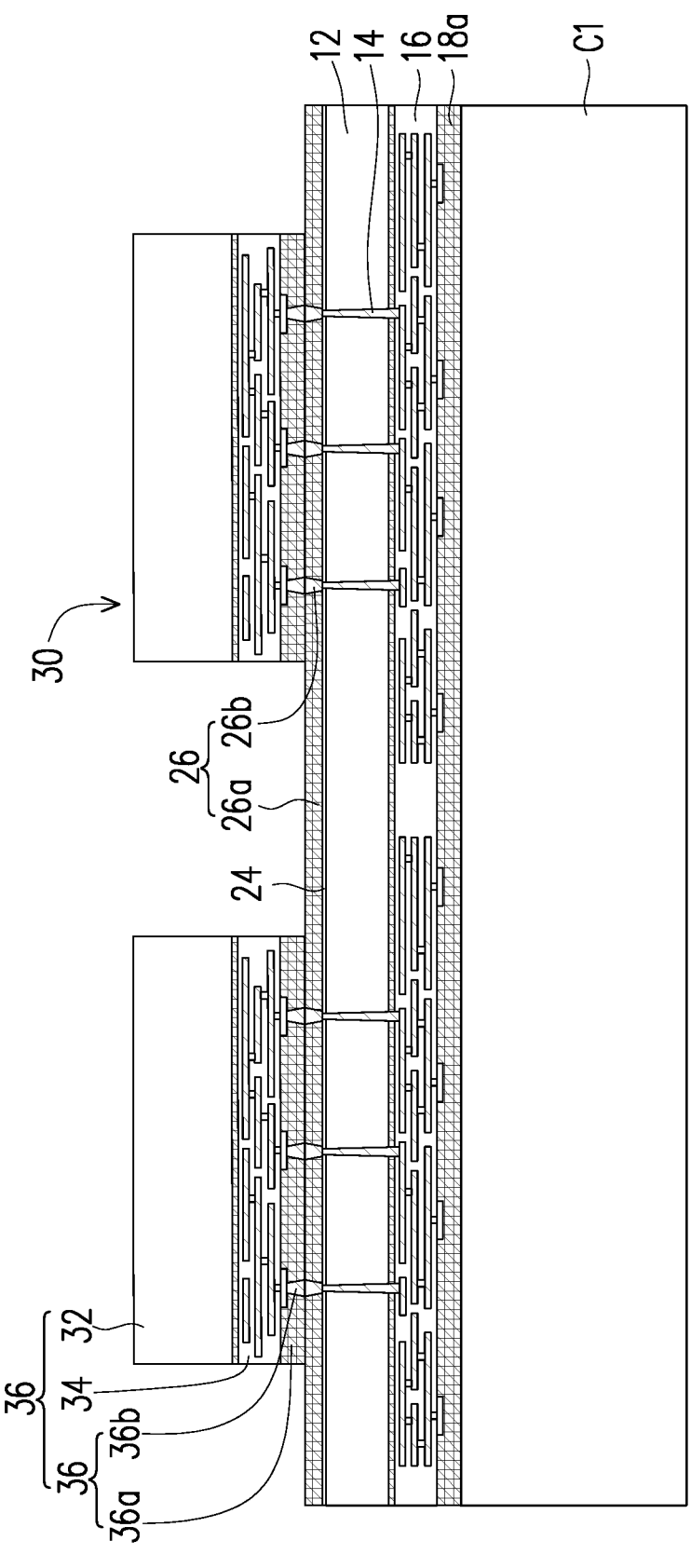
Figure 4E:
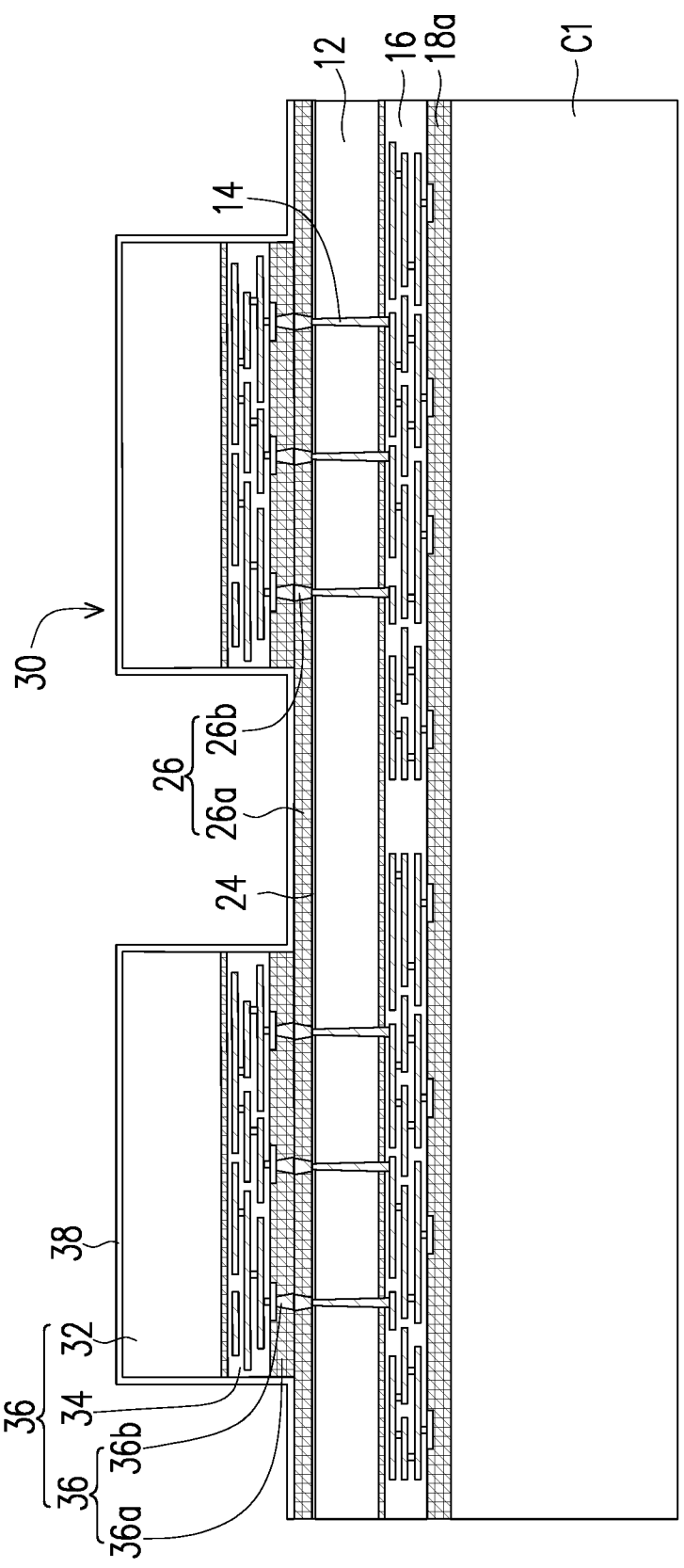
Figure 4F:
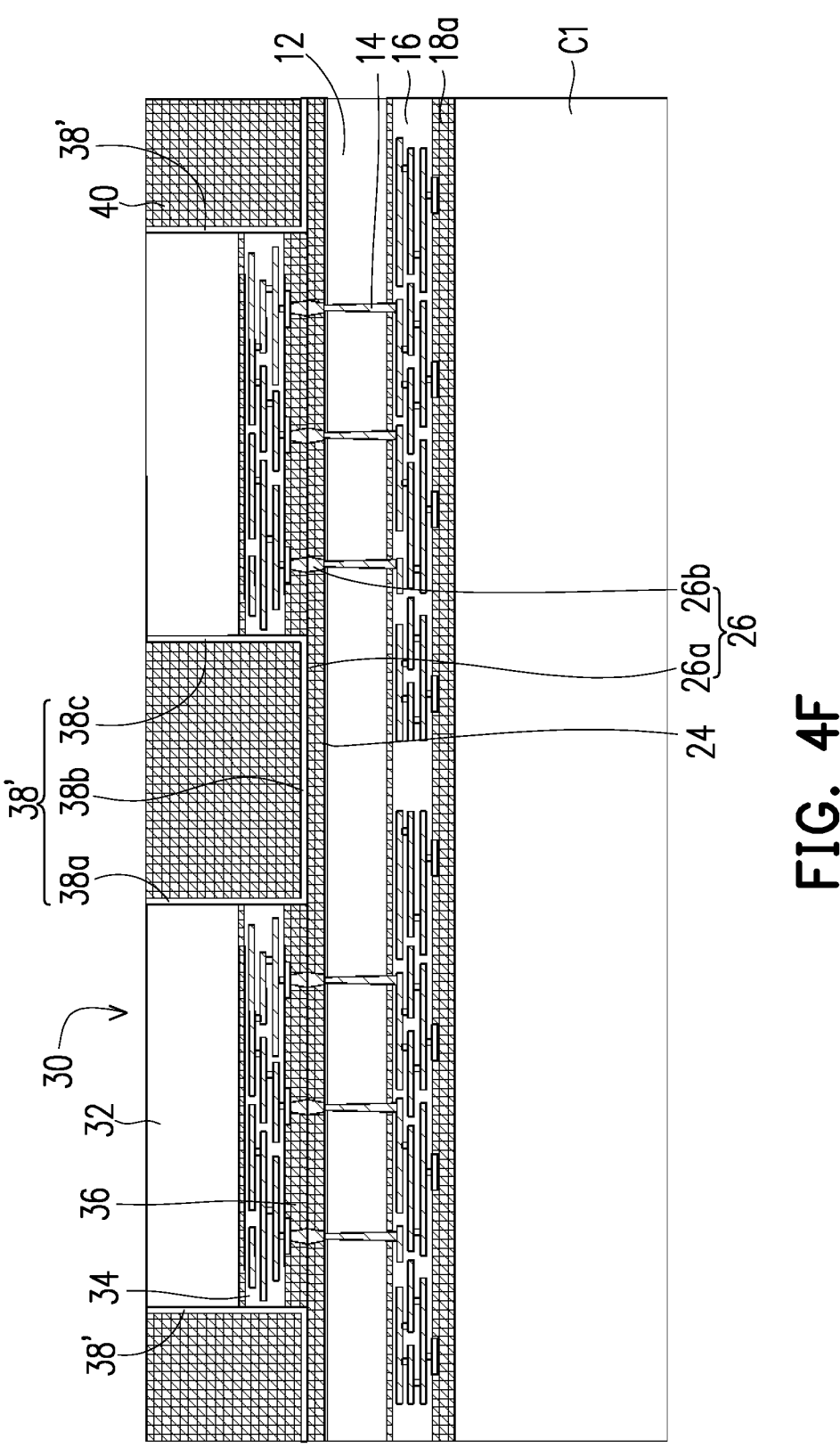
Figure 4G:
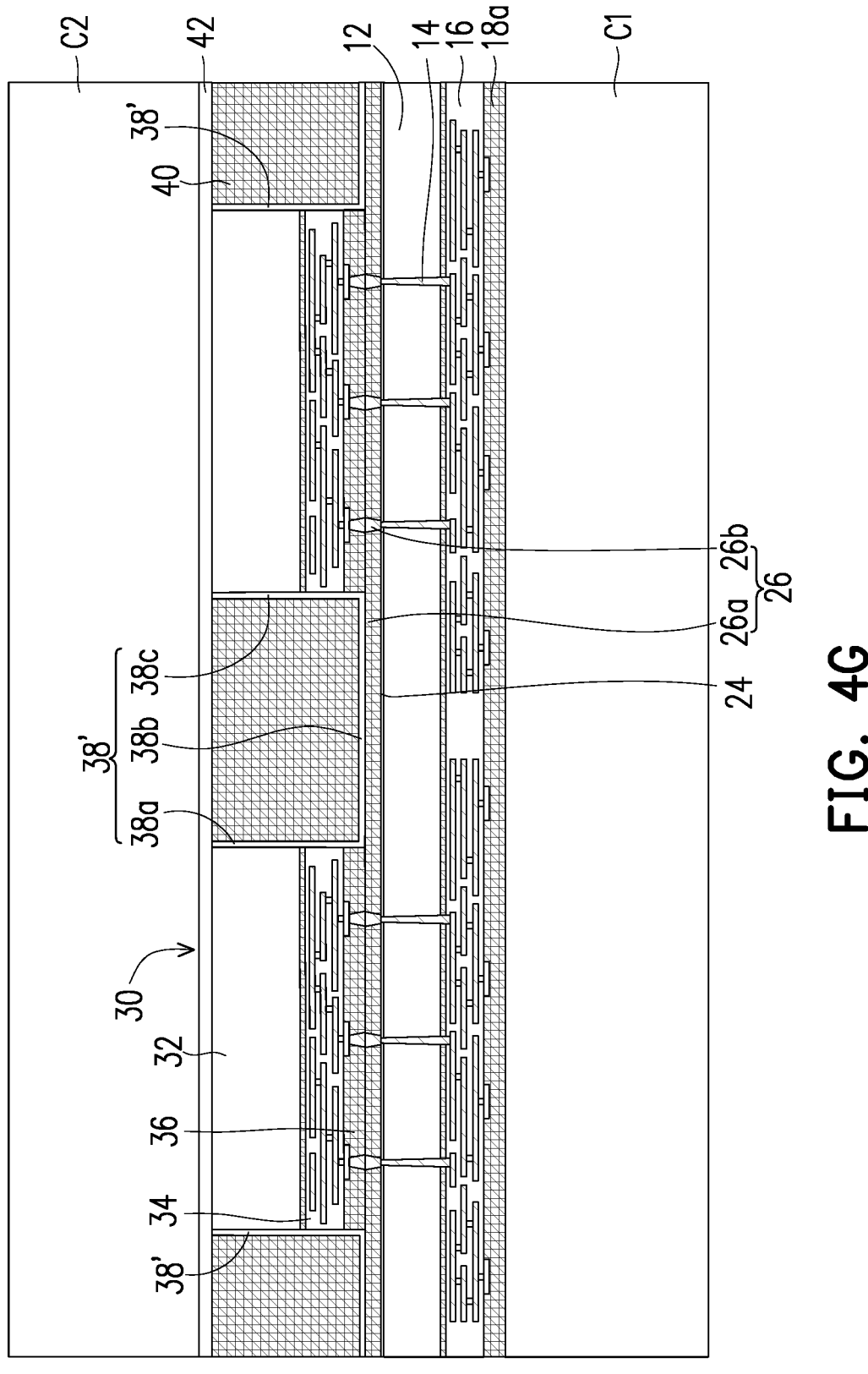
Figure 4H:
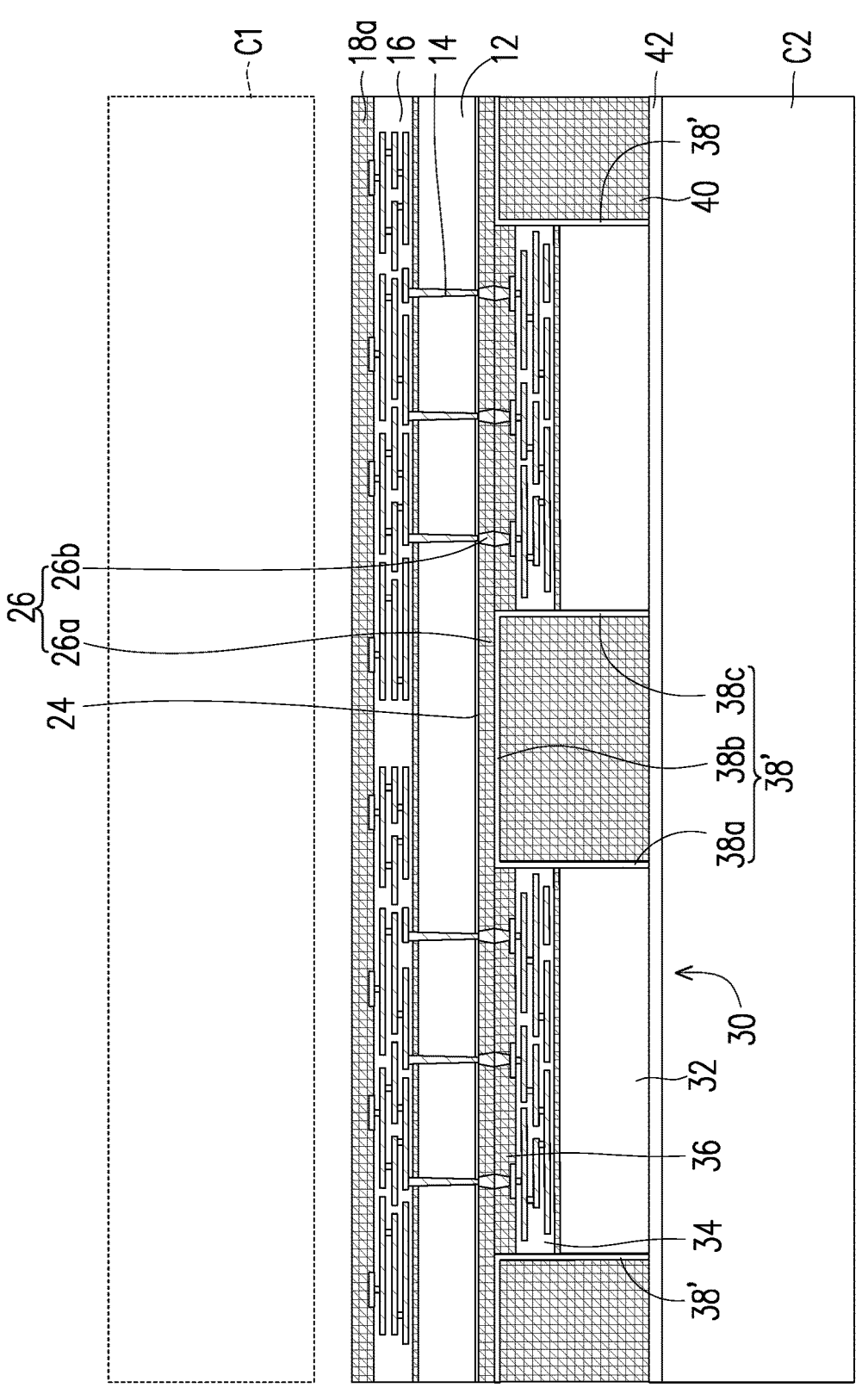
Figure 4I:
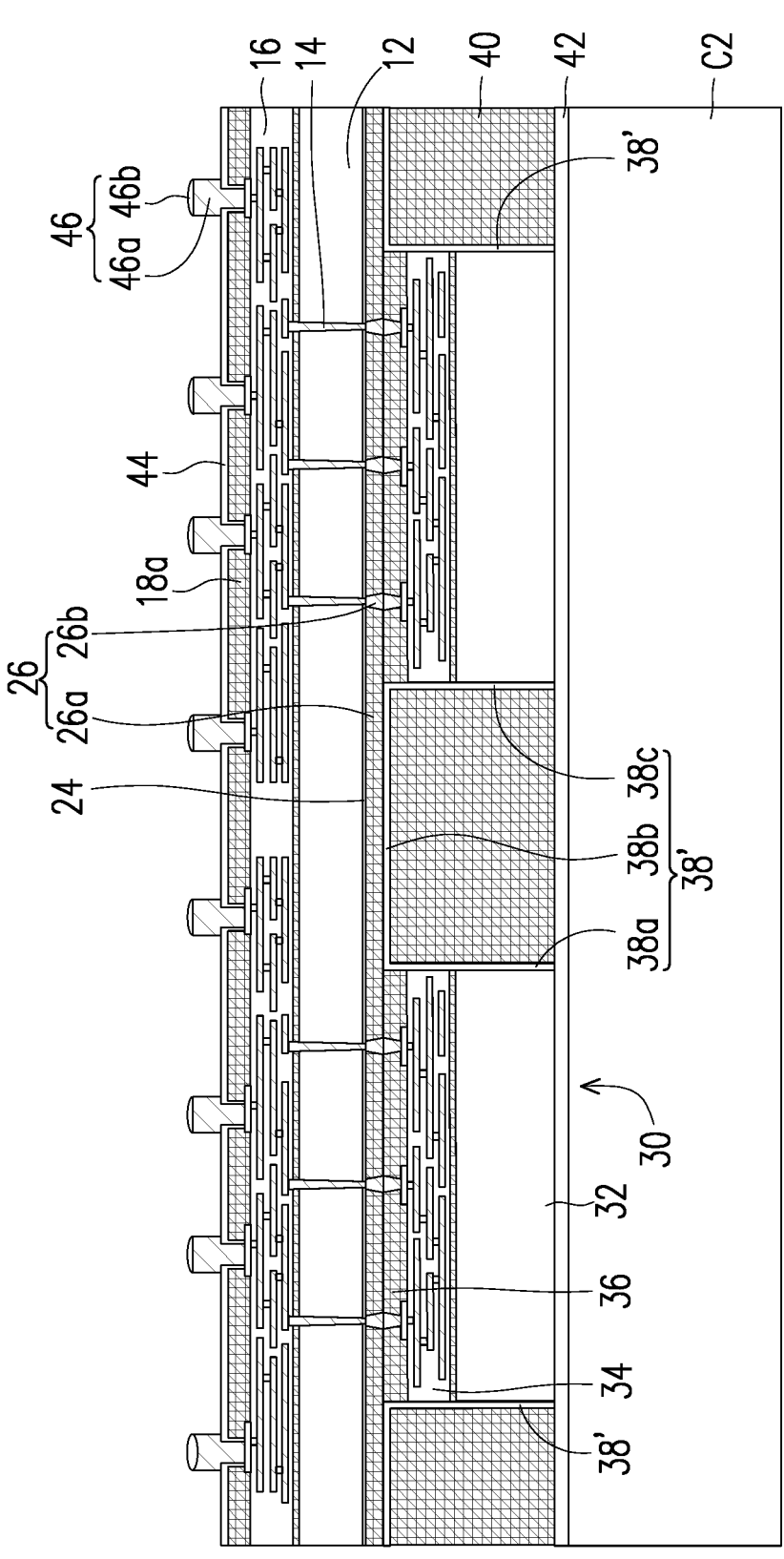
Figure 4J:
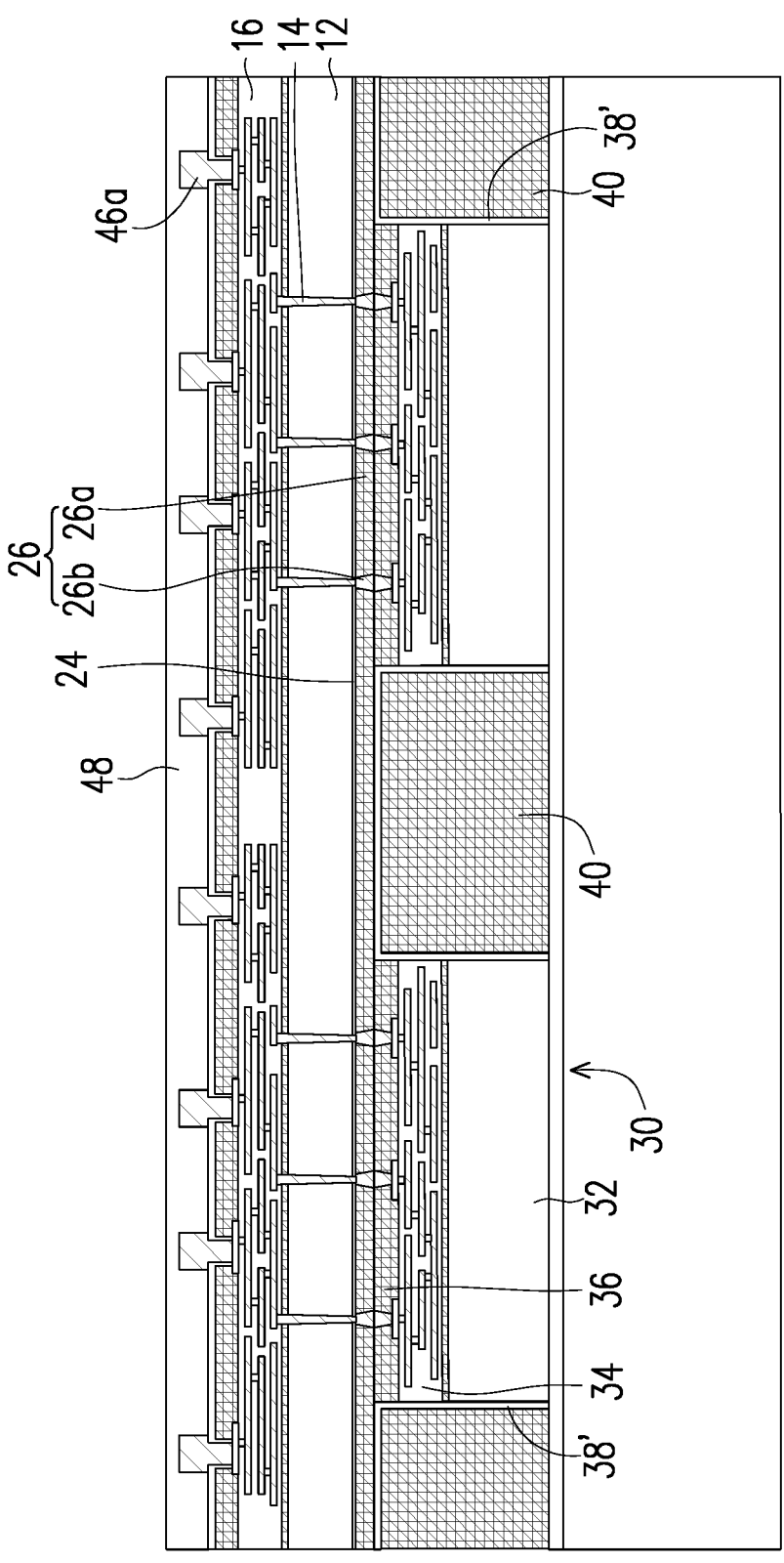
Figure 4K:
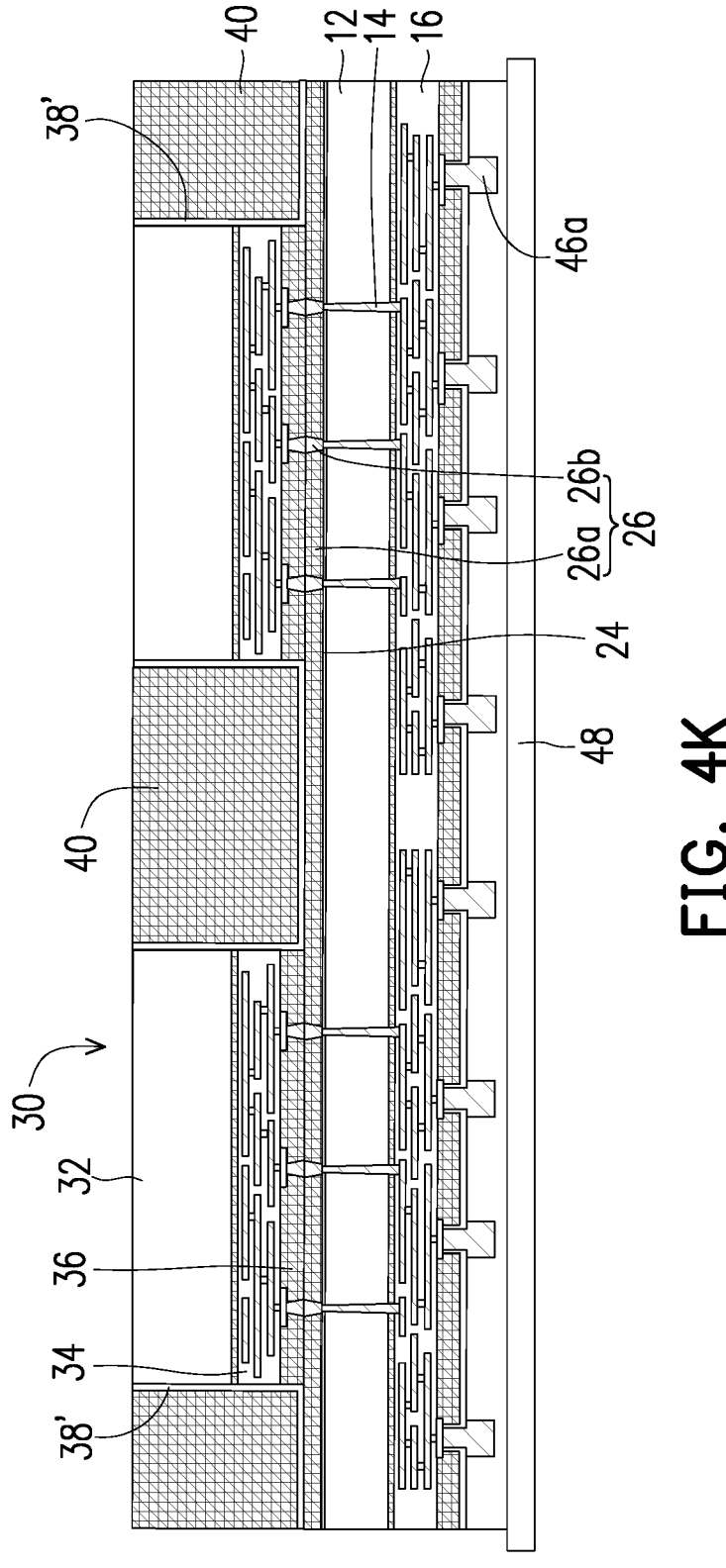
Figure 4L:
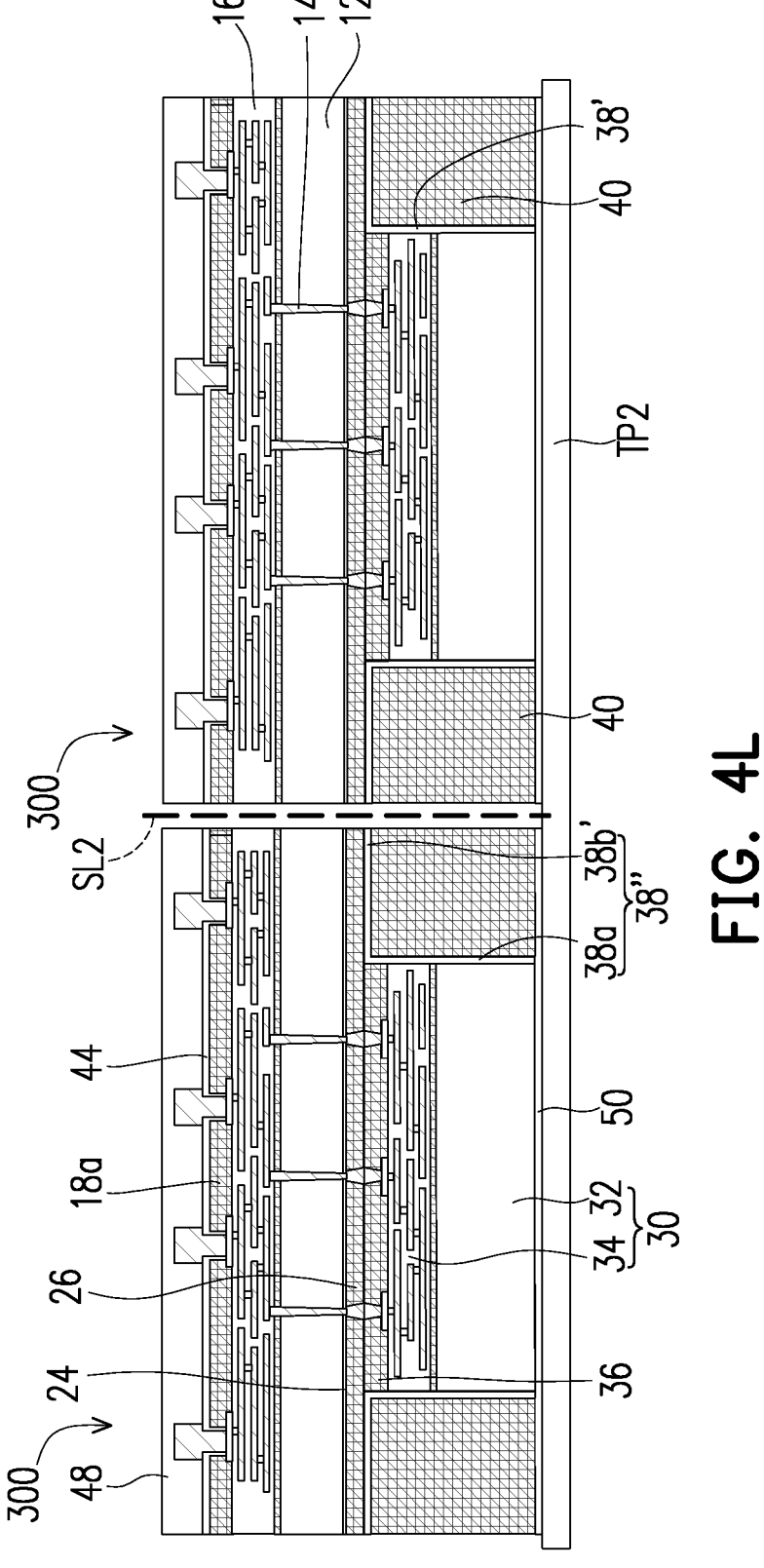

Referring to FIG. 4C, a thinning process is performed to partially remove the semiconductor substrate 12 of the wafer 10 until the through semiconductor vias 14 are revealed from the back surface of the semiconductor substrate 12. The thinning process may be a Chemical Mechanical Polish (CMP) process and/or a mechanical grinding process. After performing the above-mentioned thinning process, the through semiconductor vias 14 protrude from the back surface of the semiconductor substrate 12.

Referring to FIGS. 4D through 4L, since the processes illustrated in FIGS. 4D through 4L for fabricating SoIC structure 300 are the same as those illustrated in FIGS. 1E through 1M, detailed descriptions regarding to the processes illustrated in FIGS. 4A through 4L are thus omitted.

FIGS. 5A through 5I are cross-sectional views schematically illustrating a process flow for fabricating a PoP structure in accordance with some alternative embodiments of the present disclosure.

Referring to FIGS. 5A through 5D, since the processes illustrated in FIGS. 5A through 5D are the same as those illustrated in FIGS. 2A through 2D, detailed descriptions regarding to the processes illustrated in FIGS. 5A through 5D are thus omitted.

Figure 5A:
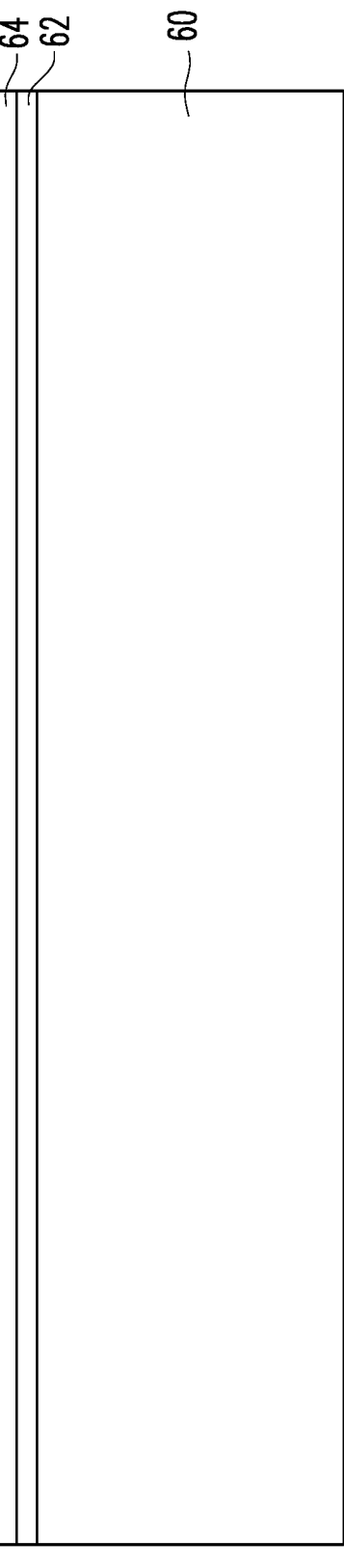
FIGS. 5A through 5I are cross-sectional views schematically illustrating a process flow for fabricating a PoP structure in accordance with some alternative embodiments of the present disclosure.
Figure 5B:
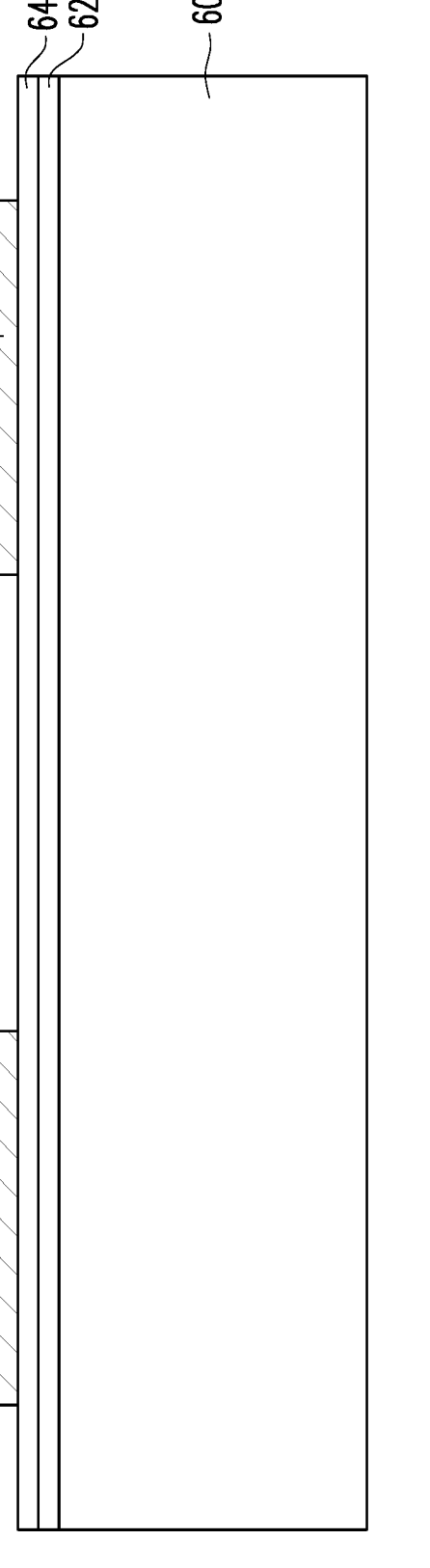
Figure 5C:
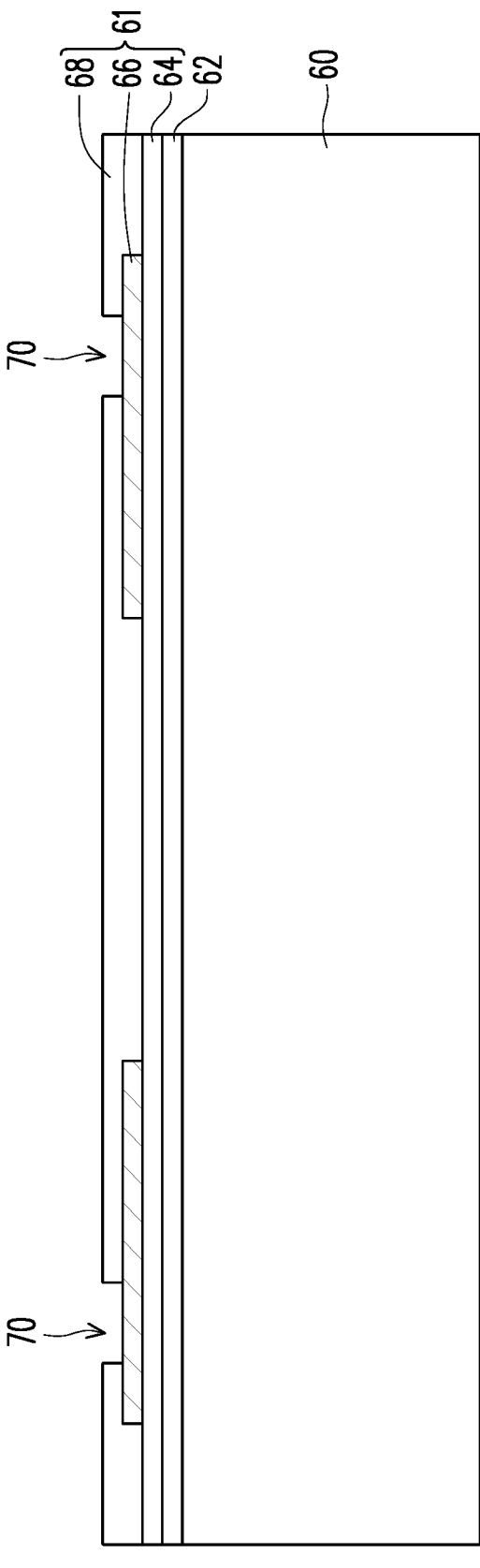
Figure 5D:
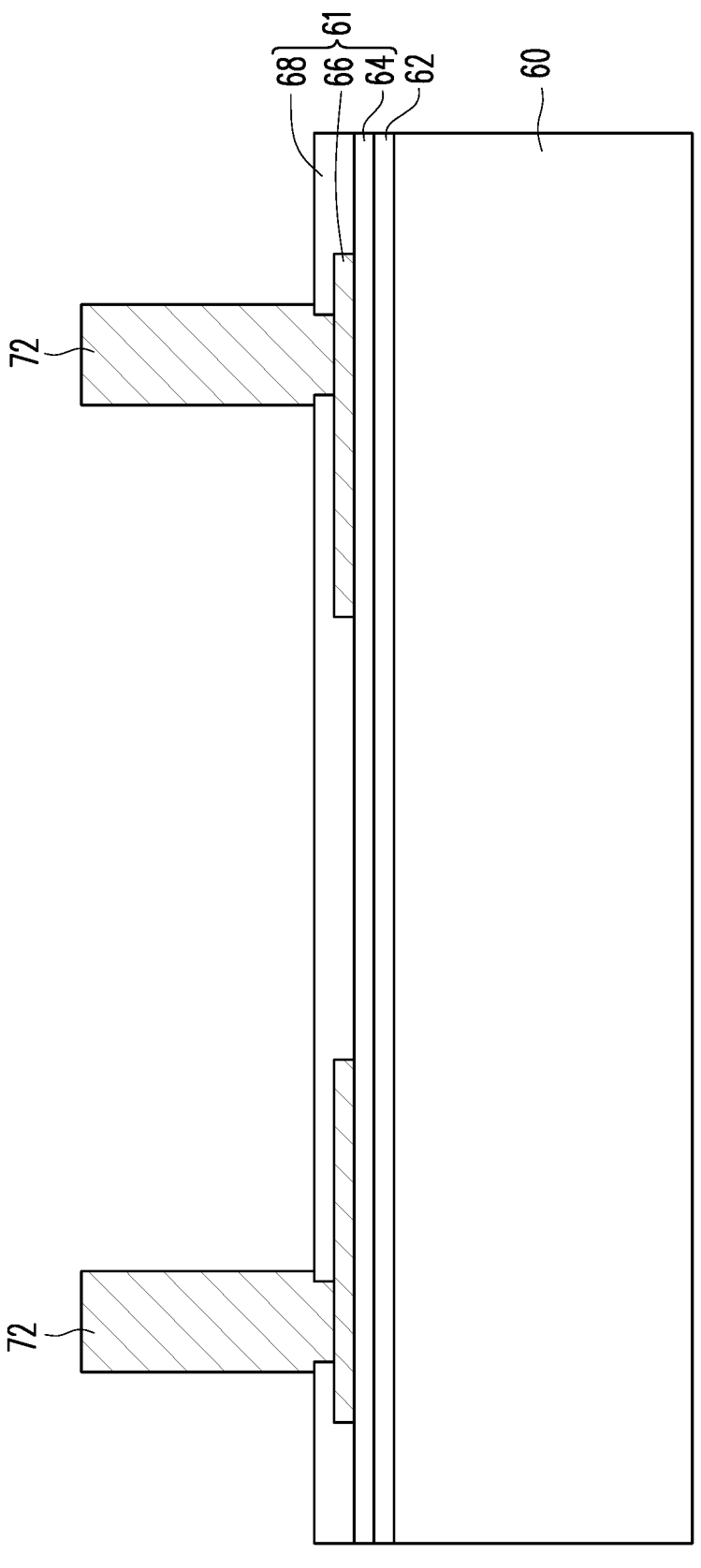
Figure 5E:
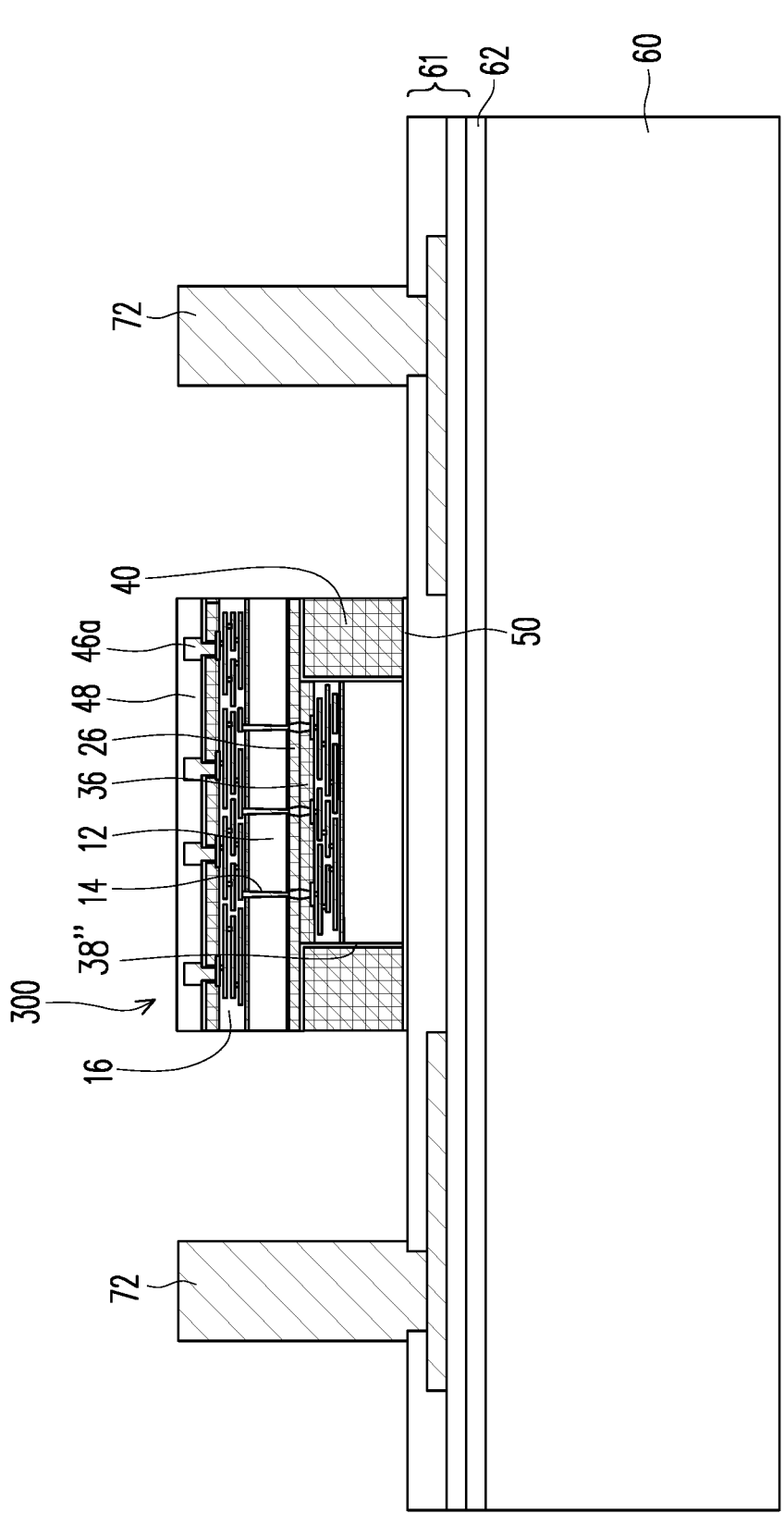
Figure 5F:
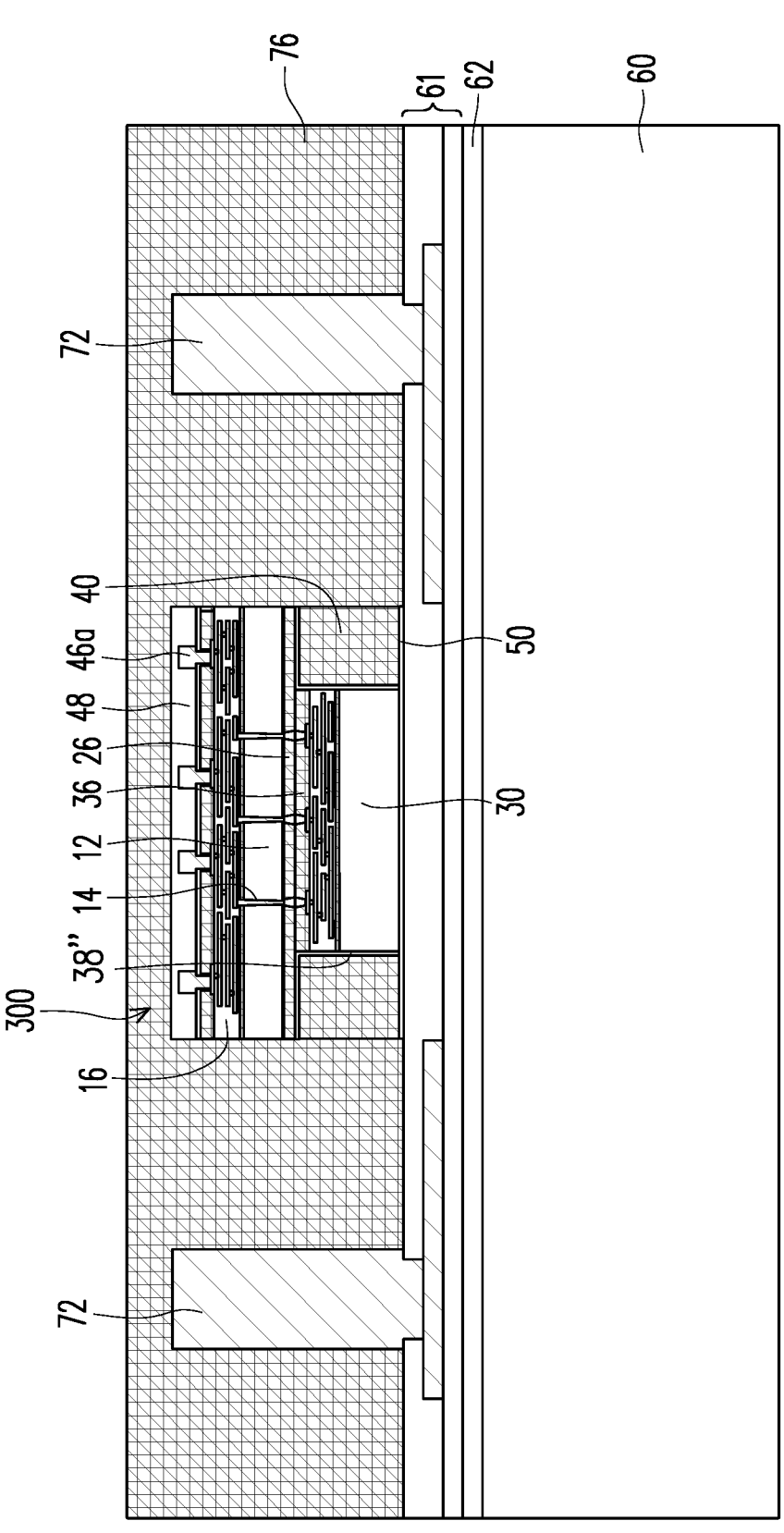
Figure 5G:
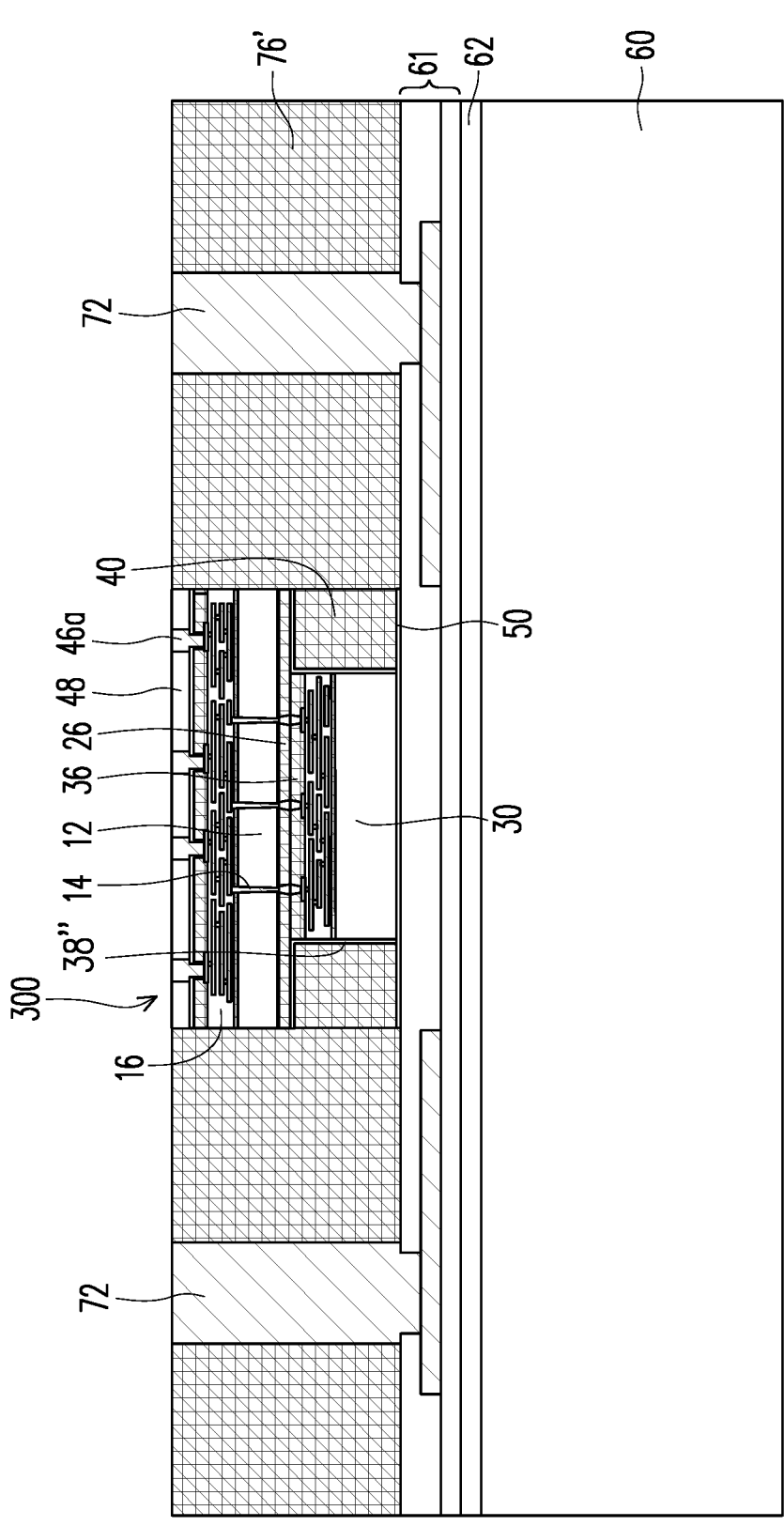
Figure 5H:
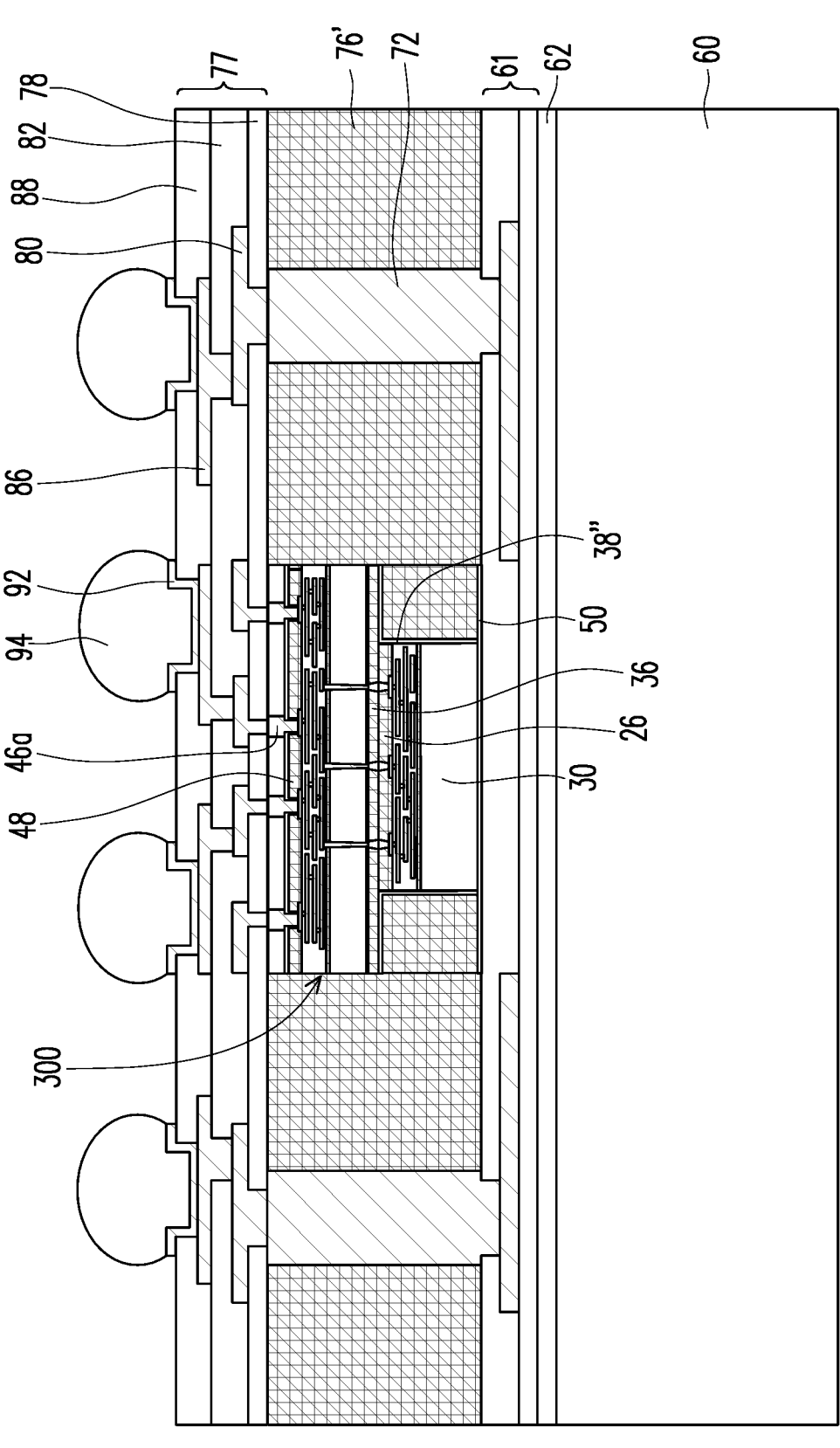

Referring FIG. 5E, after forming the conductive through vias 72, at least one SoIC structure 300 is picked-up and placed over the dielectric layer 68 of the redistribution circuit structure 61. Only a single SoIC structure 300 and its surrounding conductive through vias 72 are illustrated in FIG. 5E for illustrative purposes. It is noted, however, that the process steps shown in FIGS. 5A through 5I may be performed at wafer level, and are performed on multiple SoIC structure 300 and the conductive through vias 72 disposed over the carrier 60. As illustrated in FIG. 5E, the attachment film 50 in the SoIC structure 300 is adhered to the dielectric layer 68.

Referring to FIGS. 5F through 5I, since the processes illustrated in FIGS. 5F through 5I are the same as that illustrated in FIGS. 2F through 2I, detailed descriptions regarding to the processes illustrated in FIGS. 5F through 5I are thus omitted.

Figure 5I:
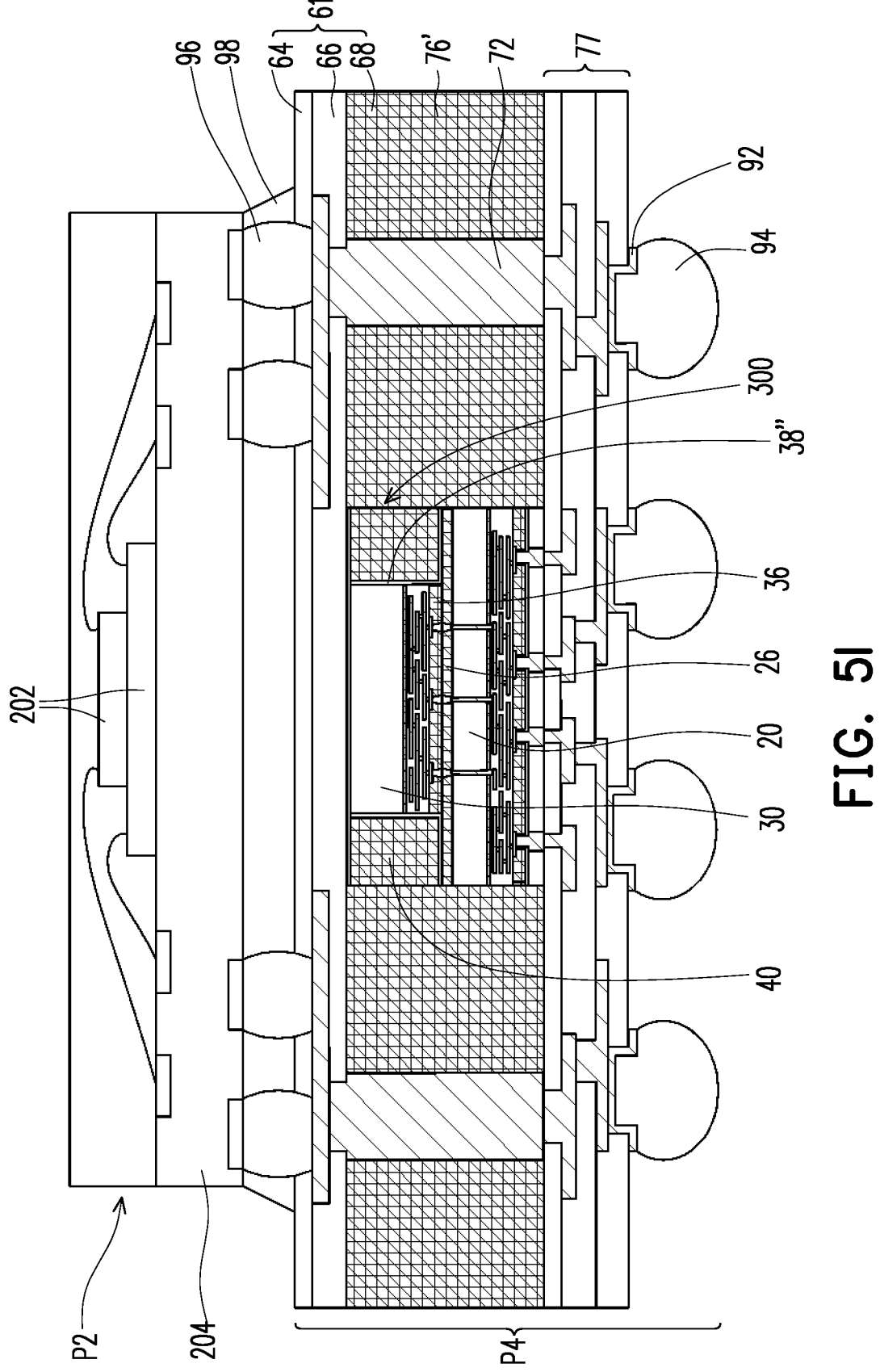

As illustrated in FIG. 5I, the integrated fanout package P4 includes an SoIC structure 300 (i.e., a device die), conductive through vias 72, an insulating encapsulant 76', a redistribution circuit structure 61 and a redistribution circuit structure 77. The SoIC structure 300 and the conductive through vias 72 are laterally encapsulated by the insulating encapsulant 76'. The redistribution circuit structure 61 and the redistribution circuit structure 77 are respectively disposed on opposite sides of the insulating encapsulant 76'. The SoIC structure 300 include a semiconductor die 20 (i.e., a bottom tier semiconductor die), a semiconductor die 30 (i.e., a top tier semiconductor die), an anti-arcing layer 38" and an insulating encapsulant 40. The semiconductor die 30 is stacked over and electrically connected to the semiconductor die 20. The anti-arcing layer 38" is in contact with the semiconductor die 30. Furthermore, the first insulating encapsulant 40 is disposed over the semiconductor die 20 and laterally encapsulates the semiconductor die 30.

Figure 6:
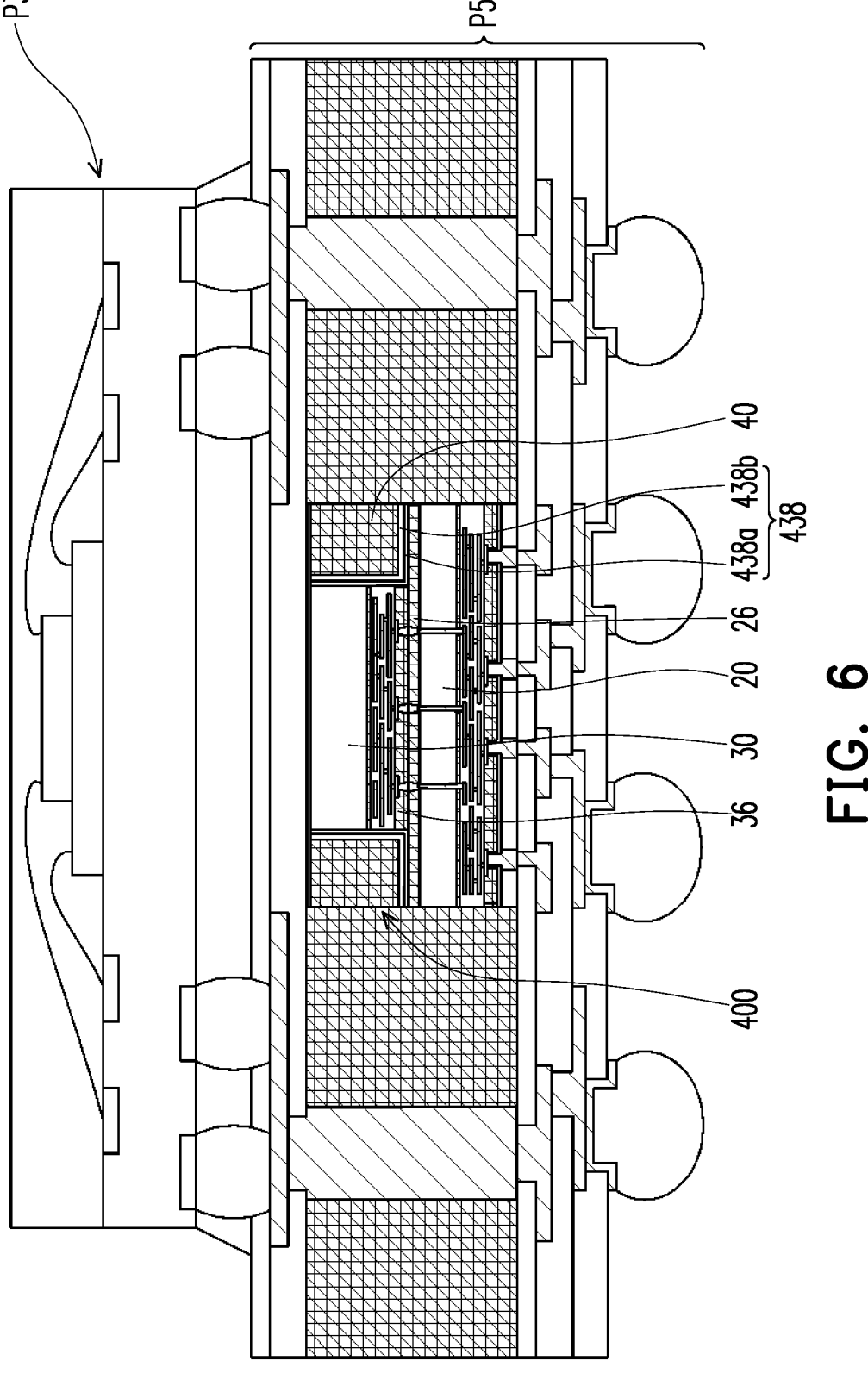
FIG. 6 is a cross-sectional view schematically illustrating an integrated fanout package structure of a PoP structure in accordance with some other embodiments of the present disclosure.

FIG. 6 is a cross-sectional view schematically illustrating an integrated fanout package structure of a PoP structure in accordance with some other embodiments of the present disclosure.

Referring to FIG. 5I and FIG. 6, the integrated fanout package structure P5 illustrated in FIG. 6 is similar with the integrated fanout package structure P4 illustrated in FIG. 5I except that the integrated fanout package structure P5 includes an SoIC structure 400 including an multi-layered anti-arcing layer 438, and the multi-layered anti-arcing layer 438 includes a metallic layer 438a in contact with the semiconductor die 30 and a dielectric 438b layer covering the metallic layer 438a. Since the SoIC structure 400 is similar to the SoIC structure 300 except for the multi-layered anti-arcing layer 438, detailed descriptions regarding to other elements (e.g., the semiconductor die 20, bonding structure 26, the semiconductor die 30, the bonding structure 36, and the insulating encapsulant 40) in the SoIC structure 400 are thus omitted.

FIGS. 7A through 7L are cross-sectional views schematically illustrating a process flow for fabricating SoIC structures in accordance with some other embodiments of the present disclosure.

Referring to FIGS. 7A through 7E, since the processes illustrated in FIGS. 7A through 7E are the same as those illustrated in FIGS. 1A through 1E, detailed descriptions regarding to the processes illustrated in FIGS. 7A through 7E are thus omitted.

Figure 7A:
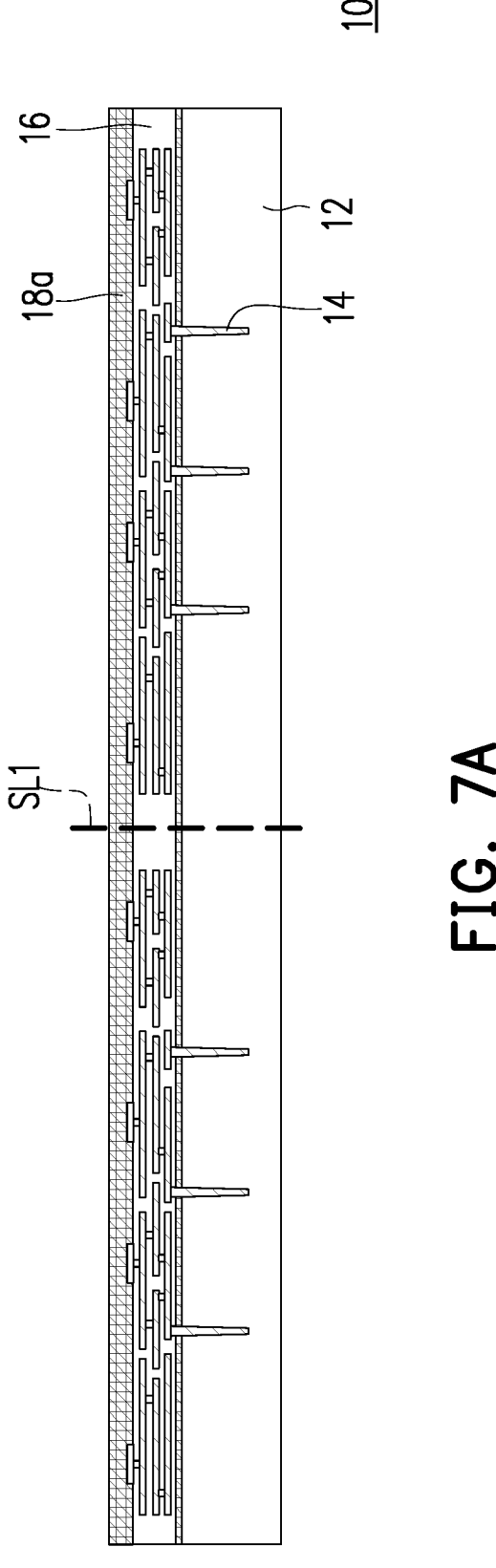
Figure 7B:
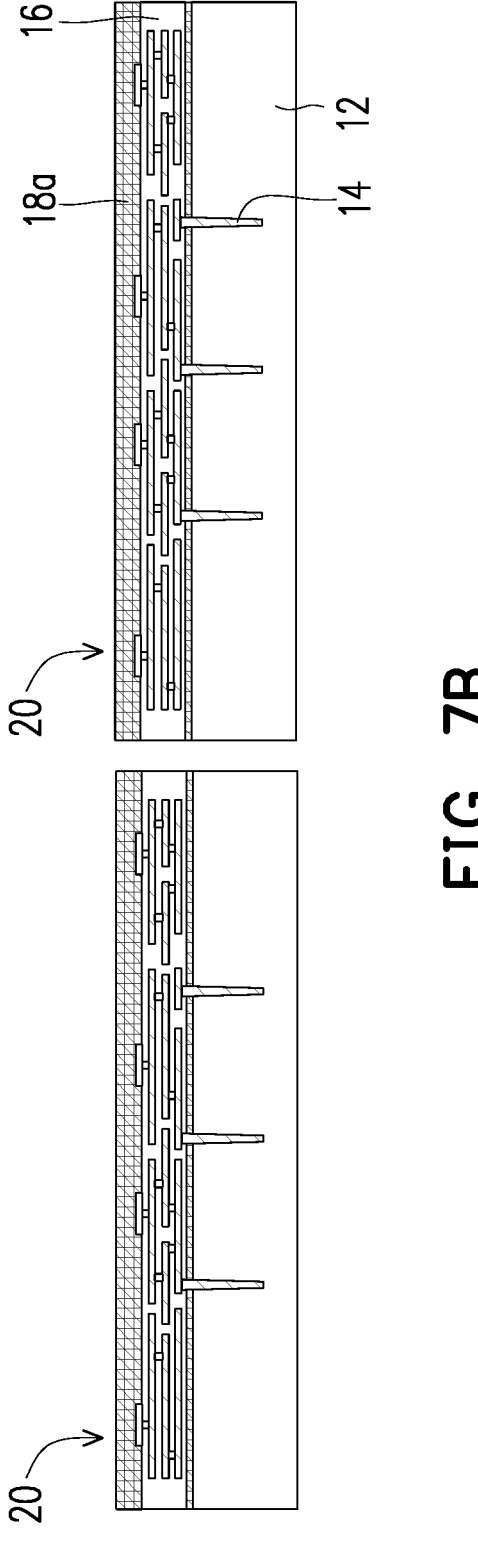
Figure 7C:
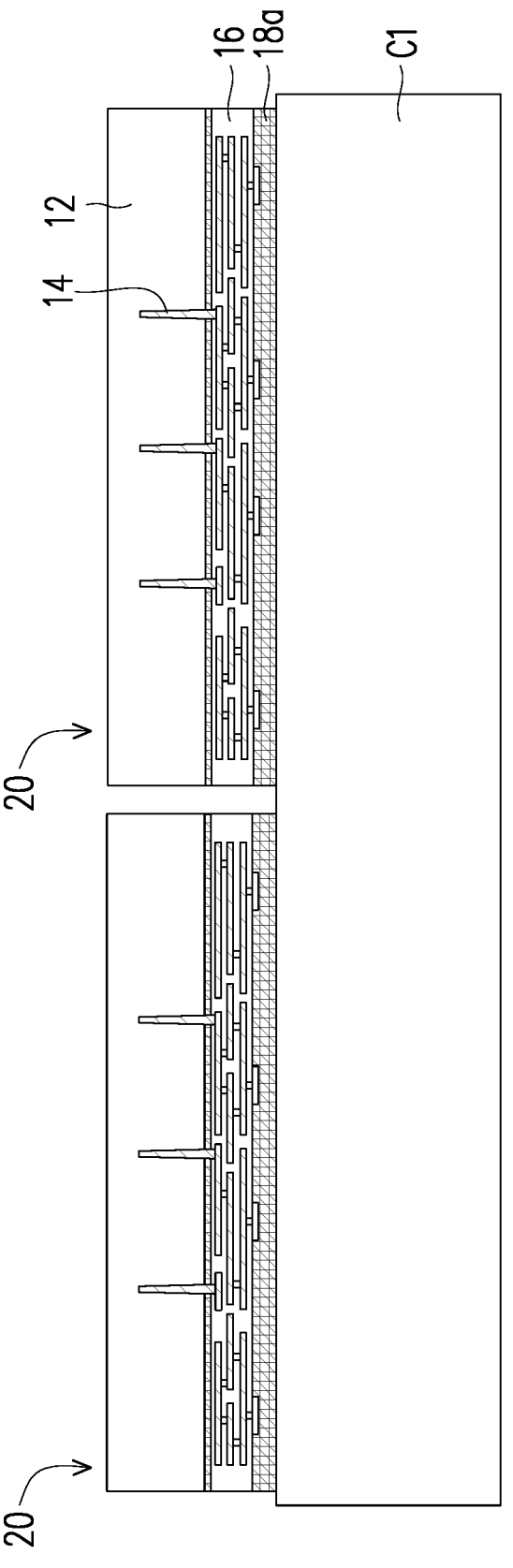
Figure 7D:
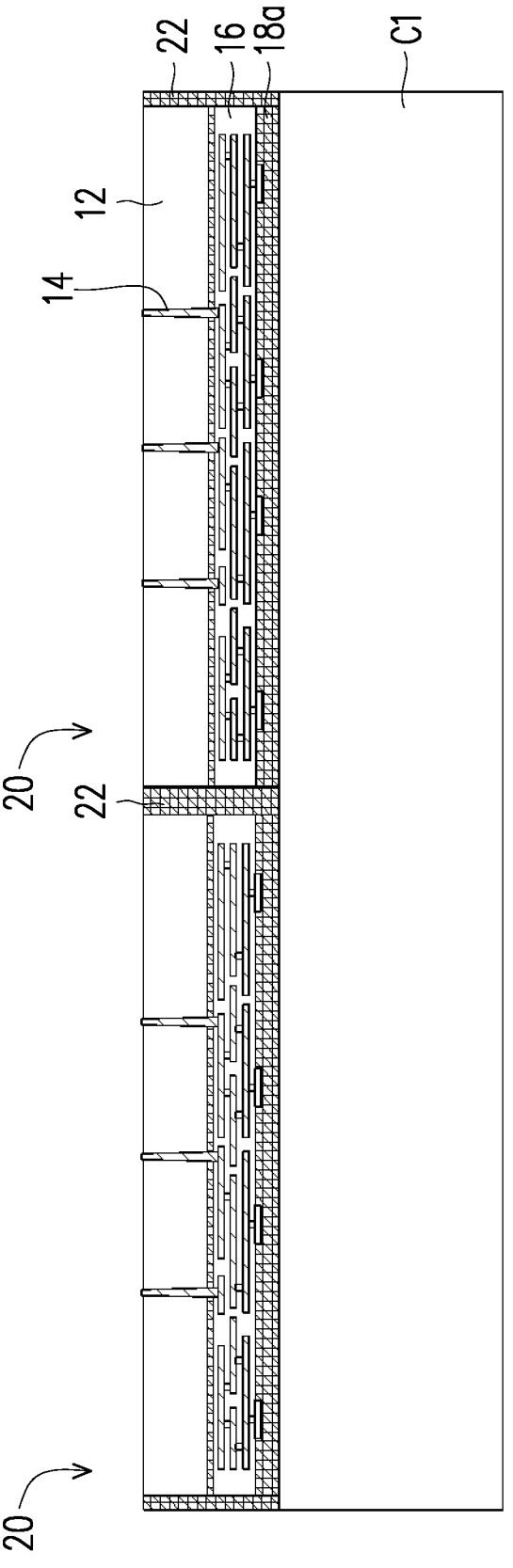
Figure 7E:
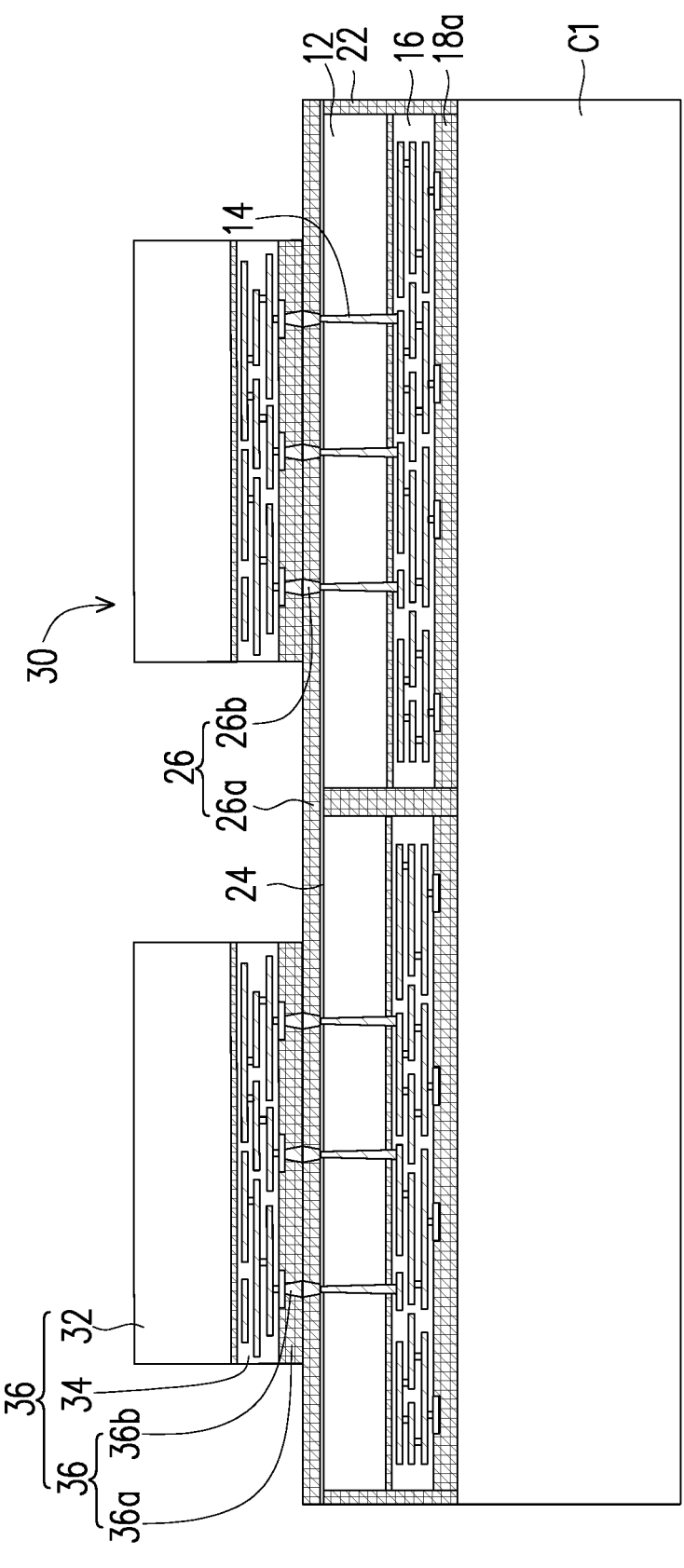
Figure 7F:
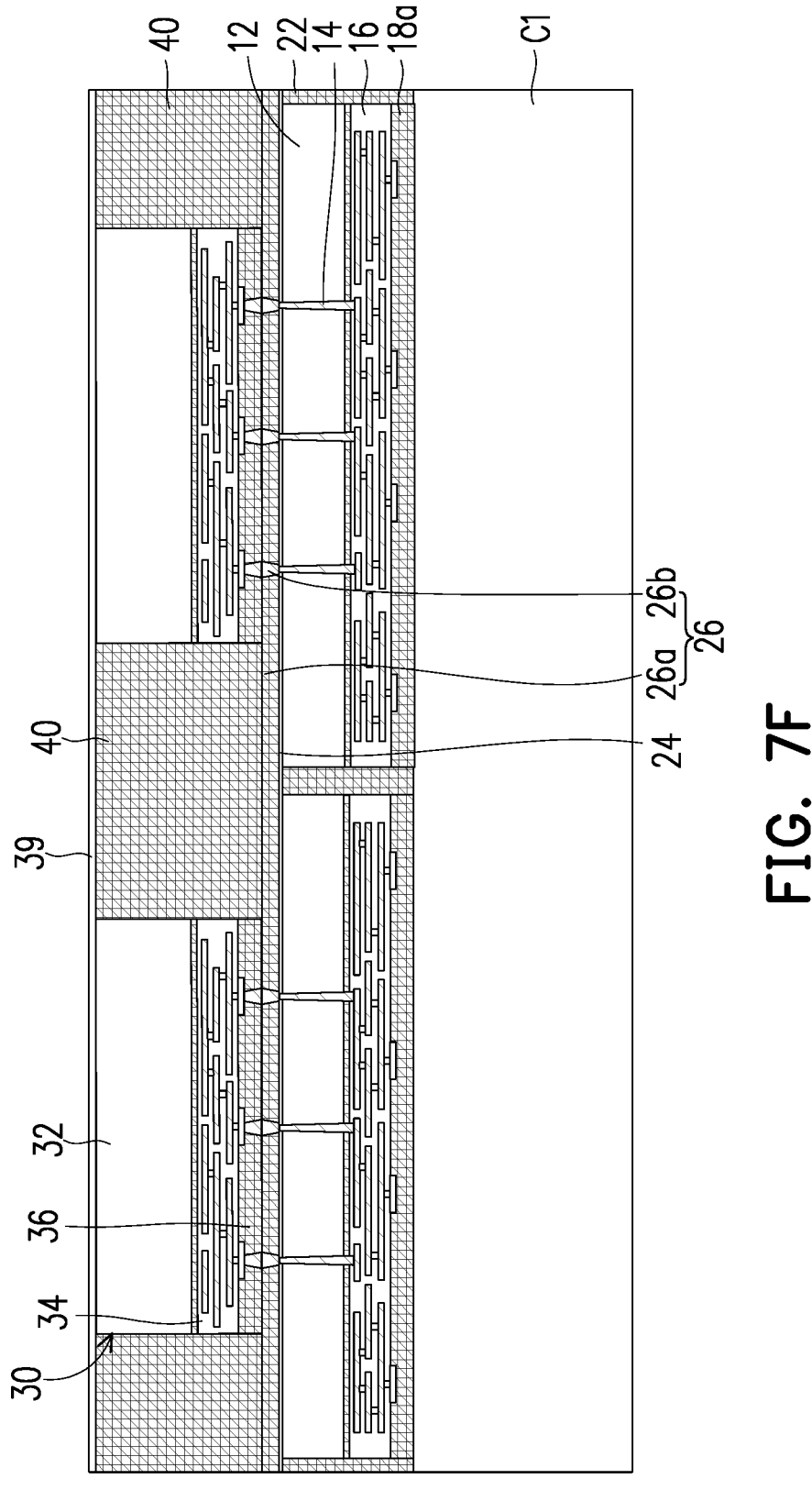

Referring to FIG. 7F, an insulating encapsulation material is formed over the bonding structure 26 to cover the semiconductor dies 30. The insulating encapsulation material may be a molding compound (e.g., epoxy or other suitable resin) formed through an over-molding process. The insulating encapsulation material fills the gaps between neighboring semiconductor dies 30. After forming the insulating encapsulation material over the bonding structure 26, the insulating encapsulation material is partially removed until the semiconductor substrates 32 of the semiconductor dies 30 are revealed such that an insulating encapsulant 40 is formed. The insulating encapsulation material may be partially remove through a planarization process such as a Chemical Mechanical Polish (CMP) process and/or a mechanical grinding process. After performing the above-mentioned planarization process, the top surface of the insulating encapsulant 40 is substantially level with back surfaces of the semiconductor dies 30.

After performing the above-mentioned planarization process, an anti-arcing layer 39 is formed to entirely cover the top surface of the insulating encapsulant 40 and the back surfaces of the semiconductor dies 30. Charge accumulation can be released by the anti-arcing layers 39 during fabrication processes illustrated in FIGS. 1G through 1M. Accordingly, the anti-arcing layers 39 may protect the semiconductor dies 20 and 30 from being damaged by ESD occurred during subsequently performed bonding and de-bonding processes, such as the bonding process illustrated in FIG. 7G, the de-bonding process illustrated in FIG. 7H, the de-bonding process and the frame mount process illustrated in FIG. 7K, and the frame mount process illustrated in FIG. 7L.

Figure 7G:
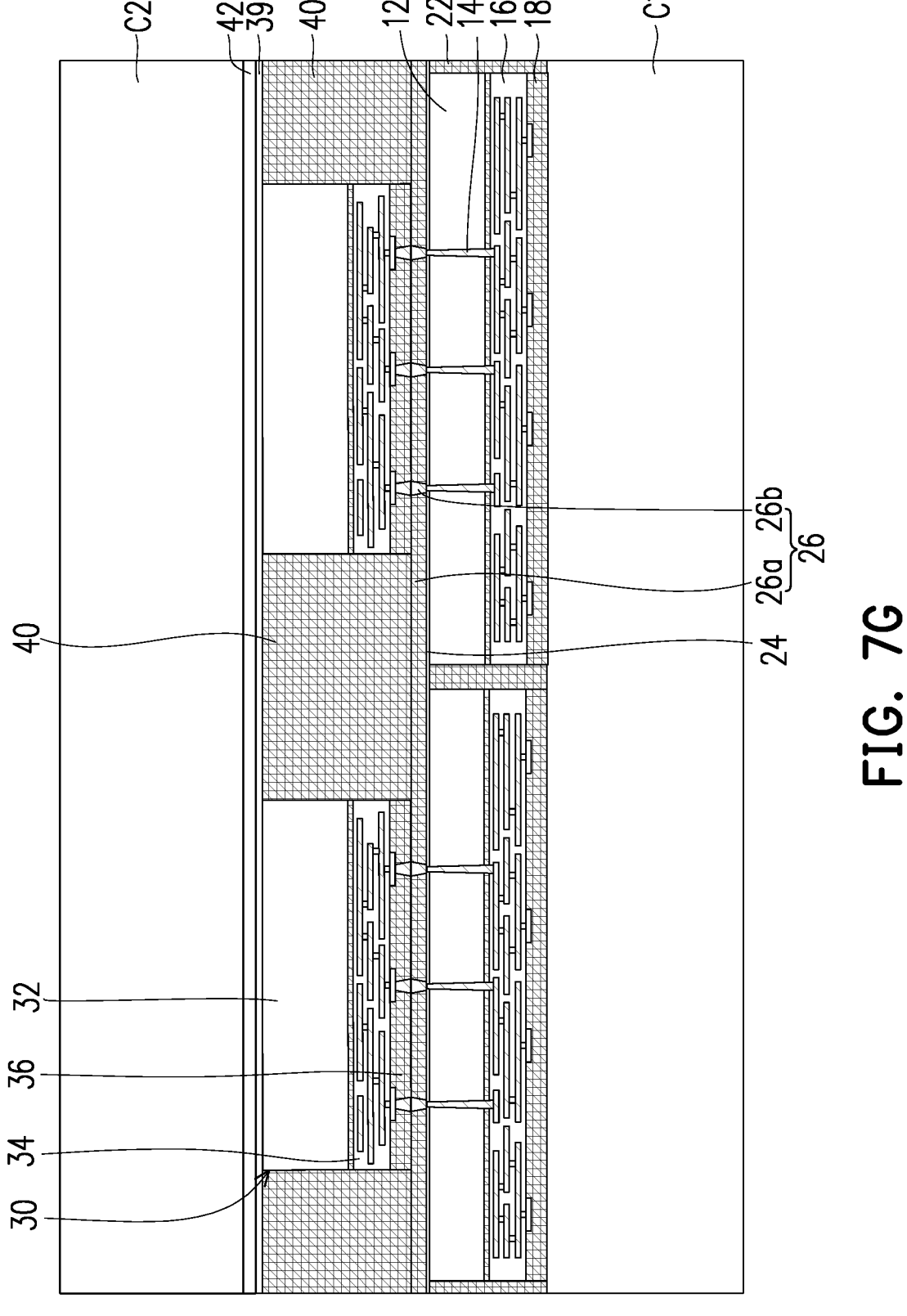
Figure 7H:
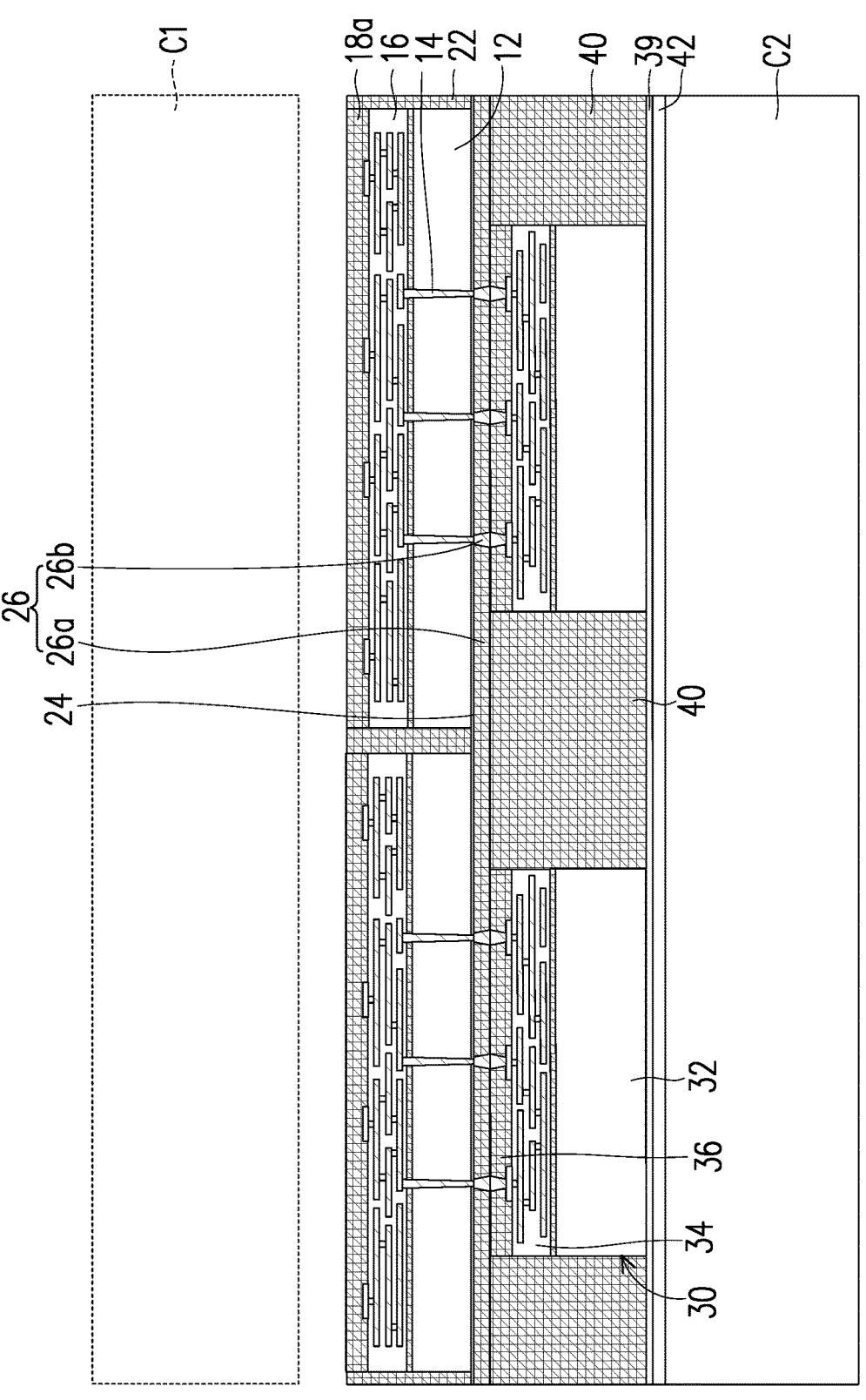
Figure 71:
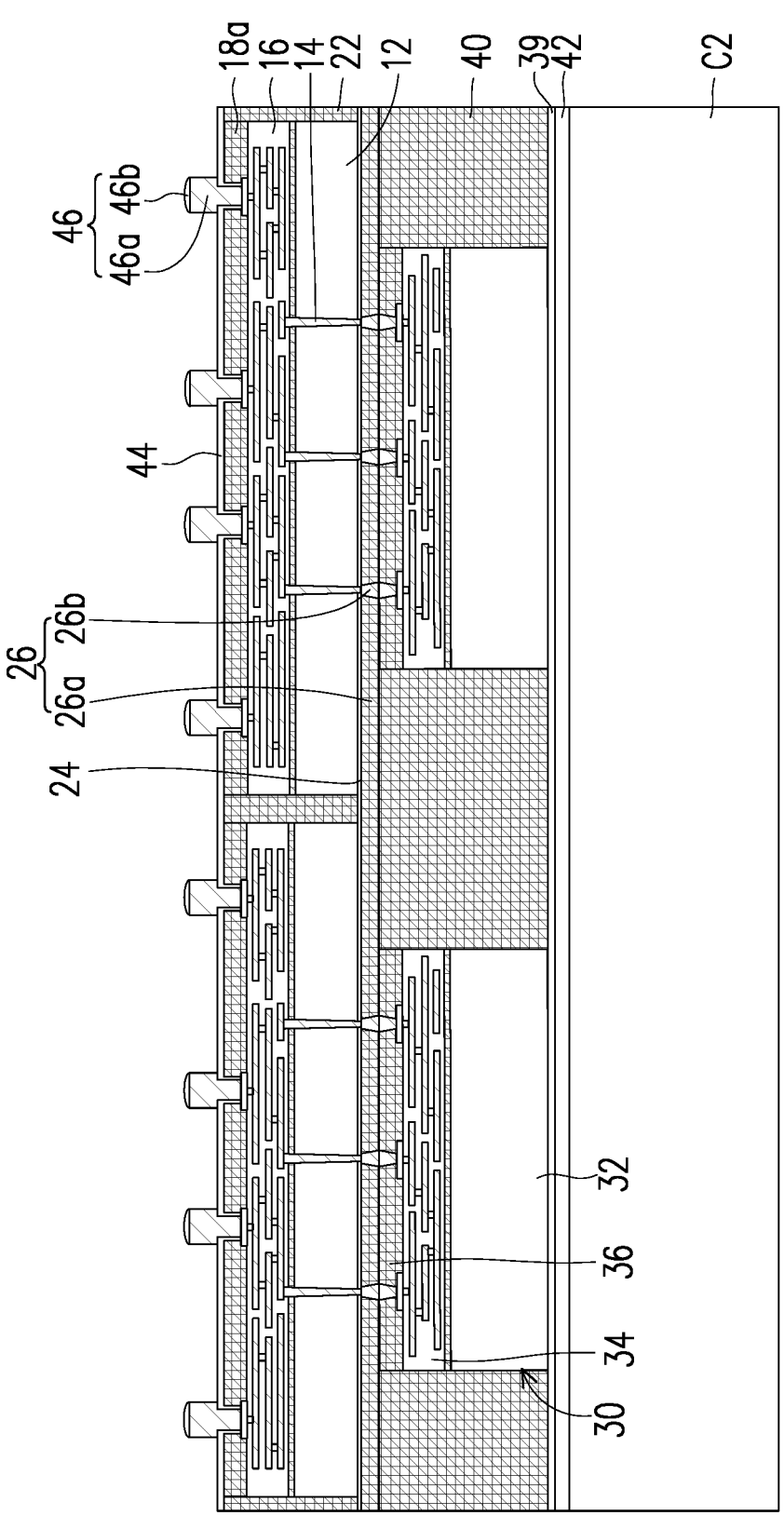
Figure 7J:
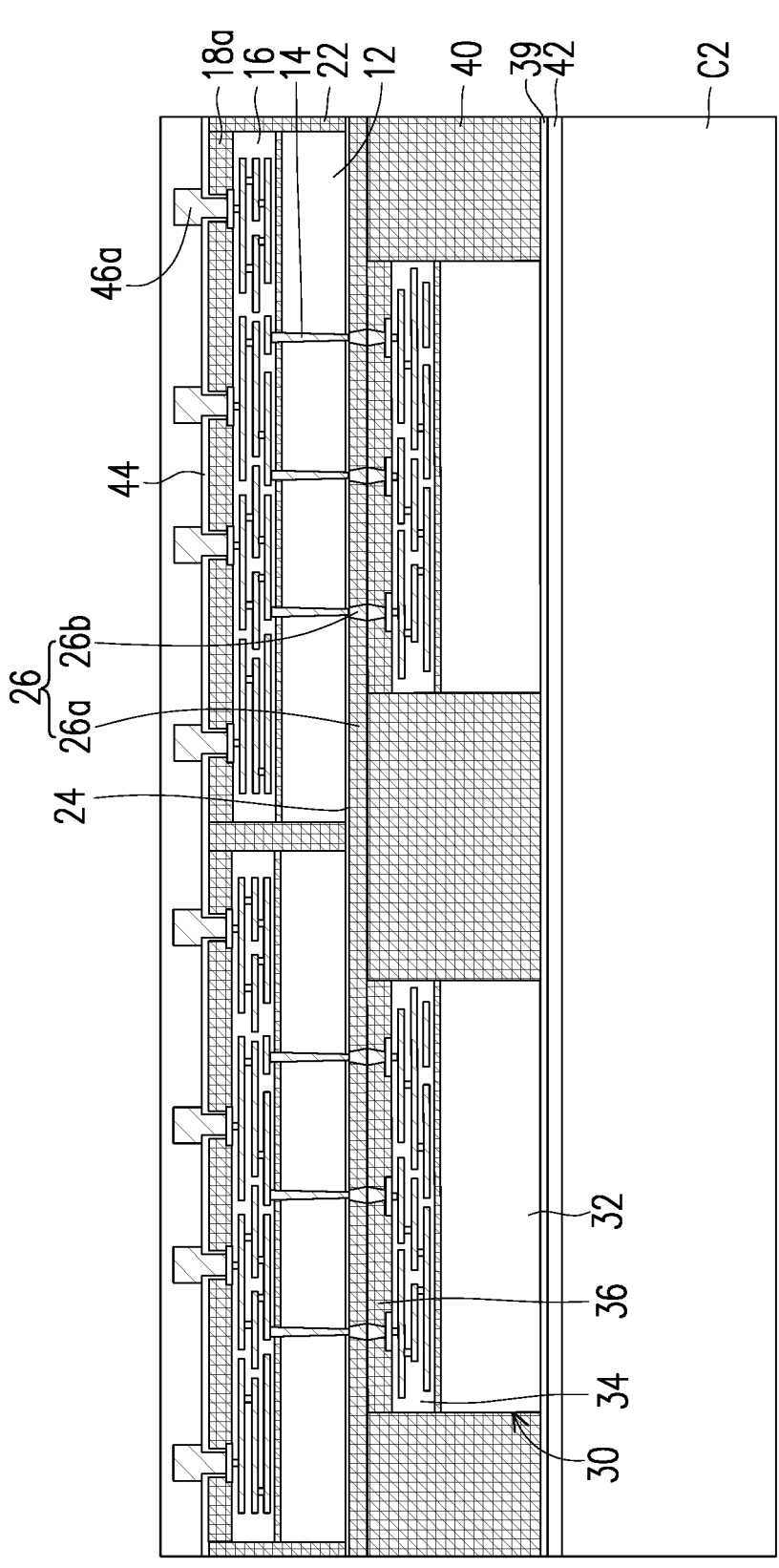
Figure 7K:
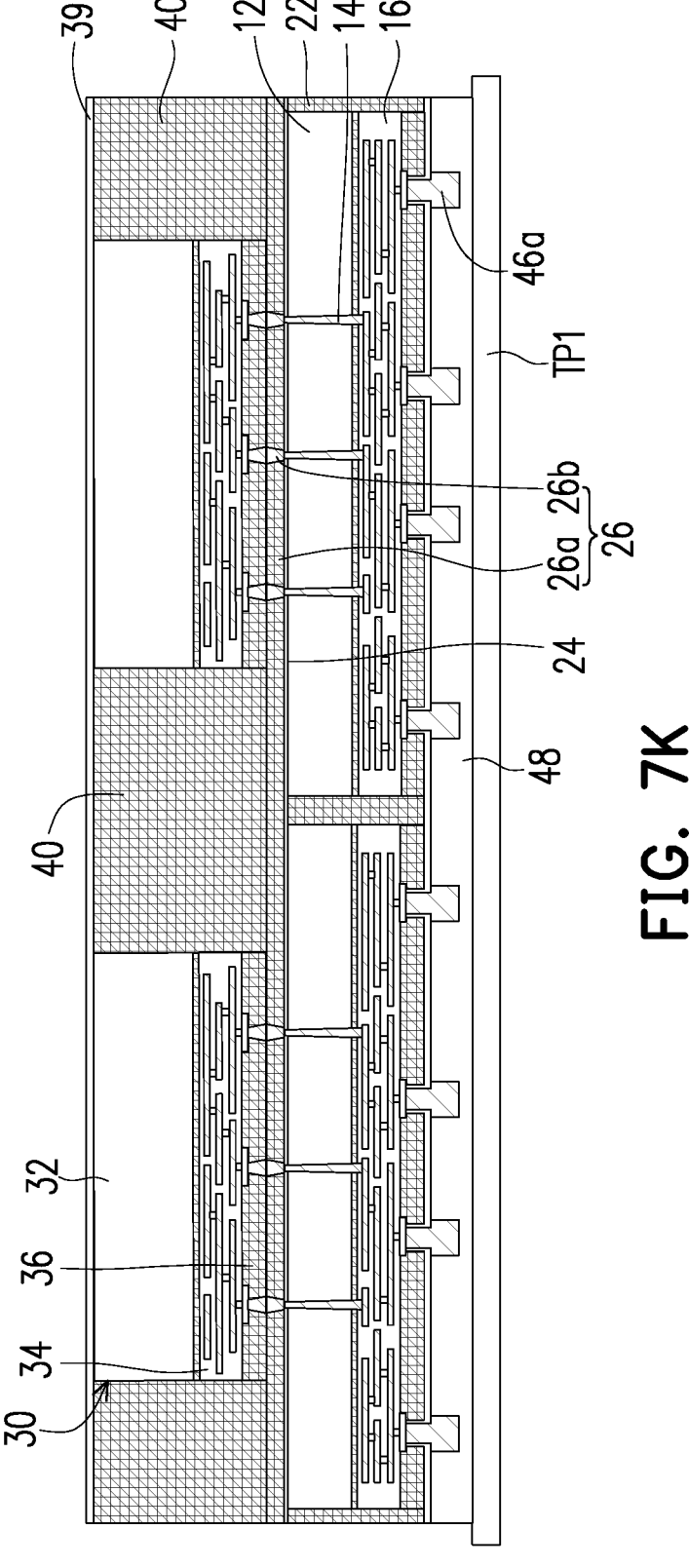
Figure 7L:
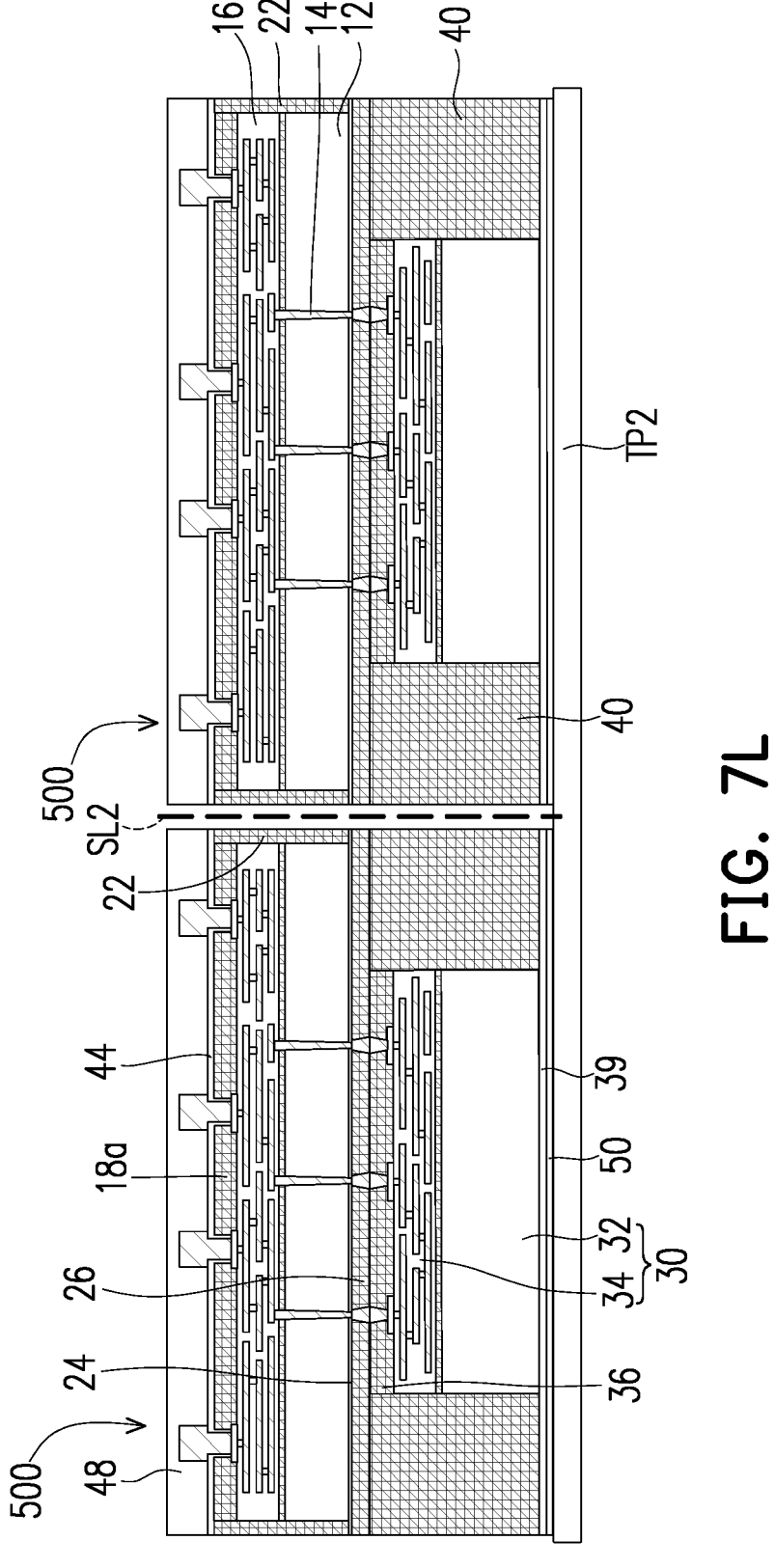

Referring to FIG. 7G, a carrier C2 including a de-bonding layer 42 formed thereon is provided. In some embodiments, the carrier C2 is a glass substrate, a ceramic carrier, or the like. The carrier C2 may have a round top-view shape and a size of a glass substrate. For example, carrier C2 may have an 8-inch diameter, a 12-inch diameter, or the like. The de-bonding layer 42 may be formed of a polymer-based material (e.g., a Light To Heat Conversion (LTHC) material), which may be subsequently removed along with the carrier C2. In some embodiments, the de-bonding layer 42 is formed of an epoxy-based thermal-release material. In other embodiments, the de-bonding layer 42 is formed of an ultra-violet (UV) glue. The de-bonding layer 42 may be dispensed as a liquid and cured. In alternative embodiments, the de-bonding layer 42 is a laminate film and is laminated onto the carrier C2. The top surface of the de-bonding layer 42 is substantially planar. A bonding process (e.g., a wafer-to-wafer bonding process) is performed to bond the resulted structure formed on the carrier C1 with the de-bonding layer 42 carried by the carrier C2. After the resulted structure formed on the carrier C1 is bonded with the de-bonding layer 42 carried by the carrier C2, the anti-arcing layers 39 is bonded with the de-bonding layer 42.

Referring to FIGS. 7H through 7L, since the processes illustrated in FIGS. 7H through 7L for fabricating SoIC structure 500 are the same as those illustrated in FIGS. 1I through 1M, detailed descriptions regarding to the processes illustrated in FIGS. 7A through 7E are thus omitted.

FIGS. 8A through 8I are cross-sectional views schematically illustrating a process flow for fabricating a PoP structure in accordance with some alternative embodiments of the present disclosure.

Referring to FIGS. 8A through 8D, since the processes illustrated in FIGS. 8A through 8D are the same as those illustrated in FIGS. 2A through 2D, detailed descriptions regarding to the processes illustrated in FIGS. 8A through 8D are thus omitted.

Figure 8A:
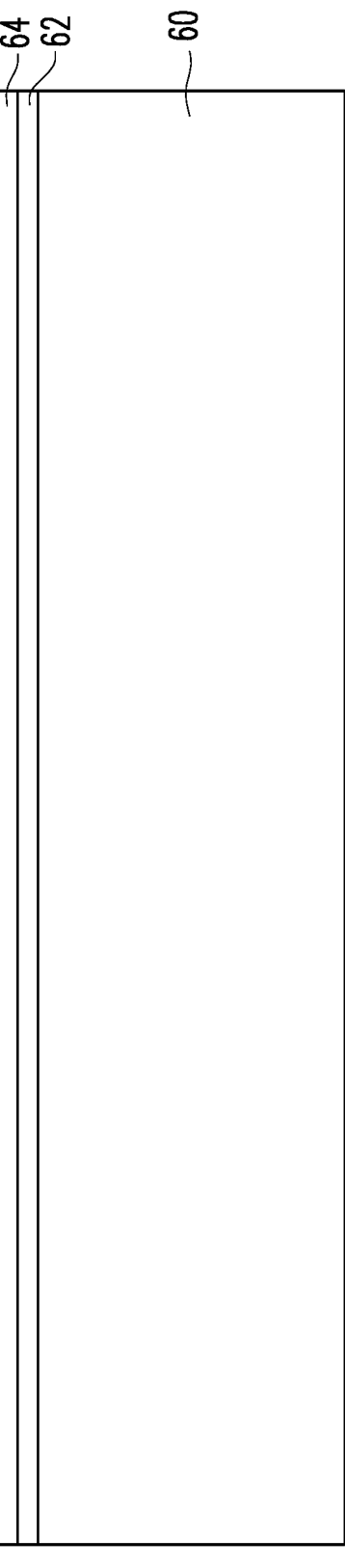
Figure 8B:
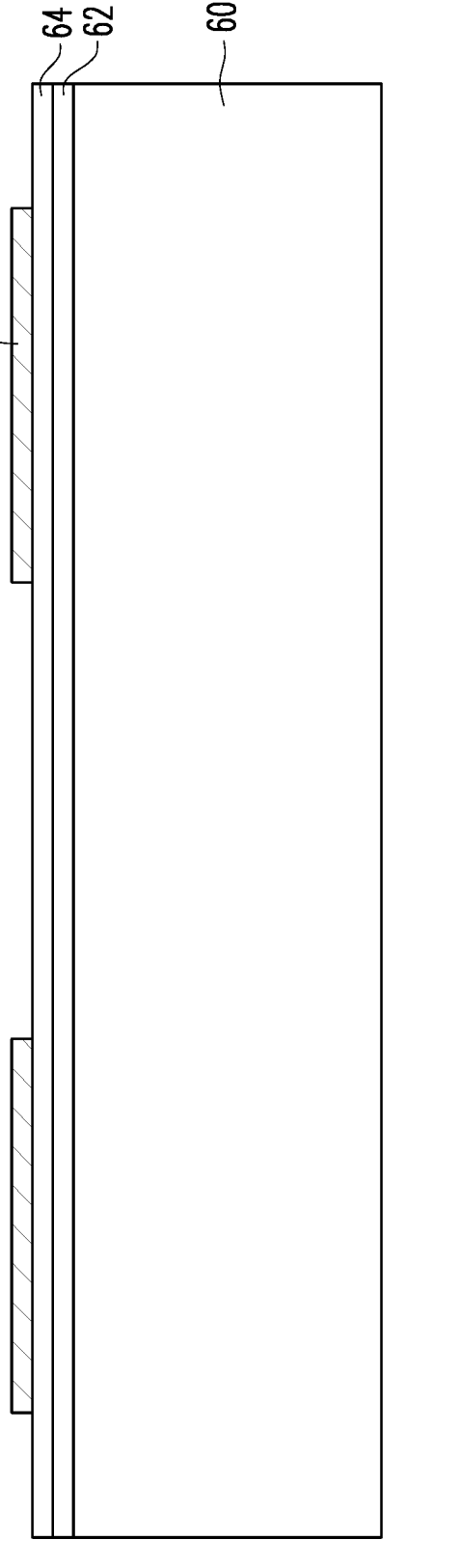
Figure 8C:
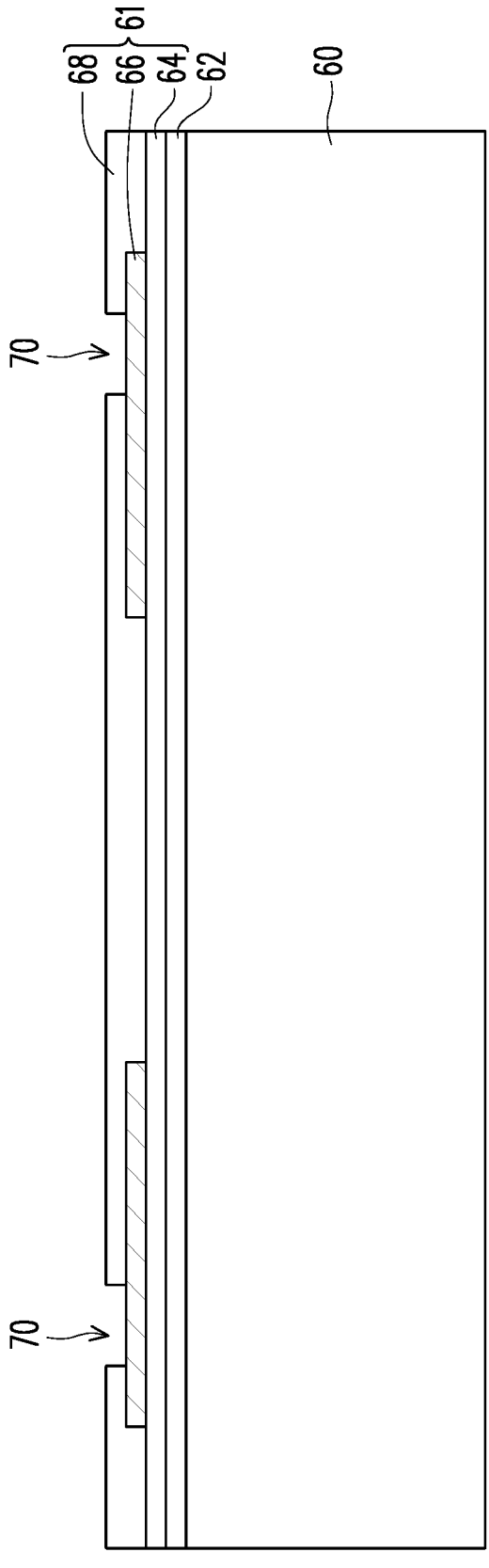
Figure 8D:
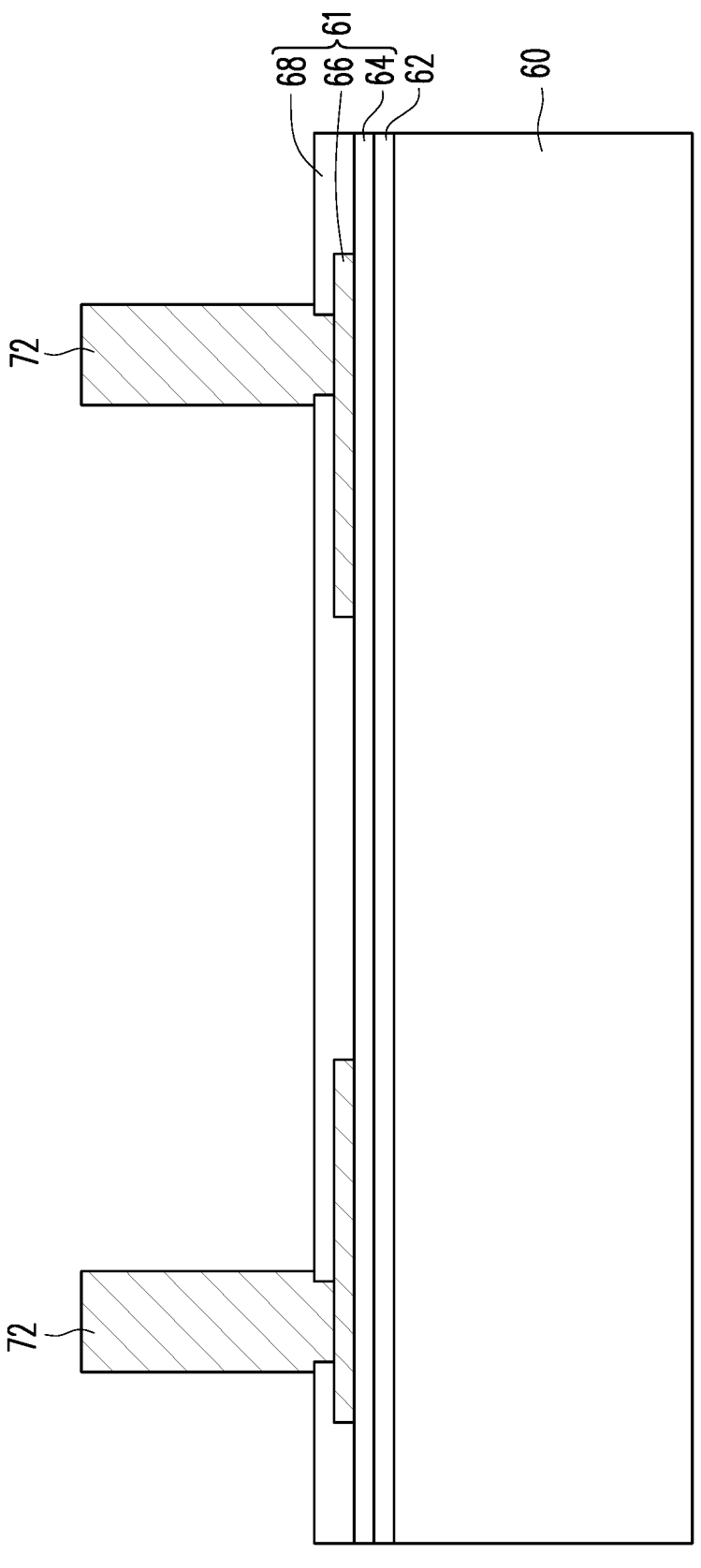
Figure 8E:
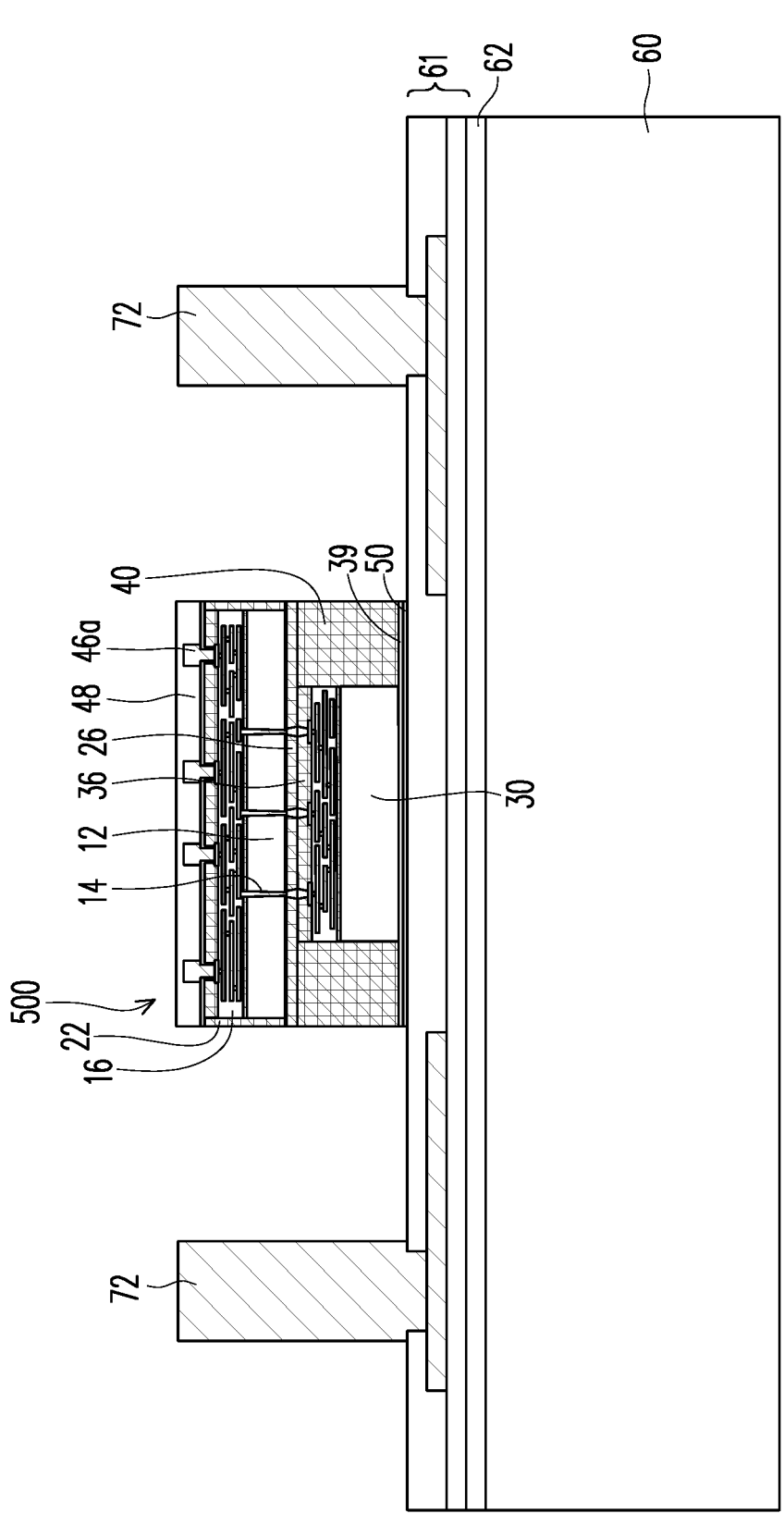
Figure 8F:
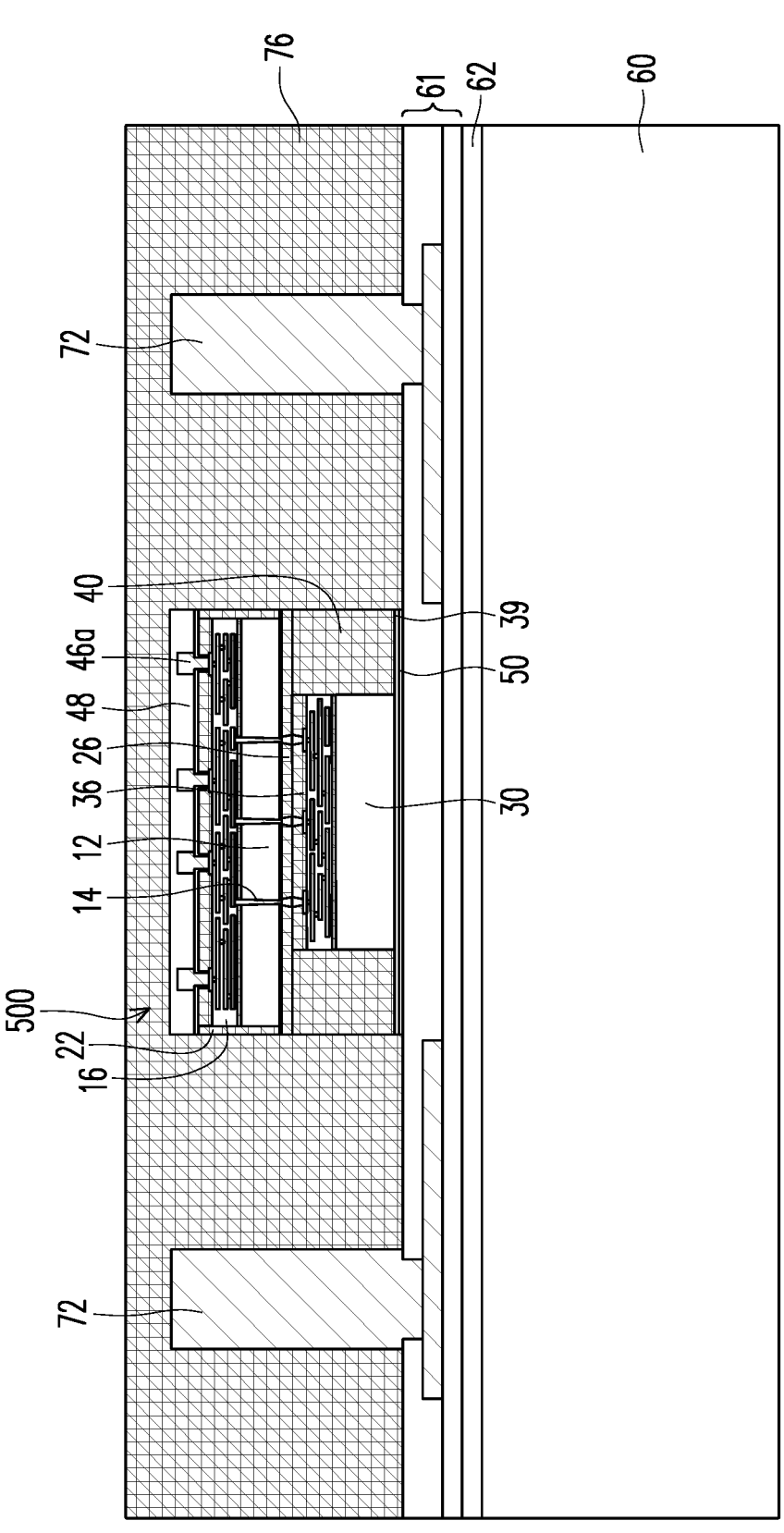
Figure 8G:
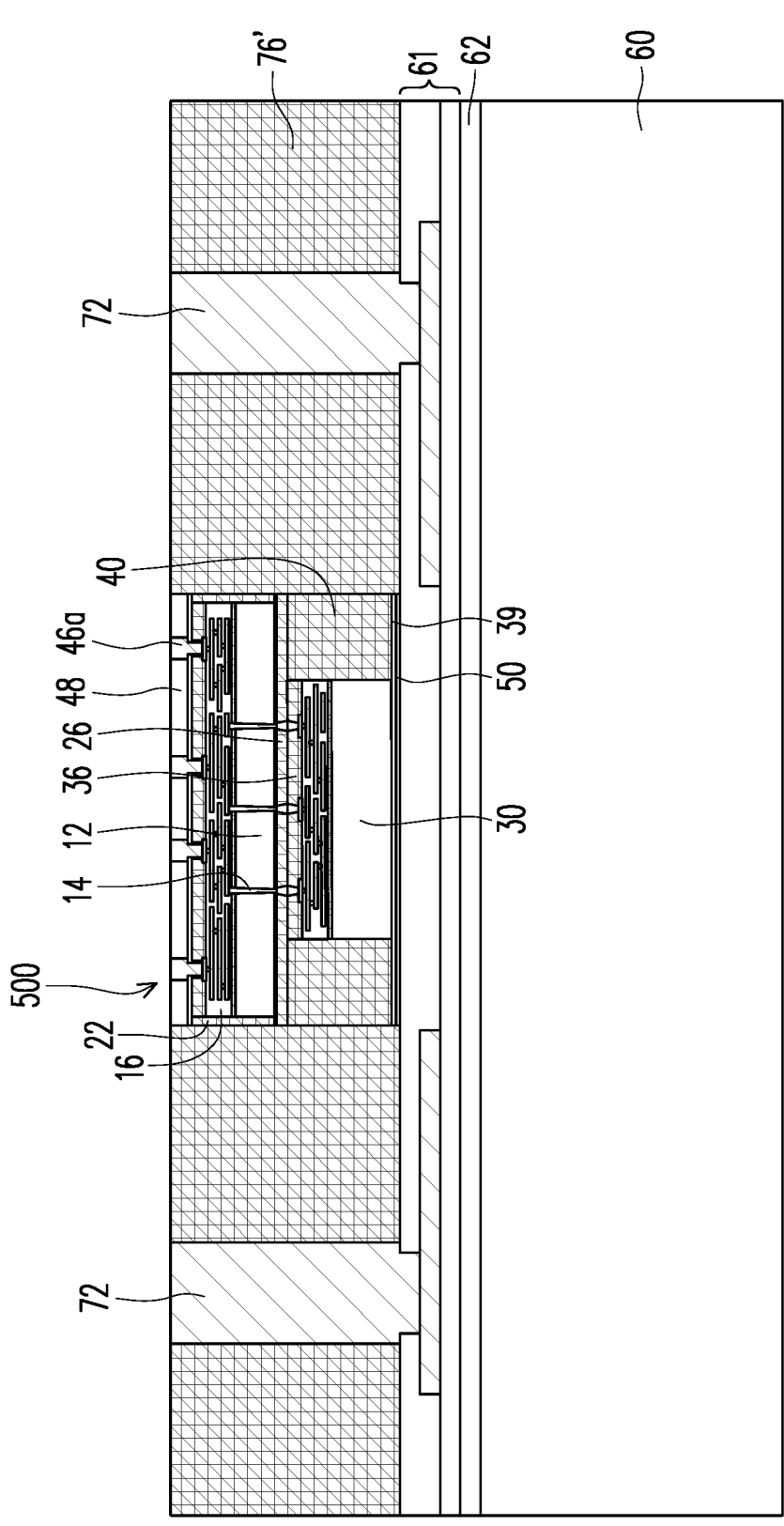
Figure 8H:
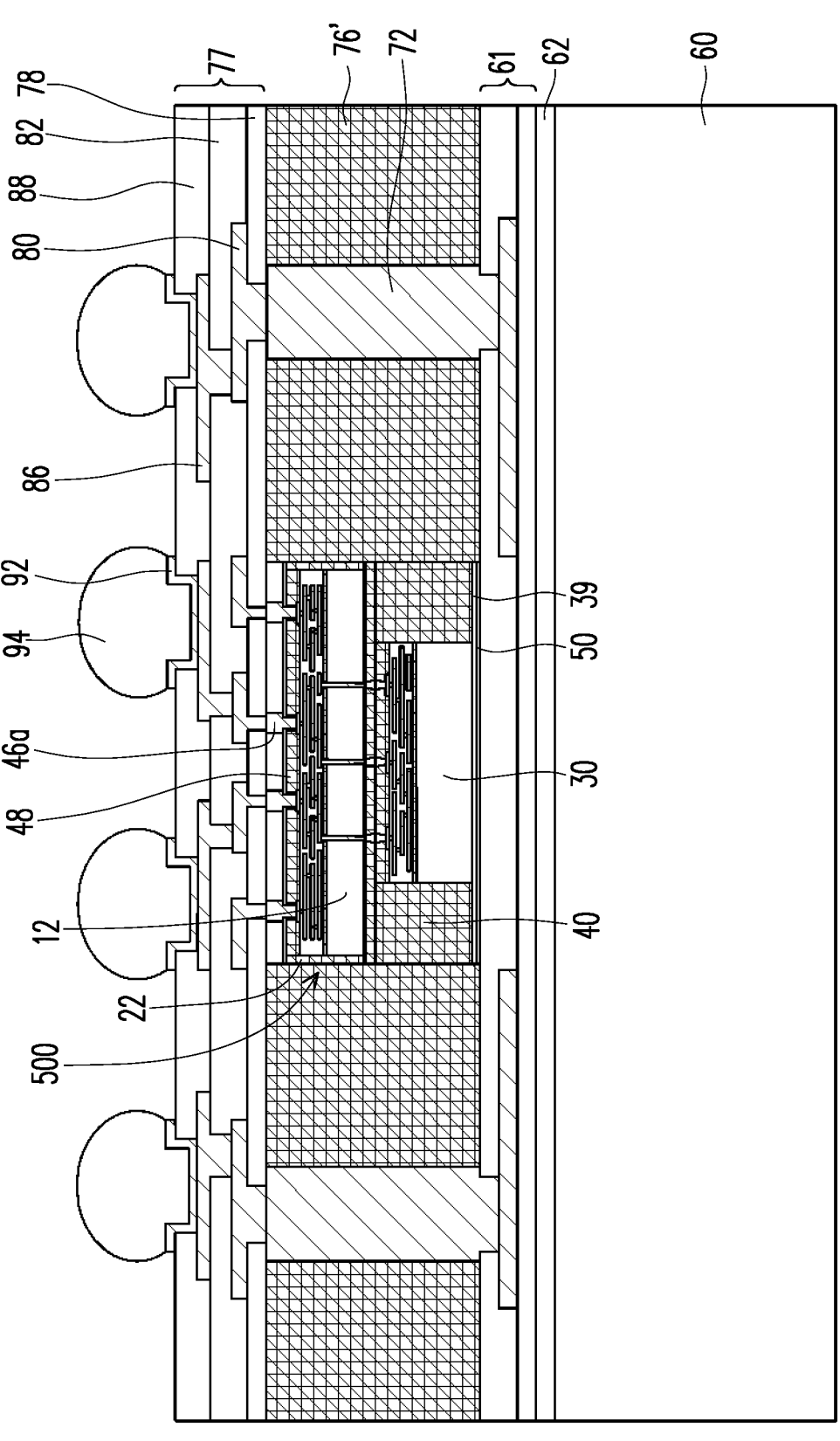
Figure 81:
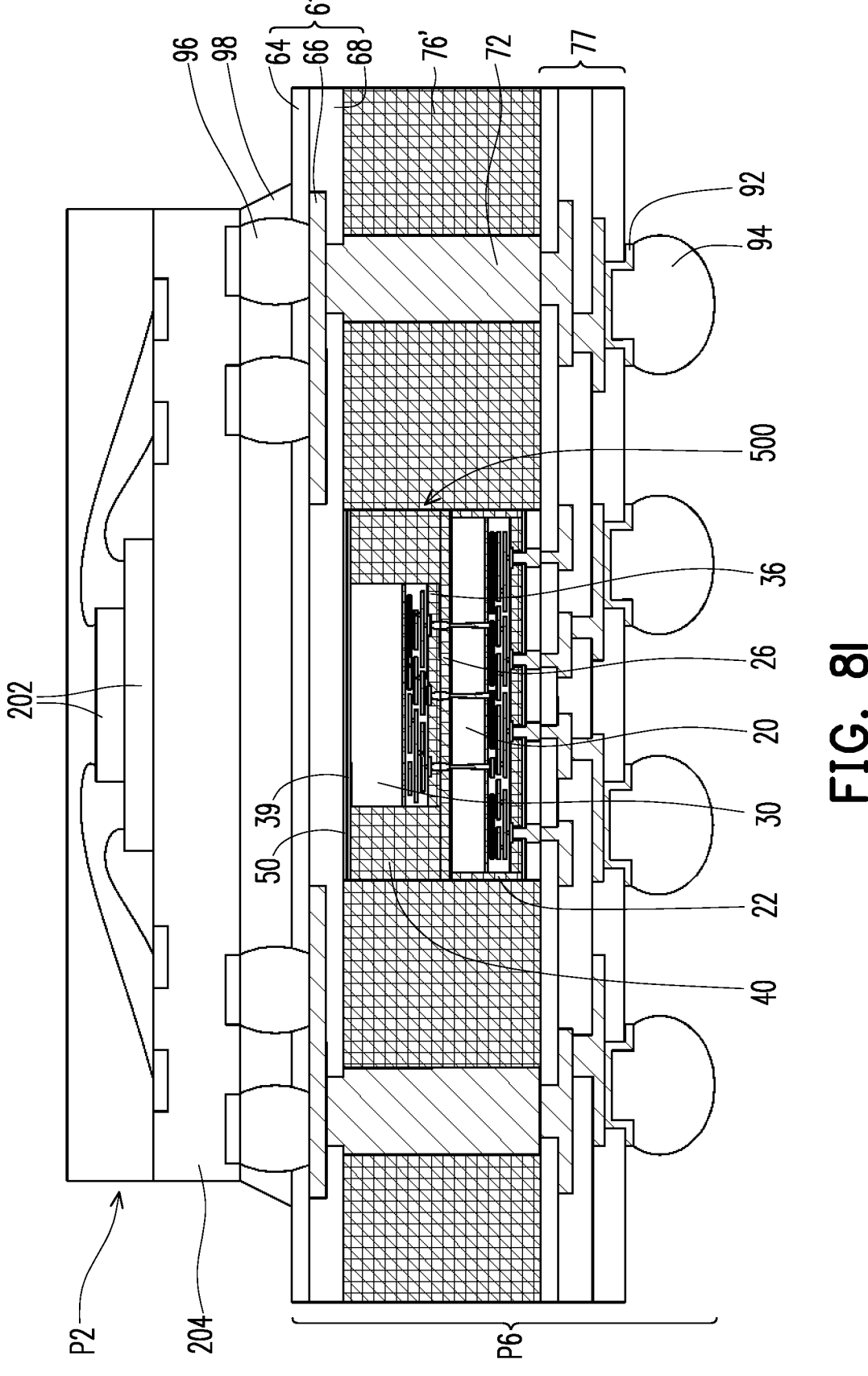

Referring FIG. 8E, after forming the conductive through vias 72, at least one SoIC structure 500 is picked-up and placed over the dielectric layer 68 of the redistribution circuit structure 61. Only a single SoIC structure 500 and its surrounding conductive through vias 72 are illustrated in FIG. 8E for illustrative purposes. It is noted, however, that the process steps shown in FIGS. 8A through 8I may be performed at wafer level, and are performed on multiple SoIC structure 500 and the conductive through vias 72 disposed over the carrier 60. As illustrated in FIG. 8E, the attachment film 50 in the SoIC structure 500 is adhered to the dielectric layer 68.

Referring to FIGS. 8F through 8I, since the processes illustrated in FIGS. 8F through 8I are the same as that illustrated in FIGS. 2F through 2I, detailed descriptions regarding to the processes illustrated in FIGS. 8F through 8I are thus omitted.

As illustrated in FIG. 8I, the integrated fanout package P6 includes an SoIC structure 500 (i.e., a device die), conductive through vias 72, an insulating encapsulant 76', a redistribution circuit structure 61 and a redistribution circuit structure 77. The SoIC structure 500 and the conductive through vias 72 are laterally encapsulated by the insulating encapsulant 76'. The redistribution circuit structure 61 and the redistribution circuit structure 77 are respectively disposed on opposite sides of the insulating encapsulant 76'. The SoIC structure 500 include a semiconductor die 20 (i.e., a bottom tier semiconductor die), an insulating encapsulant 22, a semiconductor die 30 (i.e., a top tier semiconductor die), an anti-arcing layer 39 and an insulating encapsulant 40. The semiconductor die 20 is laterally encapsulated by the insulating encapsulant 22. The insulating encapsulant 22 and the insulating encapsulant 40 are in contact with the insulating encapsulant 76' respectively. The semiconductor die 30 is stacked over and electrically connected to the semiconductor die 20. The anti-arcing layer 39 is in contact with the semiconductor die 30 and the insulating encapsulant 40. The first insulating encapsulant 40 is disposed over the semiconductor die 20 and laterally encapsulates the semiconductor die 30. In some embodiments, the integrated fanout package P6 further includes a bonding structure 26 and a bonding structure 36, the bonding structure 26 is disposed on the back surface of the semiconductor die 20, the bonding structure 36 is disposed on the front surface of the semiconductor die 30, wherein the bonding structure 26 and the bonding structure 36 are disposed between the semiconductor die 20 and the semiconductor die 30, and the semiconductor die 30 is electrically connected to the semiconductor die 20 through the bonding structure 26 and the bonding structure 36. Furthermore, the insulating encapsulant 22 and the insulating encapsulant 40 are spaced apart from each other by the bonding structure 26.

Figure 11:
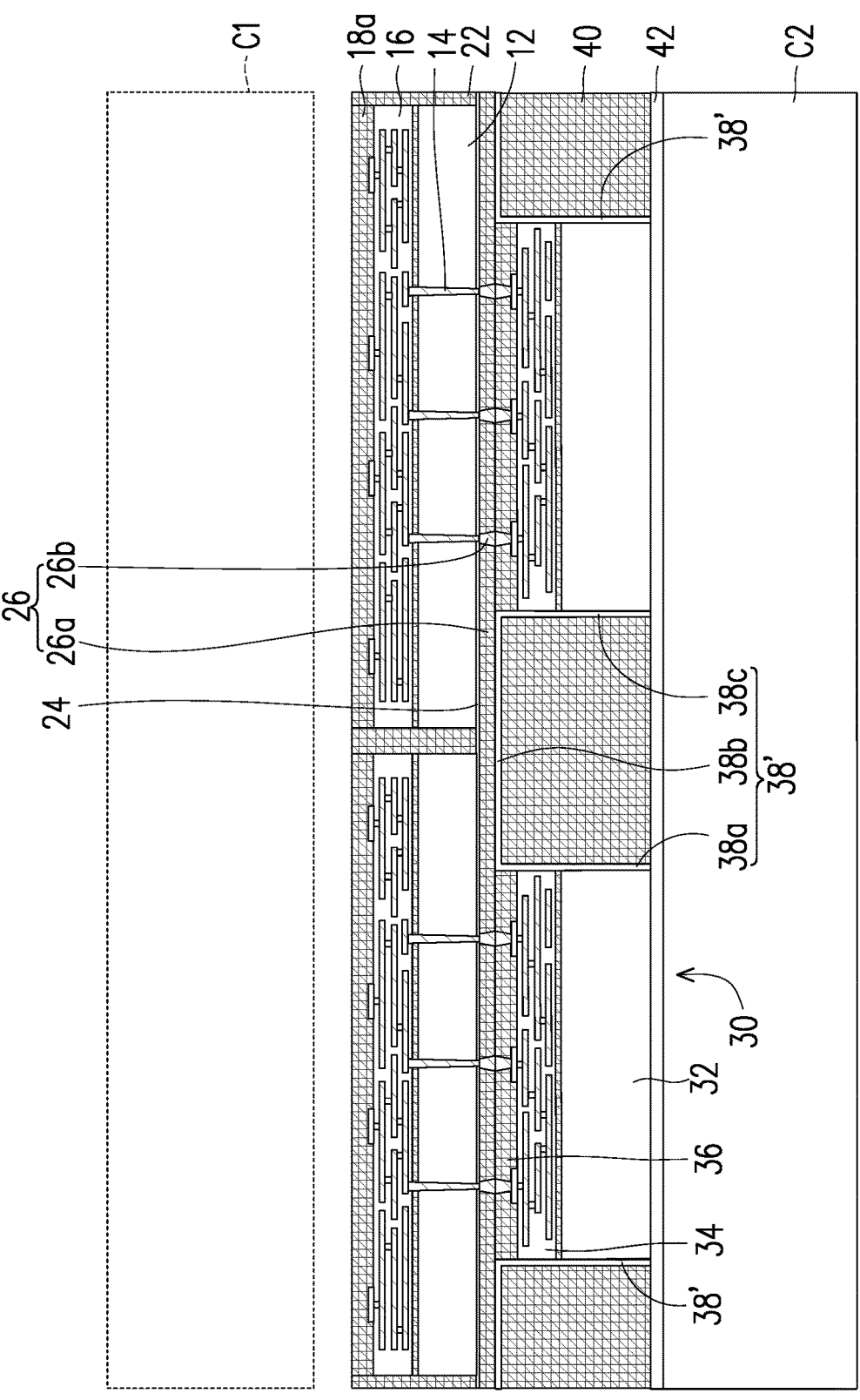
FIGS. 9 through 11 are cross-sectional views schematically illustrating various PoP structures in accordance with some embodiments of the present disclosure.
Figure 9:
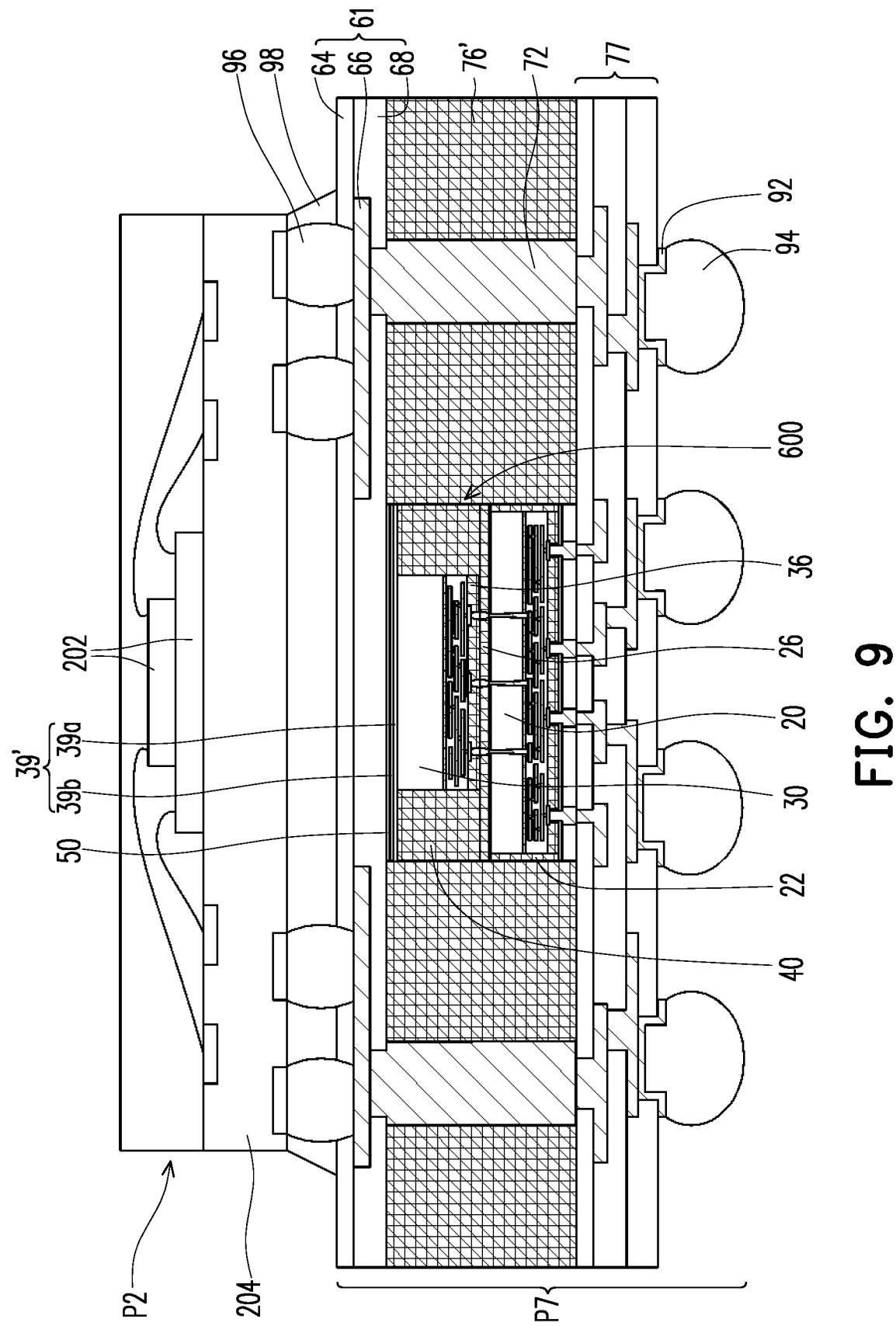
Figure 10:
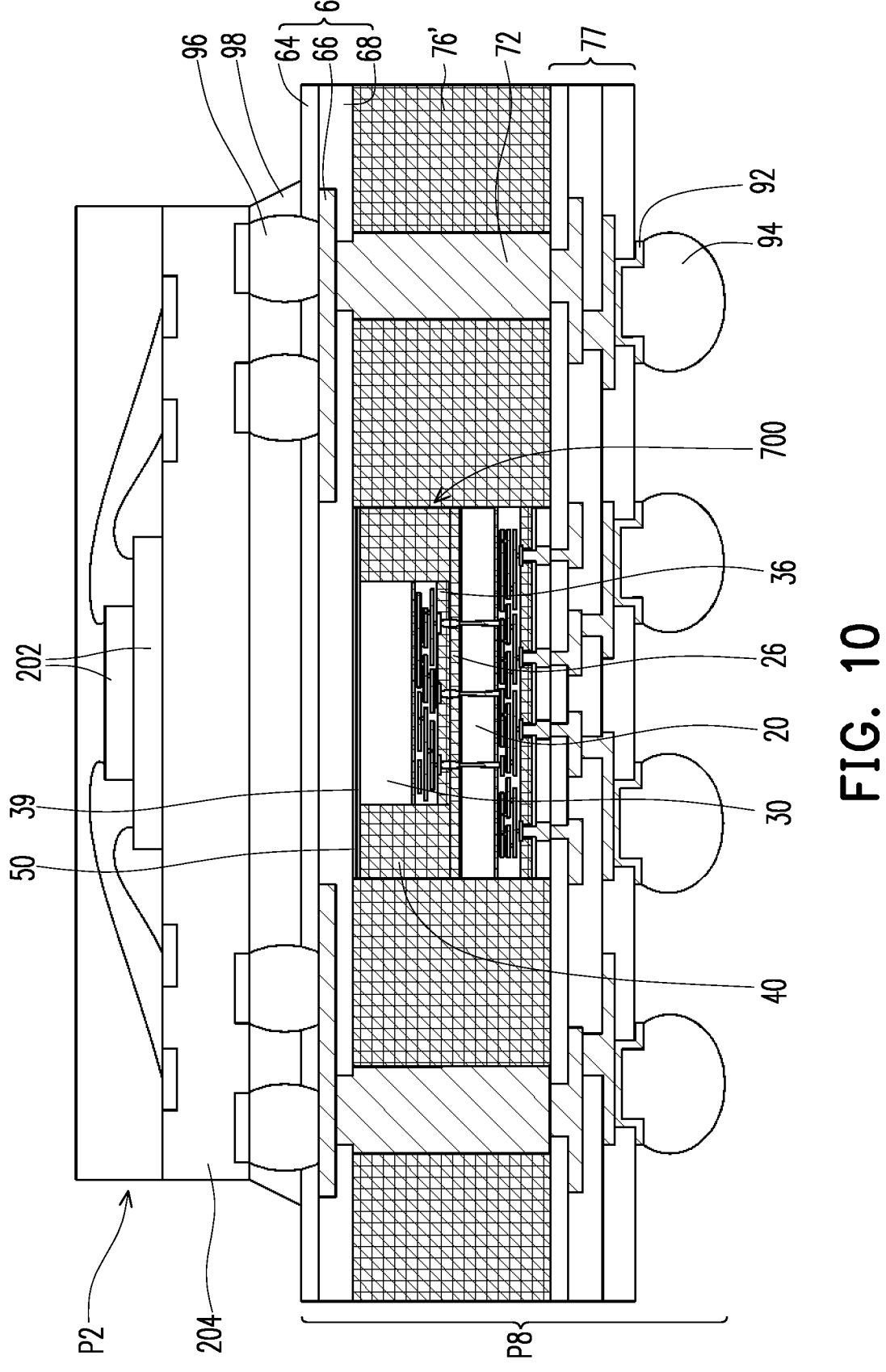
Figure 11:
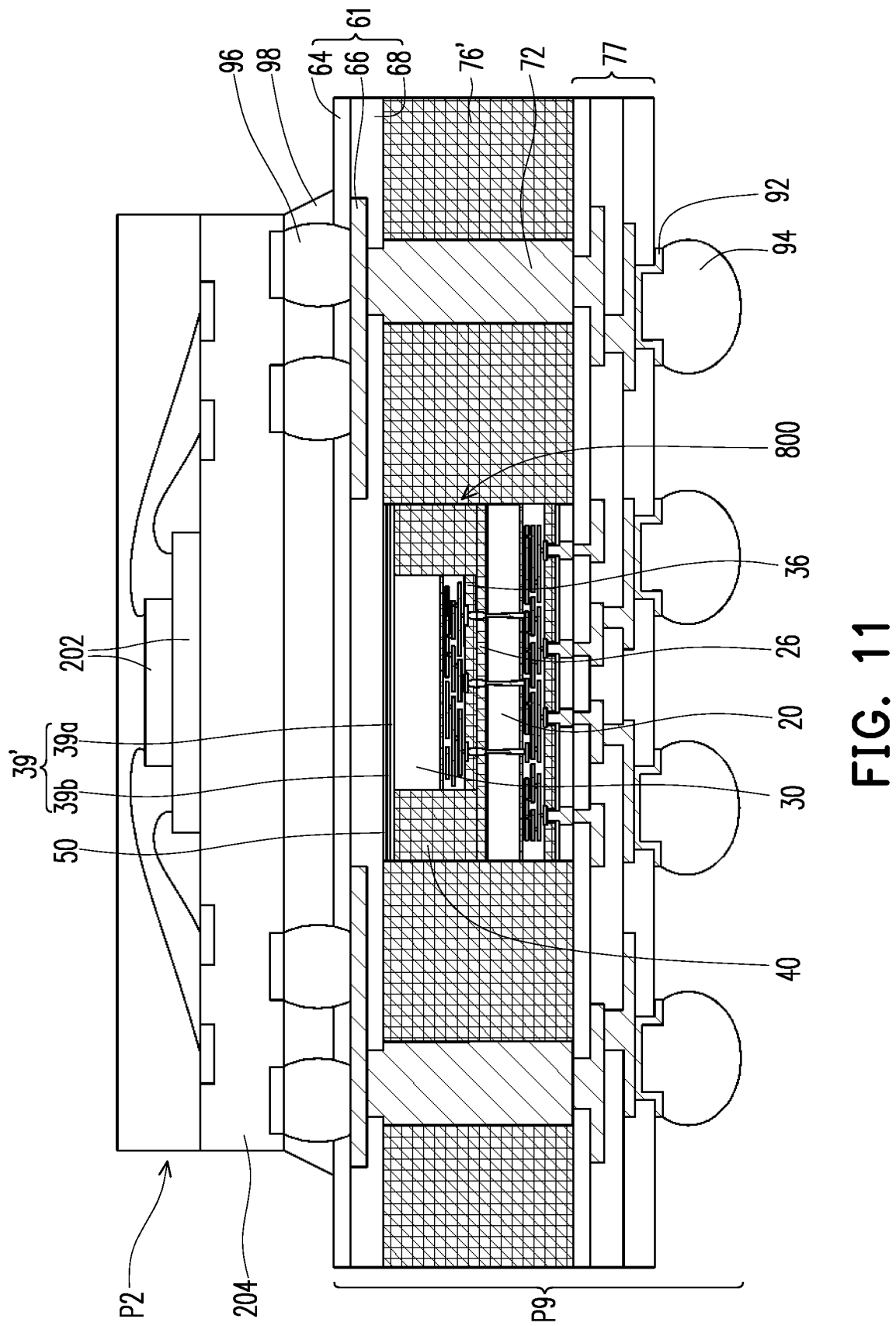

FIGS. 9 through 11 are cross-sectional views schematically illustrating various PoP structures in accordance with some embodiments of the present disclosure.

Referring to FIG. 8I and FIG. 9, the integrated fanout package structure P7 illustrated in FIG. 9 is similar with the integrated fanout package structure P6 illustrated in FIG. 8I except that the integrated fanout package structure P7 includes an SoIC structure 600 including an multi-layered anti-arcing layer 39', and the multi-layered anti-arcing layer 39' includes a metallic layer 39a in contact with the semiconductor die 30 and a dielectric 39b layer covering the metallic layer 39a. Since the SoIC structure 600 is similar to the SoIC structure 500 except for the multi-layered anti-arcing layer 39, detailed descriptions regarding to other elements (e.g., the insulating encapsulant 22, the semiconductor die 20, bonding structure 26, the semiconductor die 30, the bonding structure 36, and the insulating encapsulant 40) in the SoIC structure 600 are thus omitted.

Referring to FIG. 8I and FIG. 10, the integrated fanout package structure P8 illustrated in FIG. 10 is similar with the integrated fanout package structure P6 illustrated in FIG. 8I except that the integrated fanout package structure P8 includes an SoIC structure 700, and the semiconductor die 20 in the SoIC structure 700 is not laterally encapsulated by an insulating encapsulant. Since the SoIC structure 700 is similar to the SoIC structure 500, detailed descriptions regarding to other elements (e.g., the semiconductor die 20, bonding structure 26, the semiconductor die 30, the bonding structure 36, and the insulating encapsulant 40) in the SoIC structure 700 are thus omitted.

Referring to FIG. 9 and FIG. 1I, the integrated fanout package structure P9 illustrated in FIG. 1I is similar with the integrated fanout package structure P7 illustrated in FIG. 9 except that the integrated fanout package structure P9 includes an SoIC structure 800, and the semiconductor die 20 in the SoIC structure 800 is not laterally encapsulated by an insulating encapsulant. Since the SoIC structure 800 is similar to the SoIC structure 600, detailed descriptions regarding to other elements (e.g., the semiconductor die 20, bonding structure 26, the semiconductor die 30, the bonding structure 36, and the insulating encapsulant 40) in the SoIC structure 800 are thus omitted.

Figure 12A:
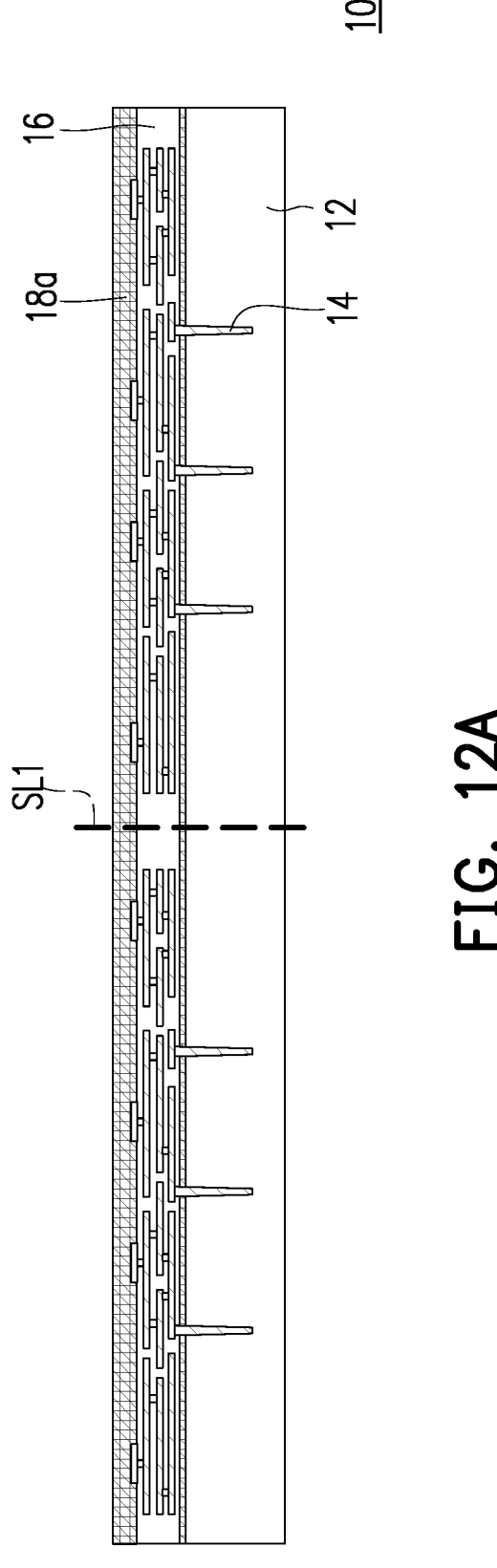
FIGS. 12A through 12N are cross-sectional views schematically illustrating a process flow for fabricating SoIC structures in accordance with some other embodiments of the present disclosure.
Figure 12B:
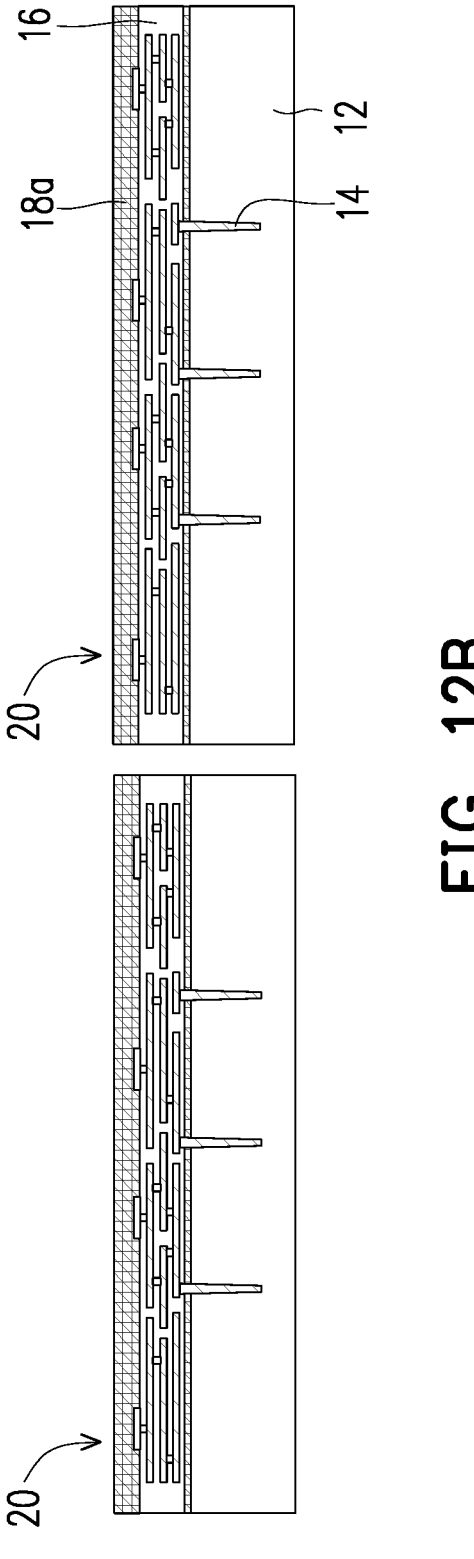
Figure 12C:
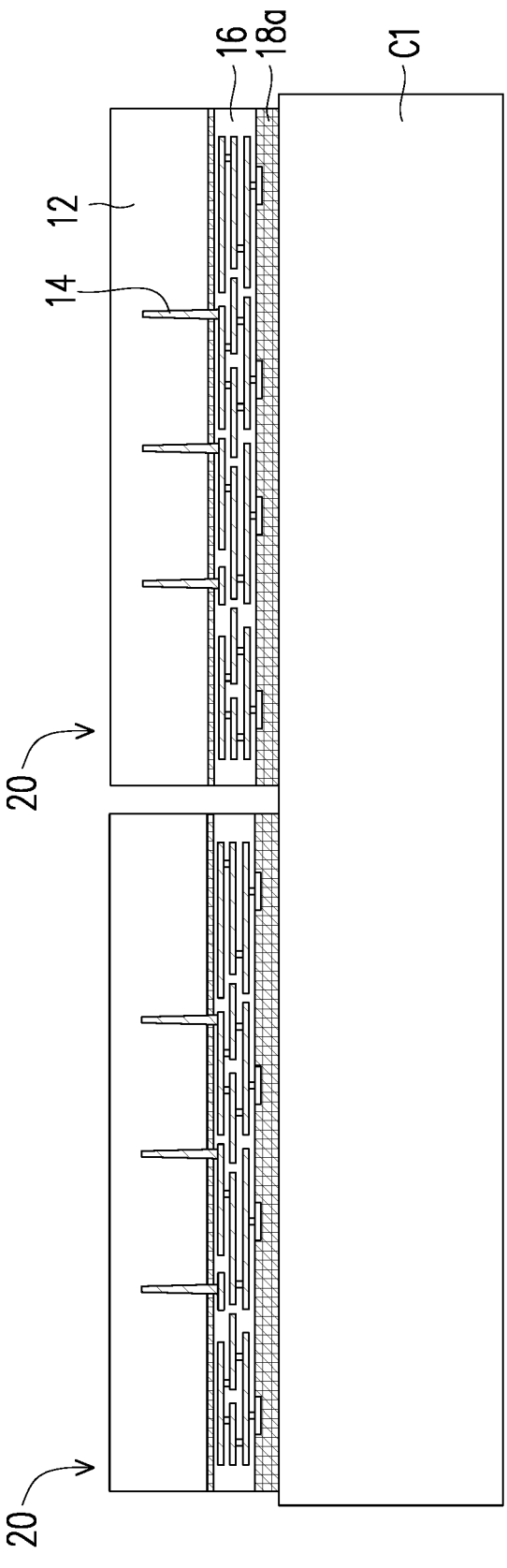
Figure 12D:
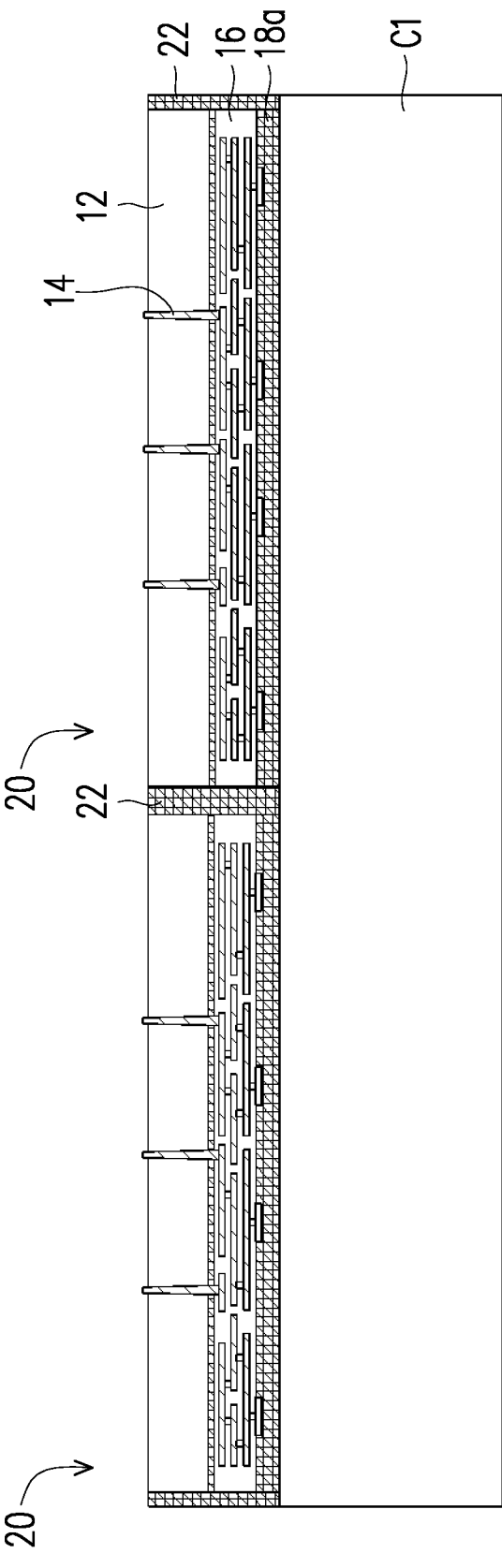
Figure 12E:
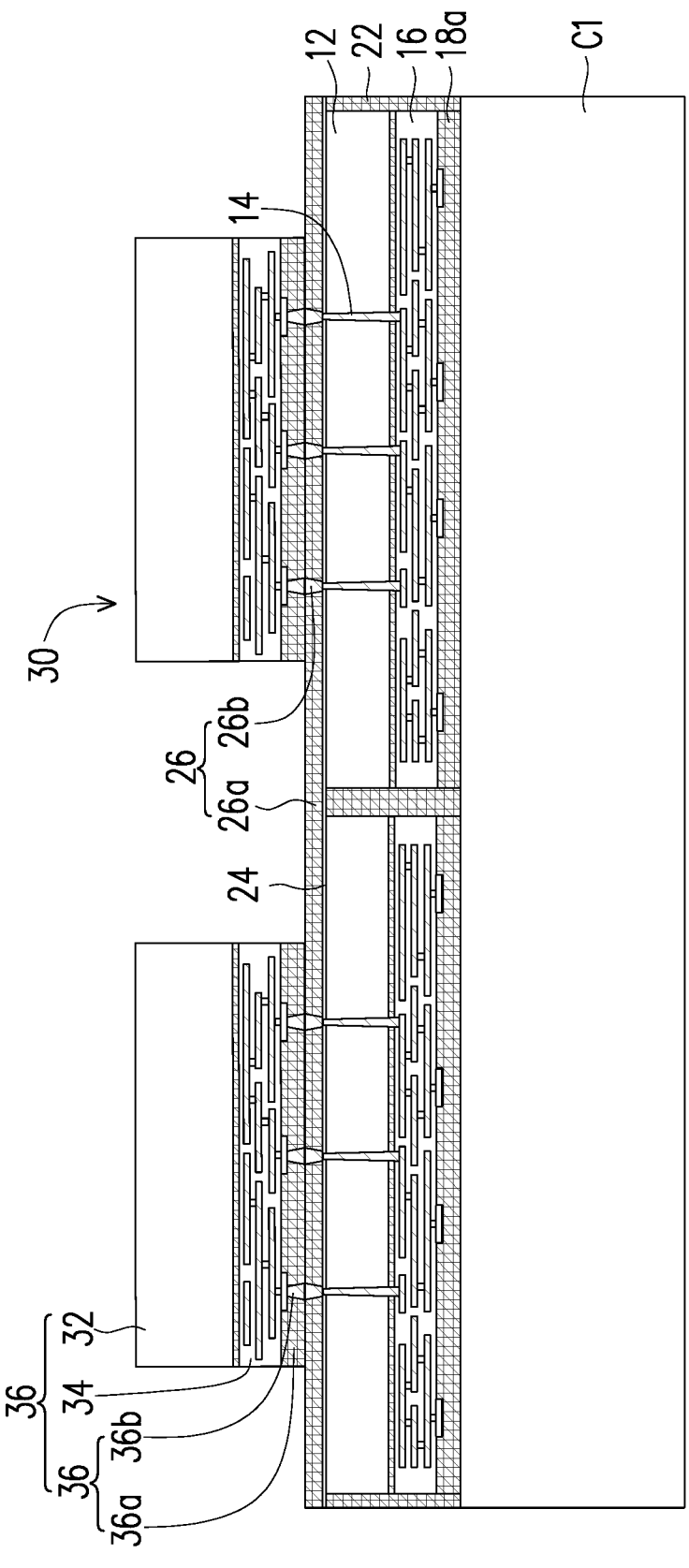
Figure 12F:
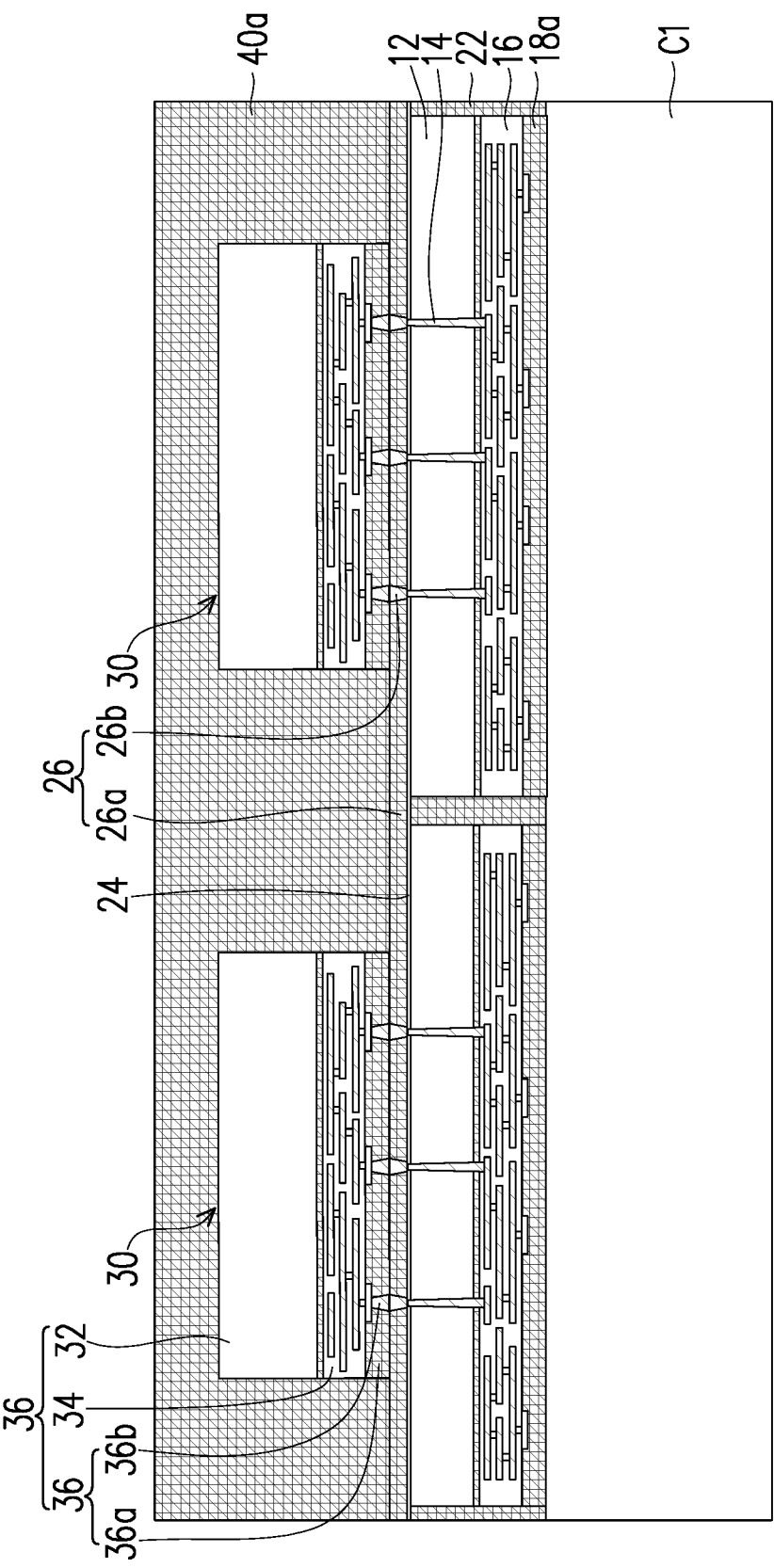
Figure 12G:
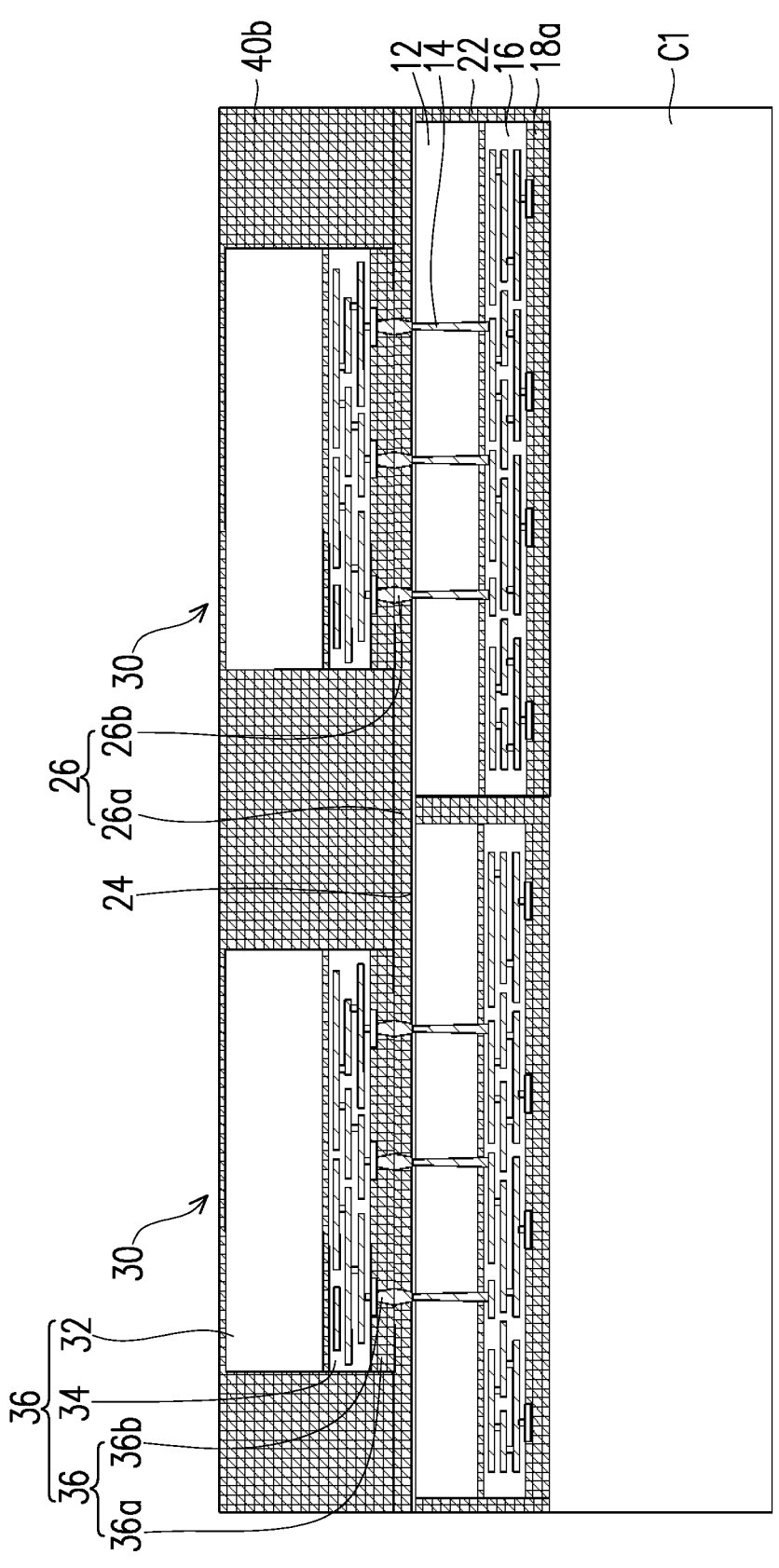
Figure 12H:
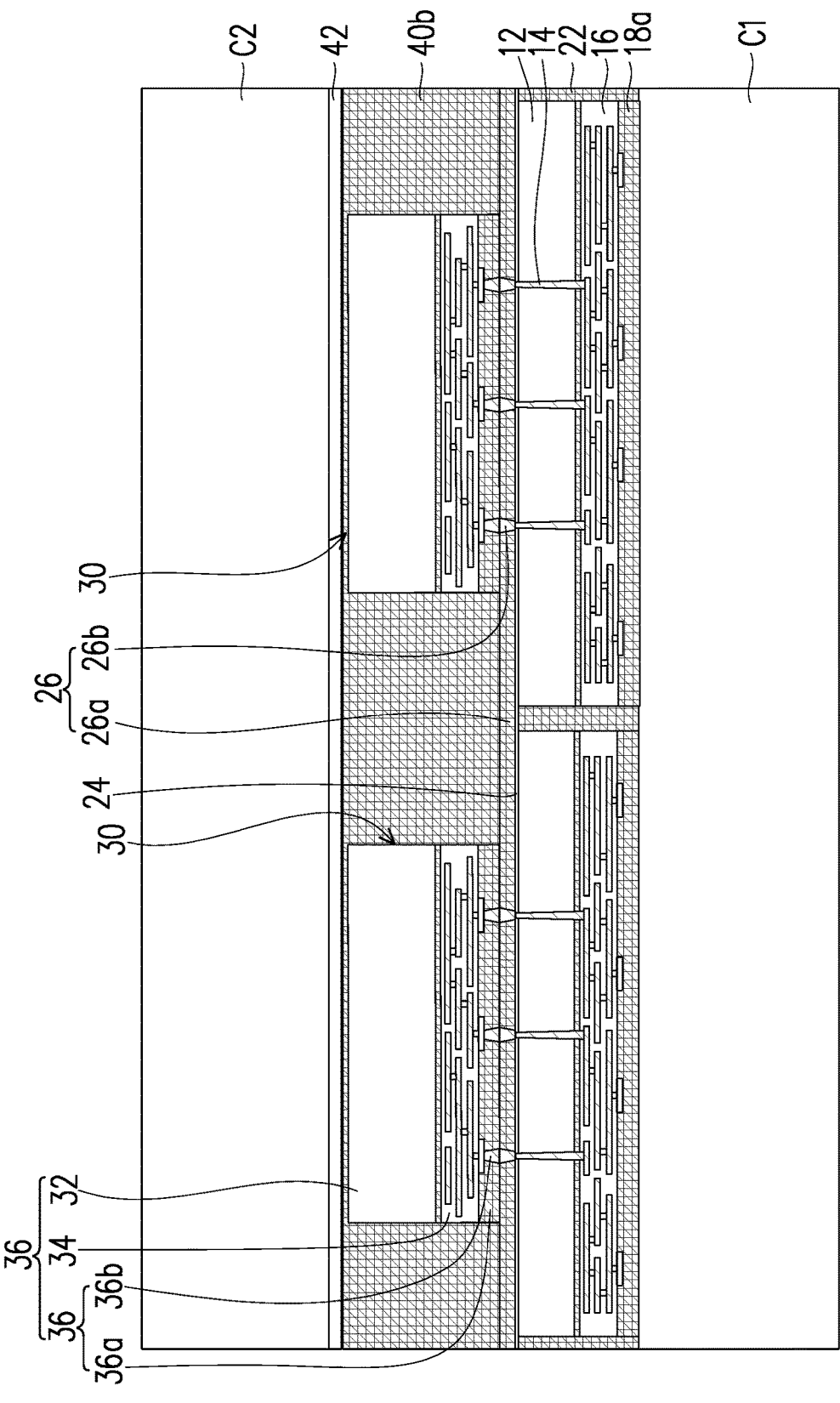
Figure 12I:
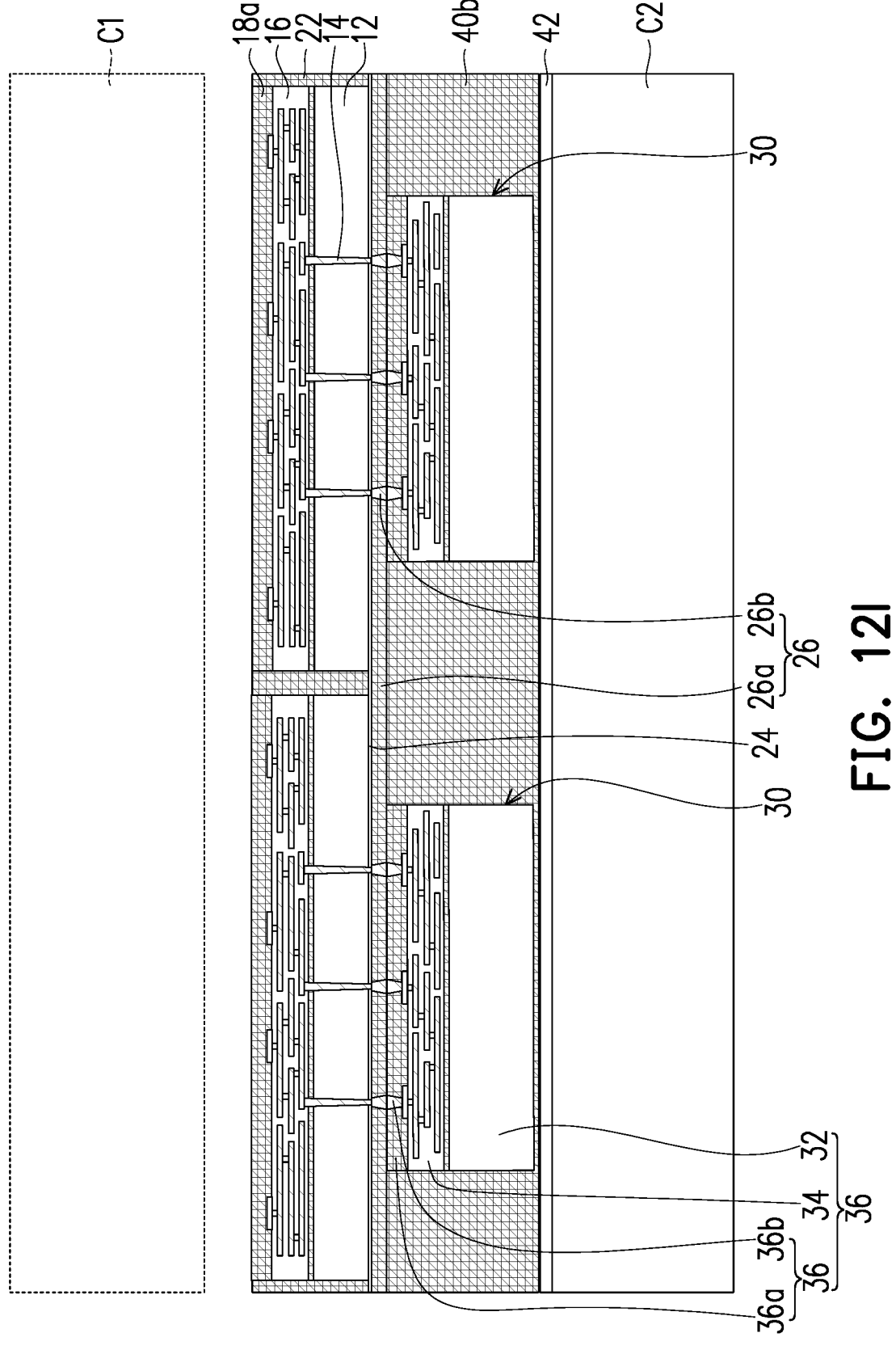
Figure 12J:
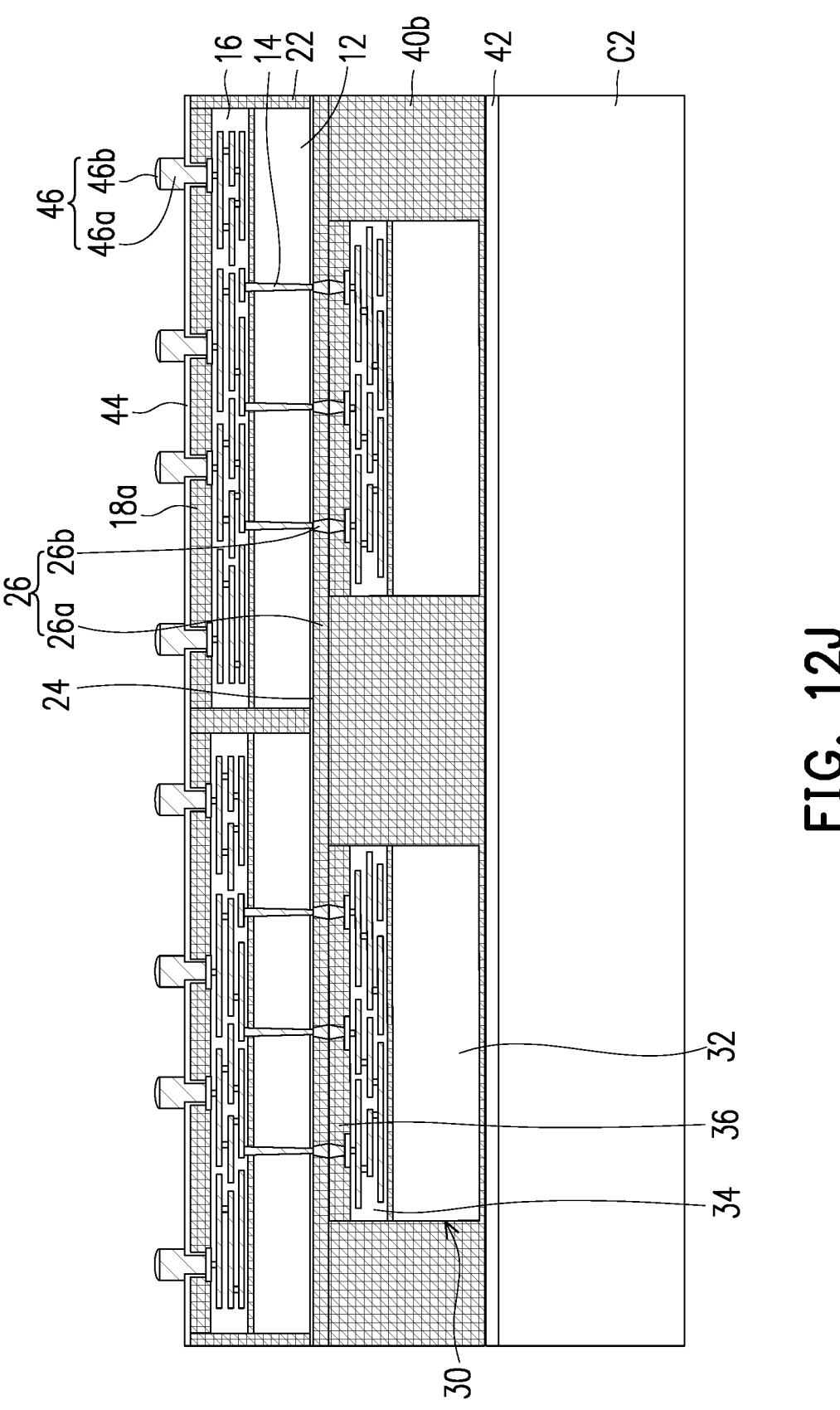
Figure 12K:
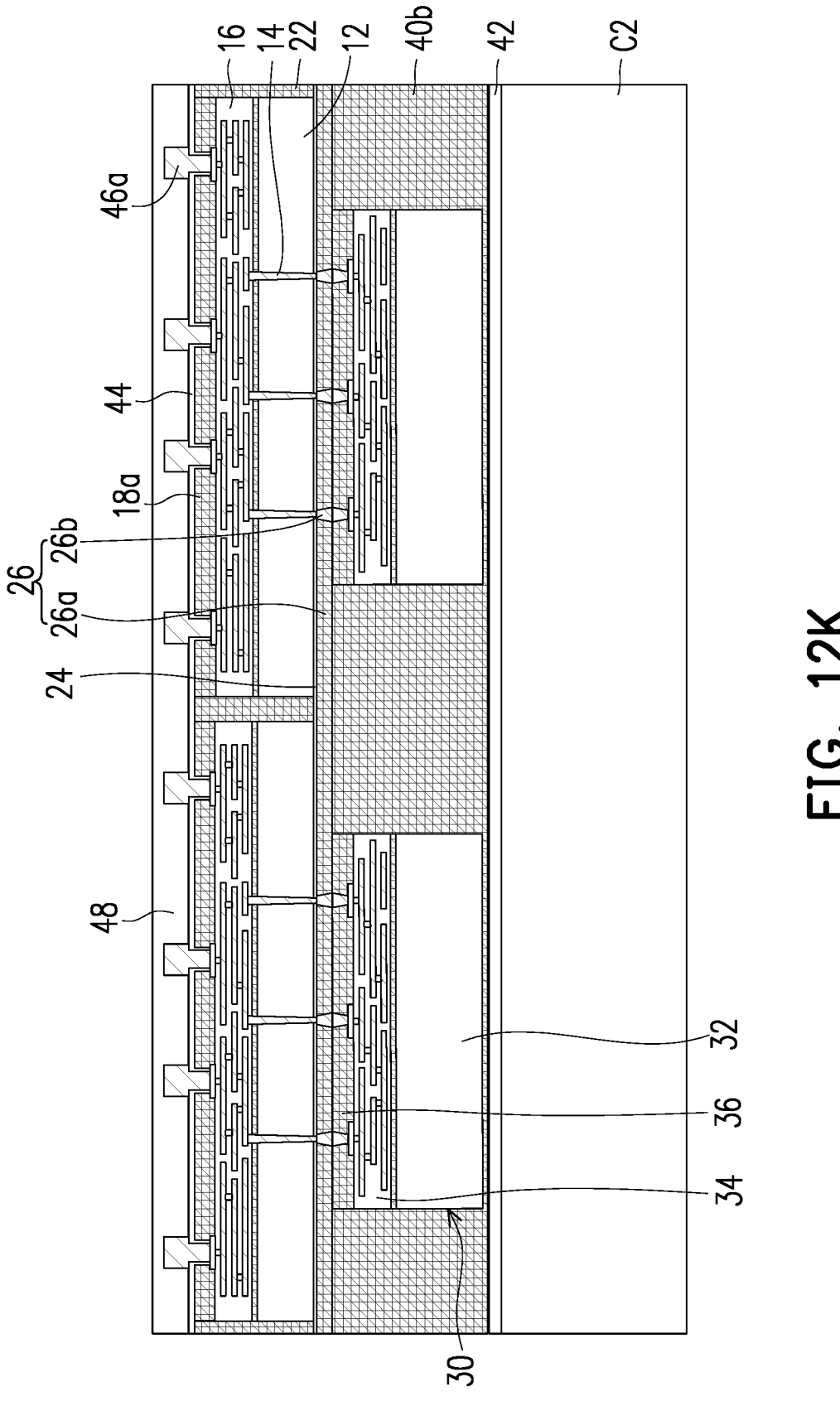
Figure 12L:
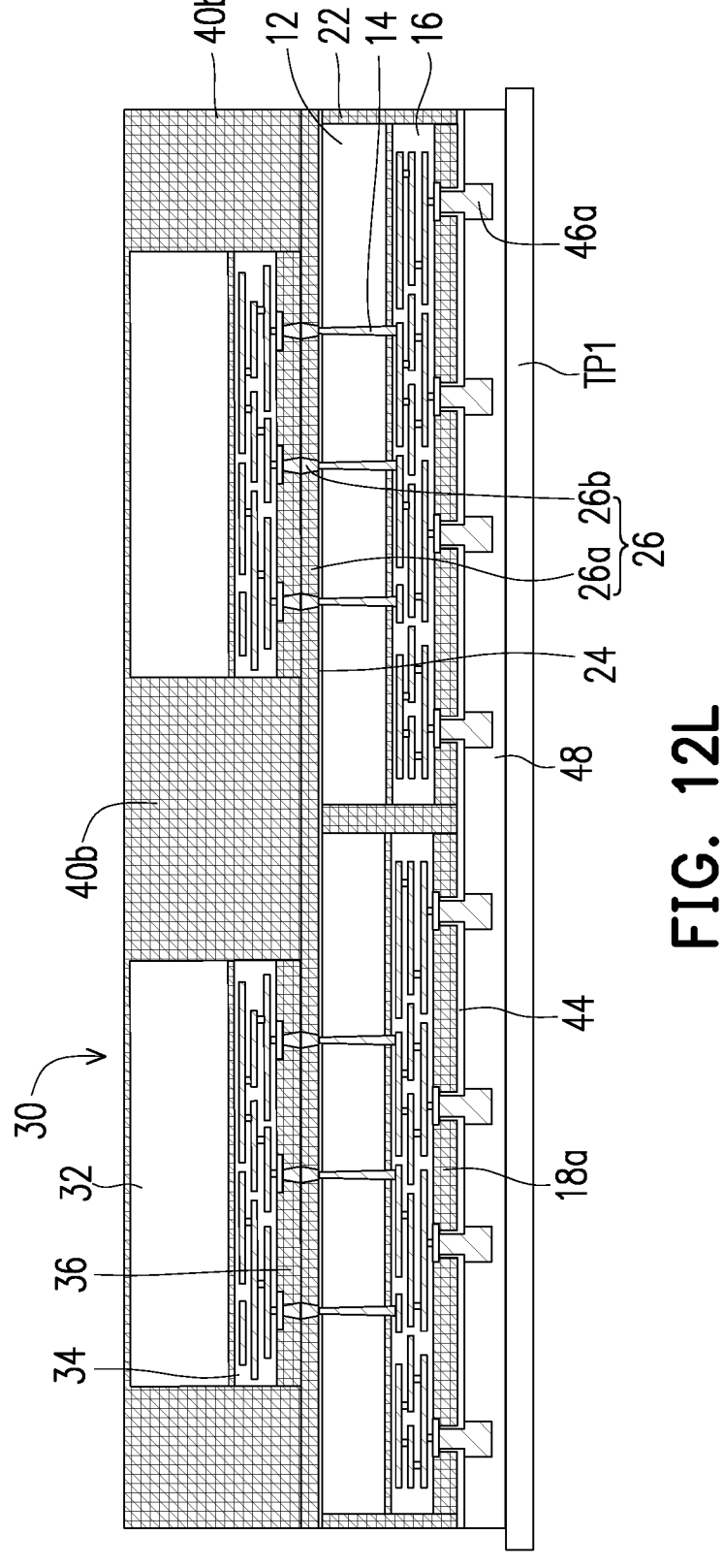
Figure 12M:
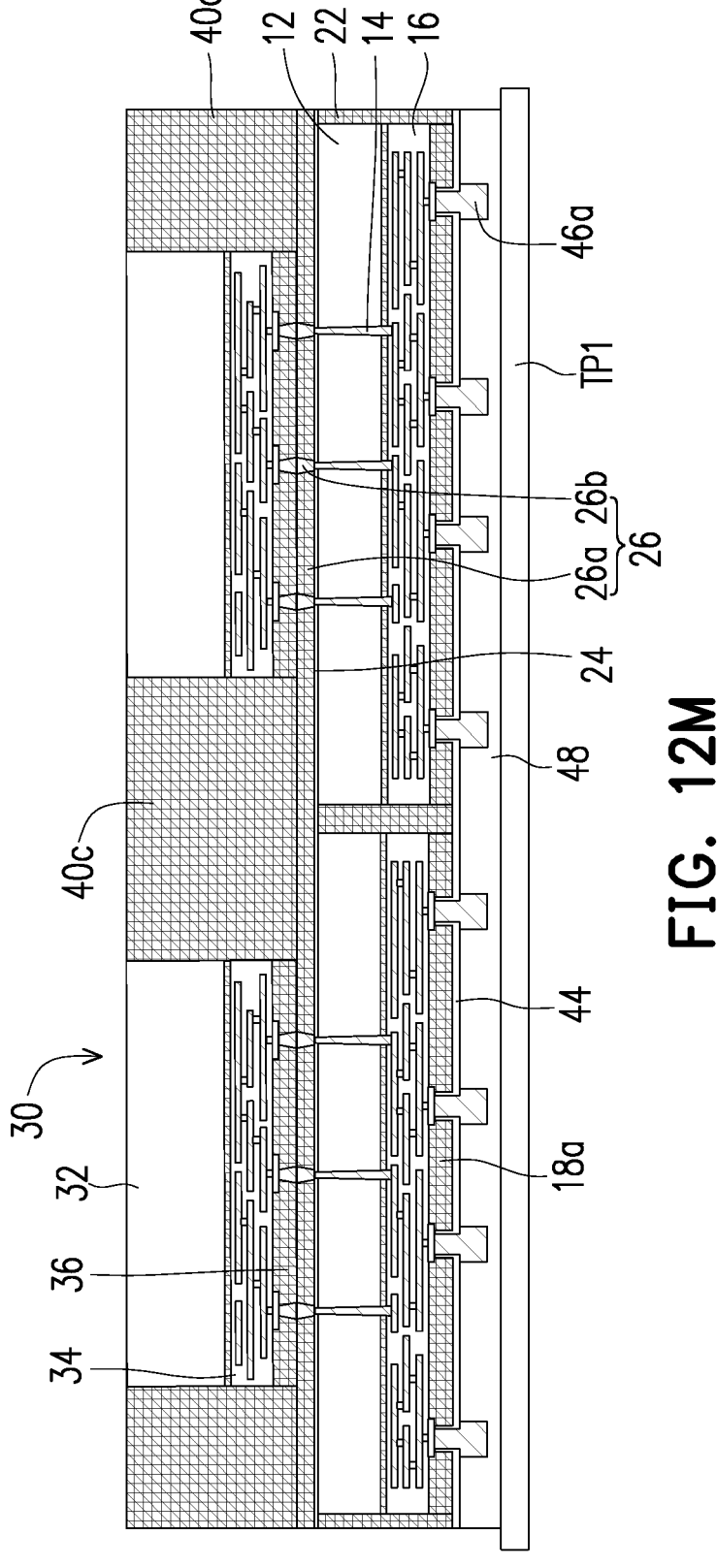
Figure 12N:
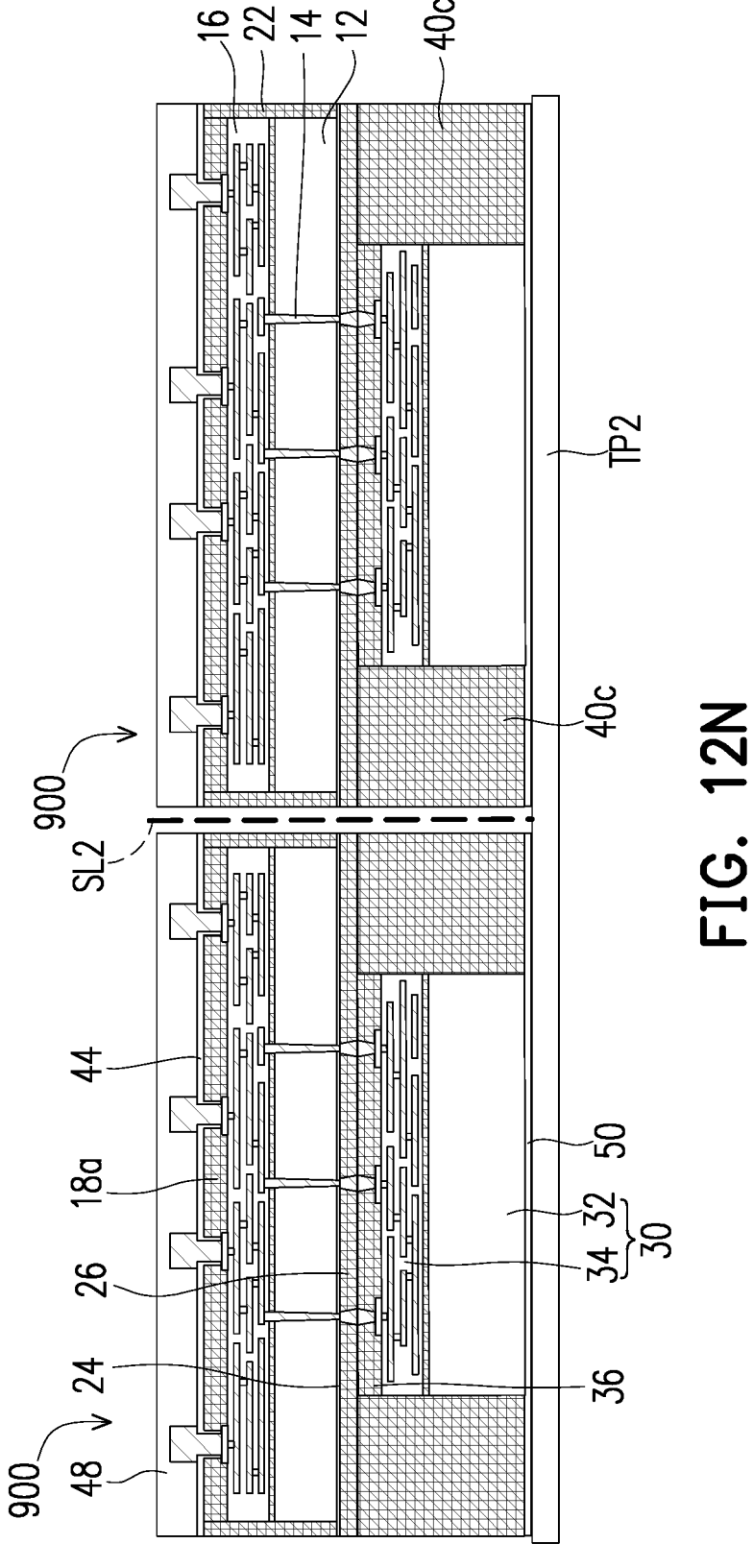

FIGS. 12A through 12N are cross-sectional views schematically illustrating a process flow for fabricating SoIC structures in accordance with some other embodiments of the present disclosure.

Referring to FIGS. 12A through 12E, since the processes illustrated in FIGS. 12A through 12E are the same as those illustrated in FIGS. 1A through 1E, detailed descriptions regarding to the processes illustrated in FIGS. 12A through 12E are thus omitted.

Referring to FIG. 12F and FIG. 12G, an insulating encapsulation material 40a is formed over the bonding structure 26 to cover the semiconductor dies 30. The insulating encapsulation material 40a may be a molding compound (e.g., epoxy or other suitable resin) formed through an over-molding process. The insulating encapsulation material 40a fills the gaps between neighboring semiconductor dies 30. After forming the insulating encapsulation material 40a over the bonding structure 26, a first thinning process is performed to partially remove the insulating encapsulation material 40a such that an insulating encapsulation material 40b is formed. The insulating encapsulation material 40a may be partially remove through a planarization process such as a Chemical Mechanical Polish (CMP) process and/or a mechanical grinding process. After performing the first thinning process, the top surface of the insulating encapsulant 40*b* is higher than back surfaces of the semiconductor dies 30. The back surfaces of the semiconductor dies 30 are not revealed at this stage.

Referring to FIG. 12H and FIG. 12I, a carrier C2 including a de-bonding layer 42 formed thereon is provided. In some embodiments, the carrier C2 is a glass substrate, a ceramic carrier, or the like. The carrier C2 may have a round top-view shape and a size of a glass substrate. For example, carrier C2 may have an 8-inch diameter, a 12-inch diameter, or the like. The de-bonding layer 42 may be formed of a polymer-based material (e.g., a Light To Heat Conversion (LTHC) material), which may be subsequently removed along with the carrier C2. In some embodiments, the de-bonding layer 42 is formed of an epoxy-based thermal-release material. In other embodiments, the de-bonding layer 42 is formed of an ultra-violet (UV) glue. The de-bonding layer 42 may be dispensed as a liquid and cured. In alternative embodiments, the de-bonding layer 42 is a laminate film and is laminated onto the carrier C2. The top surface of the de-bonding layer 42 is substantially planar. A bonding process (e.g., a wafer-to-wafer bonding process) is performed to bond the resulted structure formed on the carrier C1 with the de-bonding layer 42 carried by the carrier C2. After the resulted structure formed on the carrier C1 is bonded with the de-bonding layer 42 carried by the carrier C2, the insulating encapsulant 40*b* is bonded with the de-bonding layer 42 carried by the carrier C2.

Referring to FIG. 12J and FIG. 12K, since the processes illustrated in FIG. 12J and FIG. 12K are the same as those illustrated in FIG. 1J and FIG. 1K, detailed descriptions regarding to the processes illustrated in FIG. 12J and FIG. 12K are thus omitted.

Referring to FIG. 12L, a frame mount process is performed such that the resulted structure carried by the carrier C2 is mounted on a tape TP1 carried by a frame. After performing the frame mount process, the dielectric layer 48 is attached on the tape TP1, and a de-bonding process is then performed such that the carrier C2 is de-bonded from the semiconductor dies 30 and the insulating encapsulant 40. During the frame mount process and the de-bonding process of the carrier C2, the insulating encapsulation material 40*b* may protect the semiconductor dies 20 and 30 from being damaged by ESD.

Referring to FIG. 12M, a second thinning process is performed to partially remove the insulating encapsulation material 40*b* until the back surfaces of the semiconductor dies 30 are revealed. After performing the second thinning process, an insulating encapsulant 40*c* laterally encapsulating semiconductor dies 30 is formed. The insulating encapsulation material 40*b* may be partially remove through a planarization process such as a Chemical Mechanical Polish (CMP) process and/or a mechanical grinding process. After performing the above-mentioned second thinning process, the top surface of the insulating encapsulant 40*c* is substantially level with the back surfaces of the semiconductor dies 30. The back surfaces of the semiconductor dies 30 are revealed at this stage.

Referring to FIG. 12N, since the process illustrated in FIG. 12N for fabricating SoIC structure 900 is the same as that illustrated in FIG. 1M, detailed descriptions regarding to the process illustrated in FIG. 12N are thus omitted.

FIGS. 13A through 13I are cross-sectional views schematically illustrating a process flow for fabricating a PoP structure in accordance with some alternative embodiments of the present disclosure.

Referring to FIGS. 13A through 13D, since the processes illustrated in FIGS. 13A through 13D are the same as those illustrated in FIGS. 2A through 2D, detailed descriptions regarding to the processes illustrated in FIGS. 13A through 13D are thus omitted.

Figure 13A:
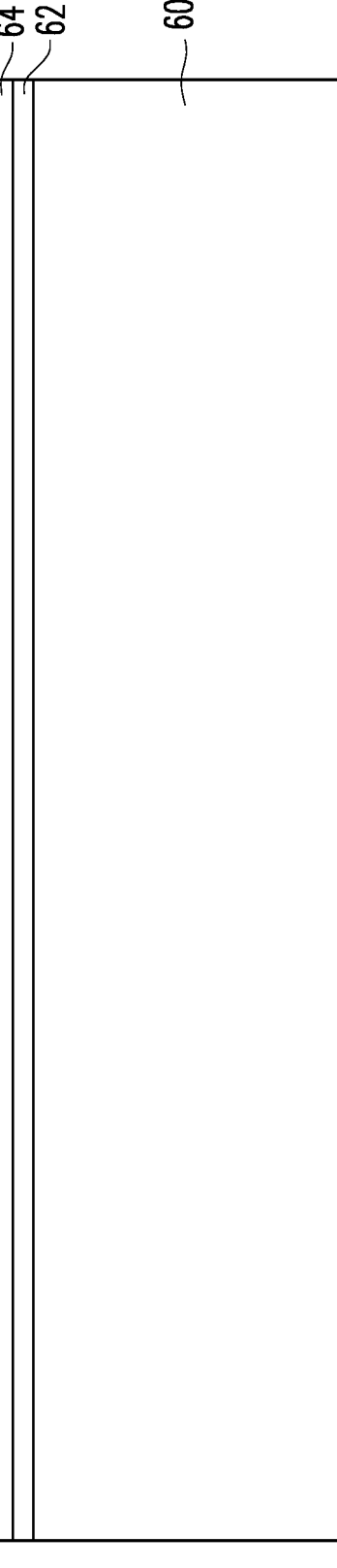
FIGS. 13A through 13I are cross-sectional views schematically illustrating a process flow for fabricating a PoP structure in accordance with some alternative embodiments of the present disclosure.
Figure 13B:
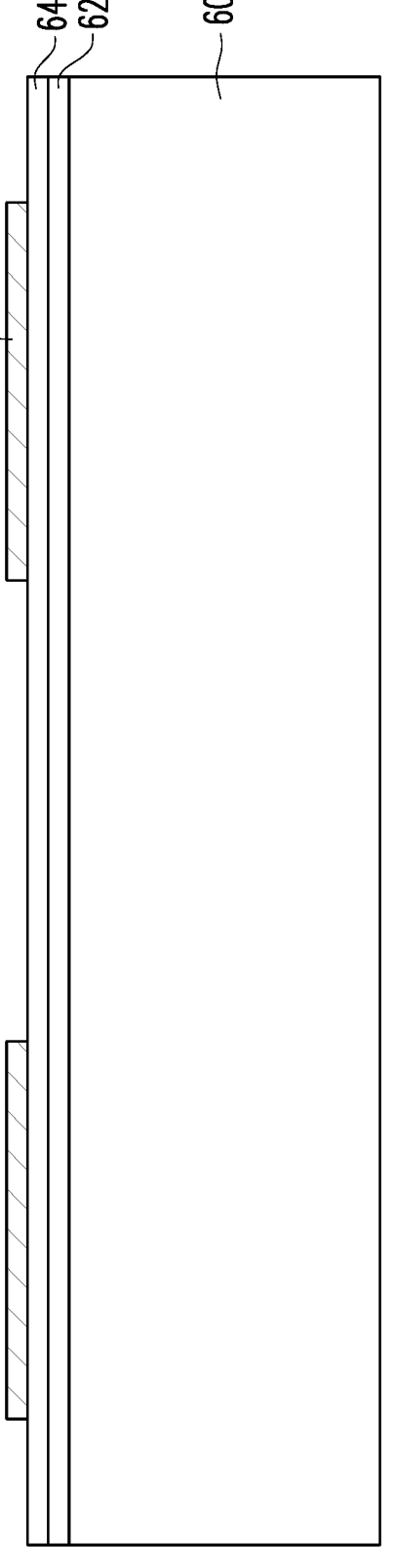
Figure 13C:
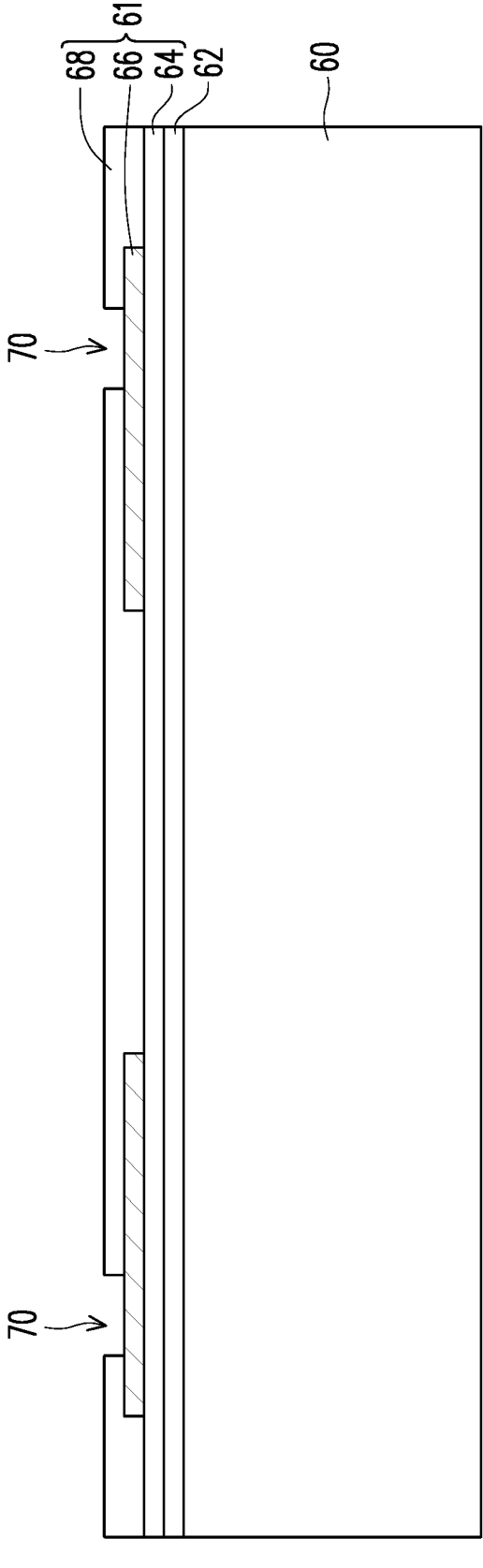
Figure 13D:
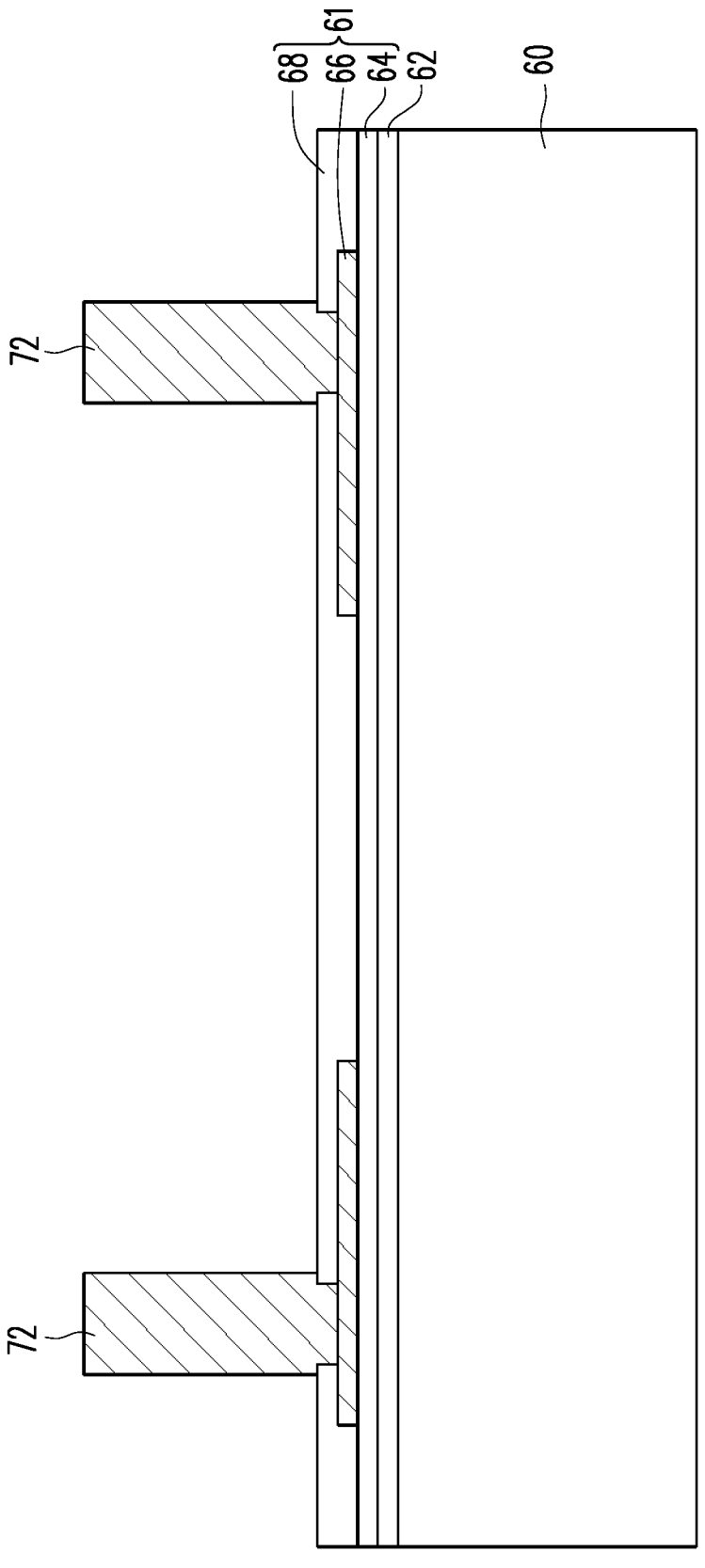
Figure 13E:
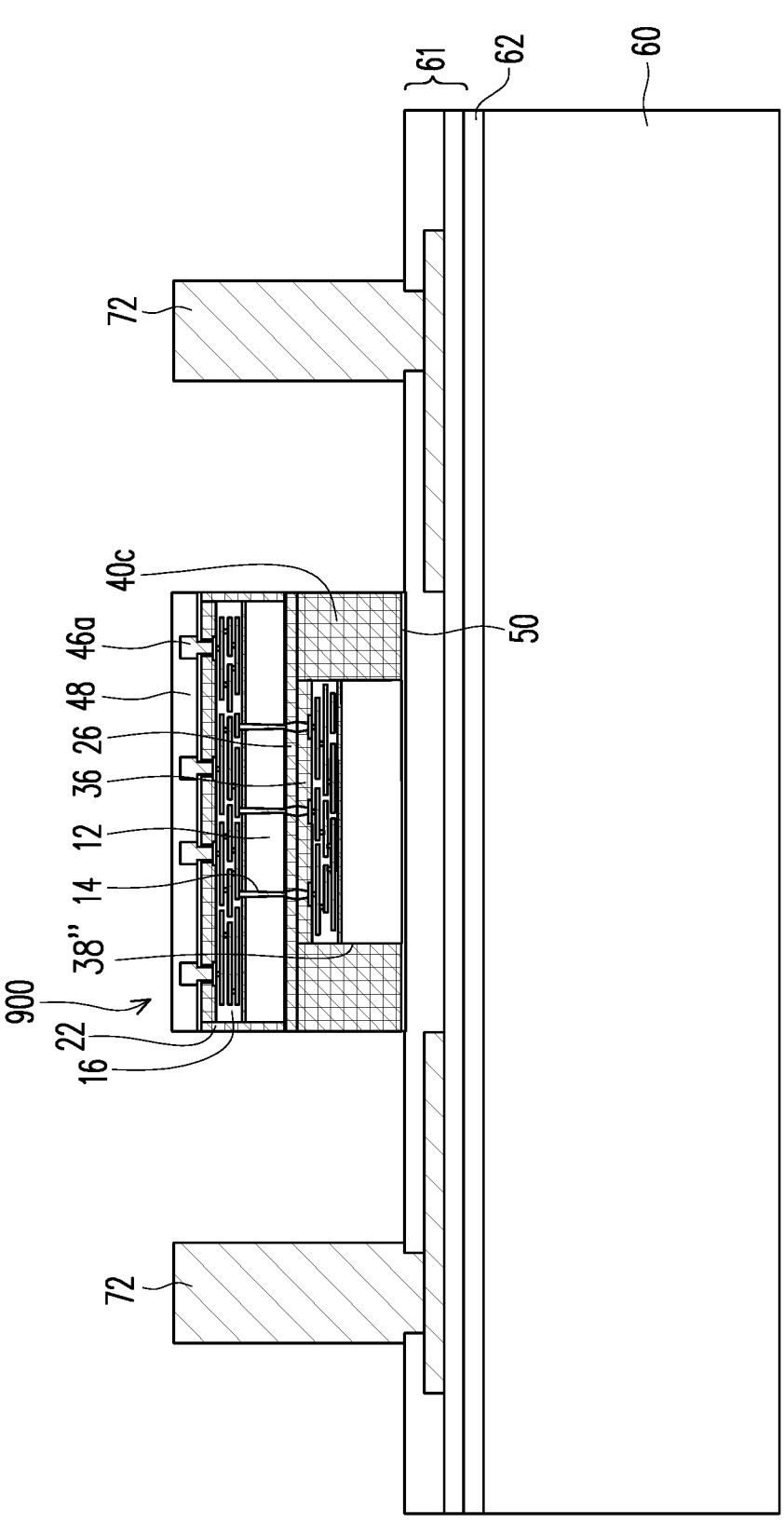
Figure 13F:
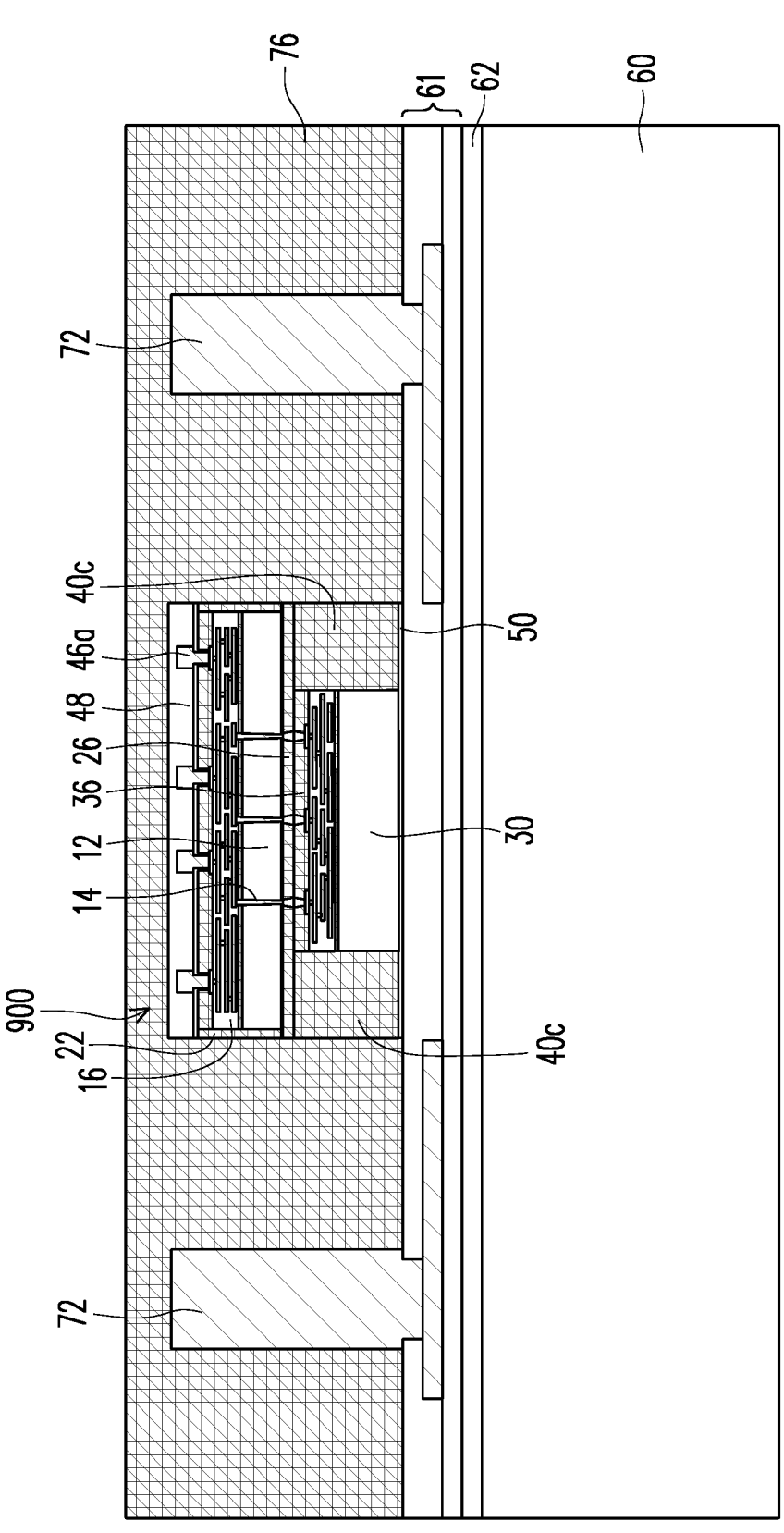
Figure 13G:
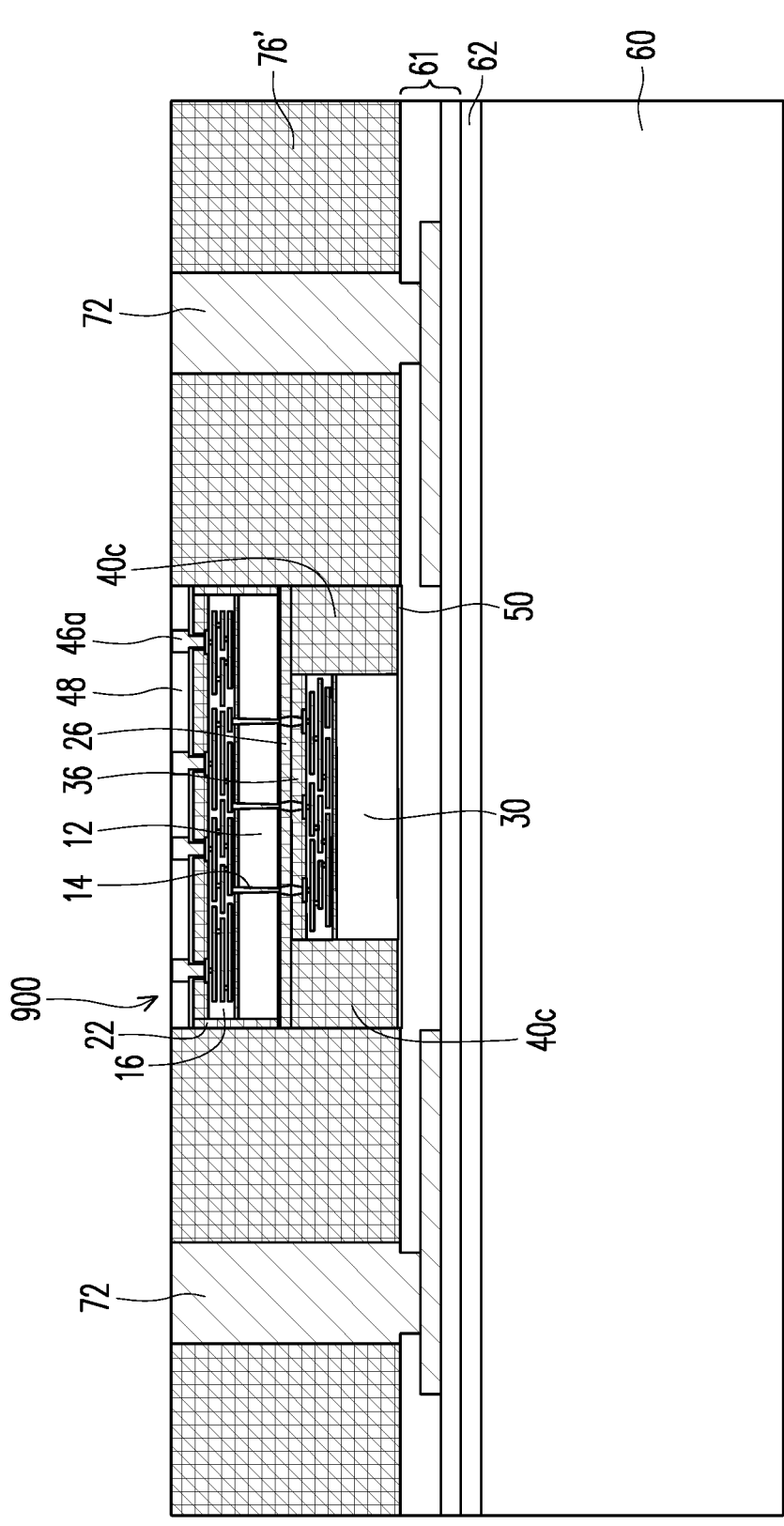
Figure 13H:
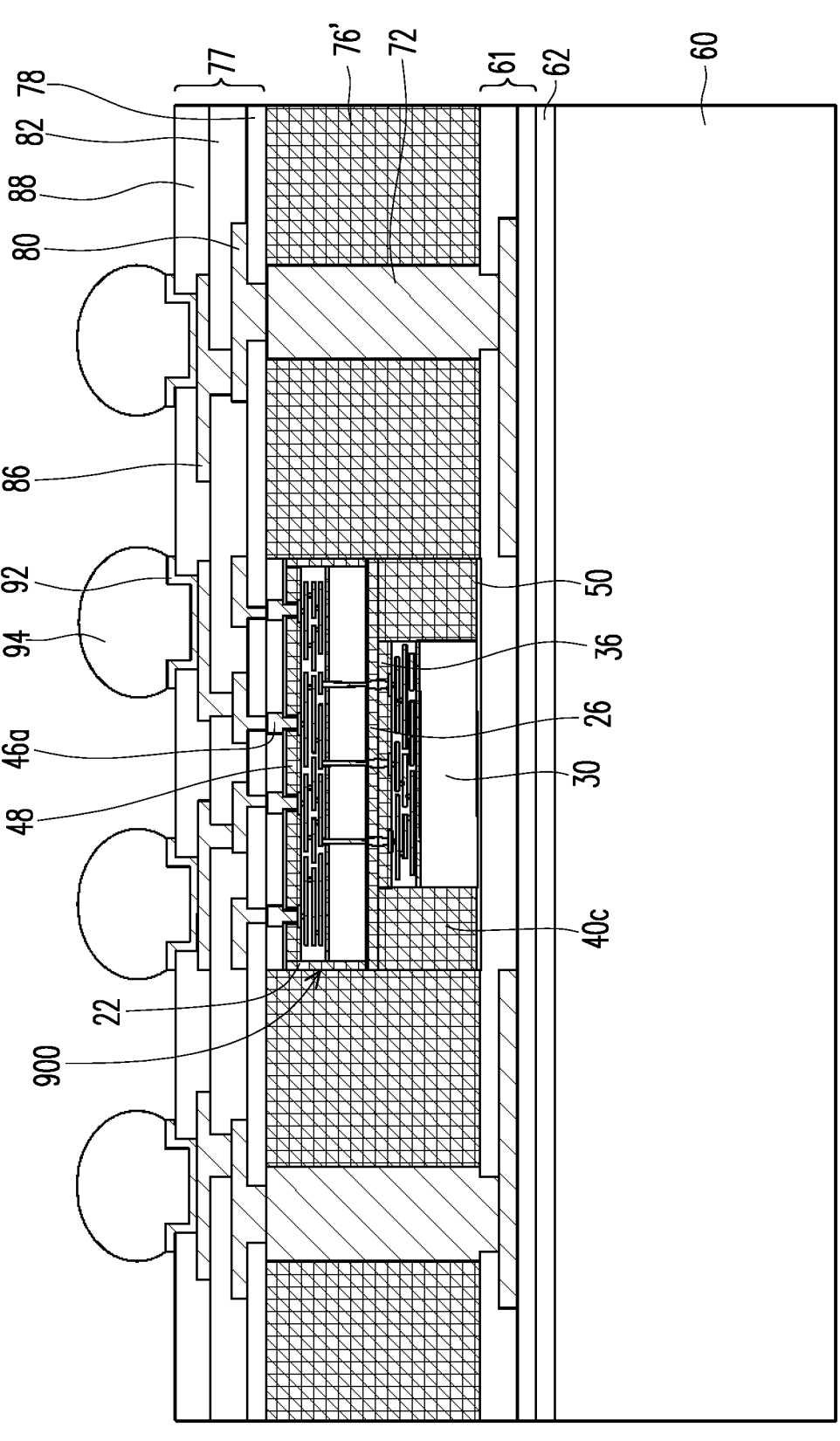
Figure 13I:
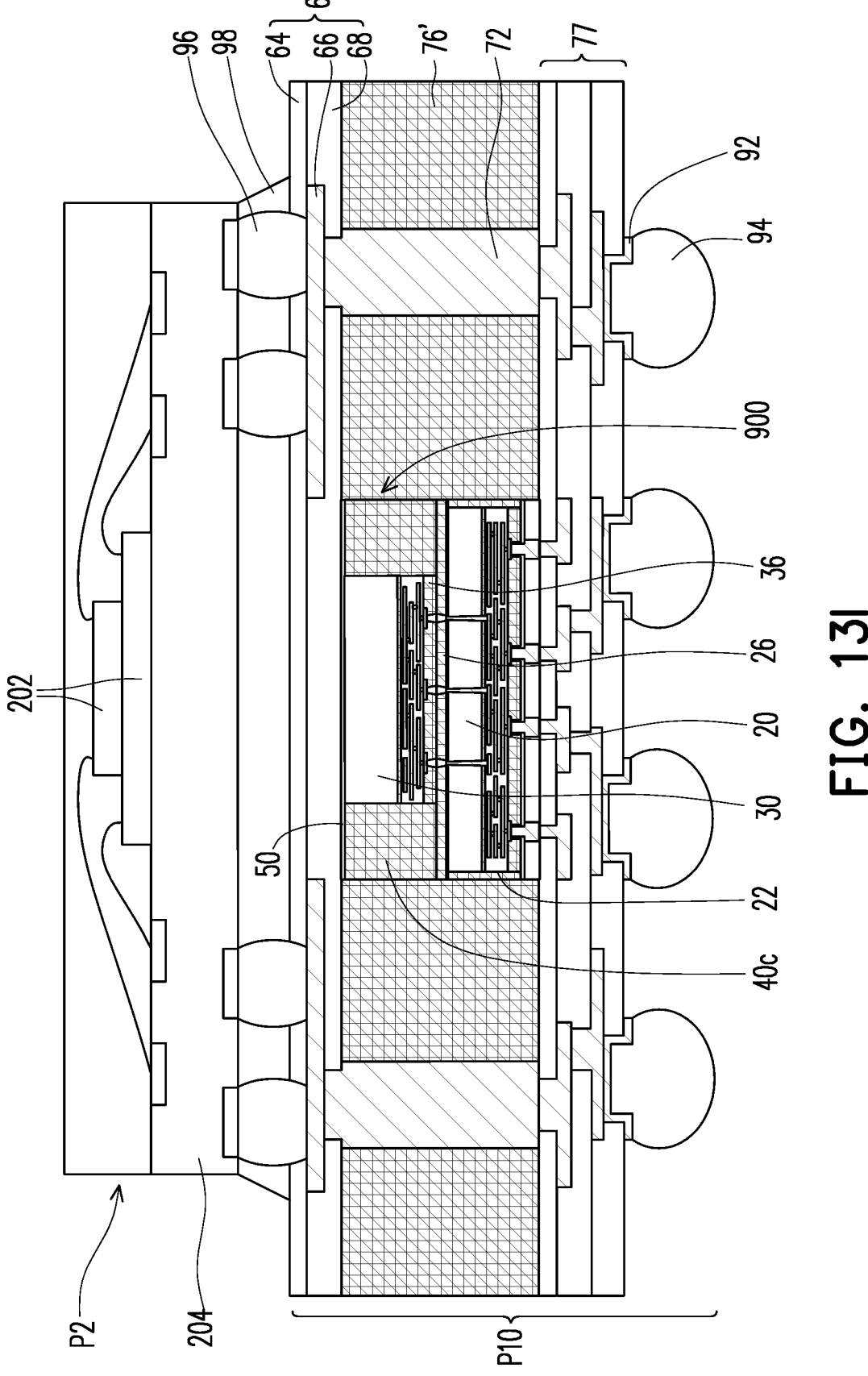

Referring FIG. 13E, after forming the conductive through vias 72, at least one SoIC structure 900 is picked-up and placed over the dielectric layer 68 of the redistribution circuit structure 61. Only a single SoIC structure 900 and its surrounding conductive through vias 72 are illustrated in FIG. 13E for illustrative purposes. It is noted, however, that the process steps shown in FIGS. 13A through 13I may be performed at wafer level, and are performed on multiple SoIC structure 900 and the conductive through vias 72 disposed over the carrier 60. As illustrated in FIG. 13E, the attachment film 50 in the SoIC structure 900 is adhered to the dielectric layer 68.

Referring to FIGS. 13F through 13I, since the processes illustrated in FIGS. 13F through 13I are the same as that illustrated in FIGS. 2F through 2I, detailed descriptions regarding to the processes illustrated in FIGS. 13F through 13I are thus omitted.

According to some embodiments of the present application, a device die including anti-arcing layer is proposed. The anti-arcing layer in the device die (e.g., SoIC die) can protect the device die from being damaged by ESD generated from bonding/de-bonding processes. According to some other embodiments, a method for fabricating including two-step removal process of insulating encapsulation material is proposed. The two-step removal process of insulating encapsulation material can protect the device die from being damaged by ESD generated from bonding/de-bonding processes.

In accordance with some embodiments of the disclosure, a device die including a first semiconductor die, a second semiconductor die, an anti-arcing layer and a first insulating encapsulant is provided. The second semiconductor die is stacked over and electrically connected to the first semiconductor die. The anti-arcing layer is in contact with the second semiconductor die. The first insulating encapsulant is disposed over the first semiconductor die and laterally encapsulates the second semiconductor die. In some embodiments, the anti-arcing layer is in contact with sidewalls of the second semiconductor die, and the second semiconductor die is spaced apart from the first insulating encapsulant by the anti-arcing layer. In some embodiments, the anti-arcing layer includes first portion and second portions, the first portions cover sidewalls of the second semiconductor die, the second semiconductor die is spaced apart from the first insulating encapsulant by the first portions, the second portions are disposed between the first semiconductor die and the first insulating encapsulant, and the first semiconductor die is spaced apart from the first insulating encapsulant by the second portions. In some embodiments, the device die further includes an attachment film in contact with a top surface of the first insulating encapsulant, a back surface of the second semiconductor die and top ends of the first portions. In some embodiments, top ends of the first portions are substantially level with a top surface of the first insulating encapsulant and a back surface of the second semiconductor die. In some embodiments, the second portions of the anti-arcing layer include inner ends and outer ends opposite to the inner ends, the inner ends of the second portions are connected to bottom ends of the first portions, and the outer ends of the second portions are substantially aligned with sidewalls of the first insulating encapsulant. In some embodiments, the device die further includes a second insulating encapsulant laterally encapsulating the first semiconductor die, wherein sidewalls of the second insulating encapsulant are substantially aligned with sidewalls of the first insulating encapsulant. In some embodiments, the device die further includes an attachment film in contact with a top surface of the first insulating encapsulant, a back surface of the second semiconductor die and the anti-arcing layer. In some embodiments, the device die further includes a first bonding structure and a second bonding structure, the first bonding structure is disposed on a back surface of the first semiconductor die, the second bonding structure is disposed on a front surface of the second semiconductor die, wherein the first bonding structure and the second bonding structure are disposed between the first semiconductor die and the second semiconductor die, and the second semiconductor die is electrically connected to the first semiconductor die through the first bonding structure and the second bonding structure. In some embodiments, the anti-arcing layer includes a metallic layer in contact with the second semiconductor die. In some embodiments, the anti-arcing layer includes a metallic layer in contact with the second semiconductor die and a dielectric layer covering the metallic layer.

In accordance with some other embodiments of the disclosure, a method for fabricating a device die is provided. The method includes: bonding a top tier semiconductor die to a bottom tier semiconductor die through a first bonding structure formed on a front surface of the top tier semiconductor die and a second bonding structure formed on a back surface of the bottom tier semiconductor die; forming an anti-arcing material layer covering sidewalls of the top tier semiconductor die, a back surface of the top tier semiconductor die and the back surface of the bottom tier semiconductor die; forming an insulating material over the anti-arcing material layer; and partially removing the insulating material and the anti-arcing material layer until the back surface of the top tier semiconductor die is revealed such that an insulating encapsulant and an anti-arcing layer are formed, wherein the insulating encapsulant is formed over the first semiconductor die and laterally encapsulating the second semiconductor die, and the anti-arcing layer is formed to cover the sidewalls of the top tier semiconductor die and the back surface of the bottom tier semiconductor die. In some embodiments, the anti-arcing material layer is conformally deposited to cover the sidewalls of the top tier semiconductor die, the back surface of the top tier semiconductor die and the back surface of the bottom tier semiconductor die. In some embodiments, forming the anti-arcing material layer includes: forming a metallic to cover the sidewalls of the top tier semiconductor die, the back surface of the top tier semiconductor die and the back surface of the bottom tier semiconductor die. In some embodiments, forming the anti-arcing material layer further includes forming a dielectric layer over the metallic layer. In some embodiments, the method further includes: bonding the insulating encapsulant and the back surface of the top tier semiconductor to a carrier; forming conductive terminals over a front surface of the bottom tier semiconductor die; and after forming the conductive terminals, de-bonding the carrier from the insulating encapsulant and the back surface of the top tier semiconductor.

In accordance with some other embodiments of the disclosure, a method for fabricating a device die is provided.

The method includes: bonding a top tier semiconductor die to a bottom tier semiconductor die through a first bonding structure formed on a front surface of the top tier semiconductor die and a second bonding structure formed on a back surface of the bottom tier semiconductor die; forming an insulating encapsulant laterally encapsulating the top tier semiconductor die; and forming an anti-arcing material layer covering the top tier semiconductor die and the insulating encapsulant. In some embodiments, forming the anti-arcing material layer includes forming a metallic to cover the top tier semiconductor die and the insulating encapsulant. In some embodiments, forming the anti-arcing material layer further includes forming a dielectric layer over the metallic layer. In some embodiments, the method further includes: bonding the anti-arcing material layer to a carrier; forming conductive terminals over a front surface of the bottom tier semiconductor die; and after forming the conductive terminals, de-bonding the carrier from the anti-arcing material layer.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method for fabricating a device die, the method comprising:

providing a first semiconductor die covered by a first bonding structure, wherein the first semiconductor die comprises a first semiconductor substrate and a first interconnect structure disposed on and electrically connected to the first semiconductor substrate, the first bonding structure and the first interconnect structure are formed on opposite sides of the first semiconductor substrate;

providing a second semiconductor die comprising a second bonding structure;

bonding the second bonding structure of the second semiconductor die to the first bonding structure;

forming an anti-arcing material layer covering sidewalls of the second semiconductor die, a back surface of the second semiconductor die, and portions of the first bonding structure;

removing portions of the anti-arcing material layer to form an anti-arcing layer to reveal the back surface of the second semiconductor die; and laterally encapsulating the second semiconductor die with a first insulating encapsulant formed over the anti-arcing layer.

2. The method of claim 1, wherein the portions of the anti-arcing material layer are removed when forming the first insulating encapsulant.

3. The method of claim 1, wherein forming the anti-arcing layer and the first insulating encapsulant comprises:

forming an insulating material over the first semiconductor die and the second semiconductor die; and partially removing the insulating material and the anti-arcing material layer until the back surface of the second semiconductor die is revealed.

4. The method of claim 1, wherein the first bonding structure comprises a first bonding dielectric layer and first bonding conductors embedded in the first bonding dielectric layer, the second bonding structure comprises a second bonding dielectric layer and second bonding conductors embedded in the second bonding dielectric layer, and bonding the second bonding structure of the second semiconductor die to the first bonding structure comprising bonding the second bonding dielectric layer to the first bonding dielectric layer and bonding the second bonding conductors to the first bonding conductors.

5. The method of claim 1, wherein the second semiconductor die comprises a second semiconductor substrate and a second interconnect structure disposed on and electrically connected to the second semiconductor substrate, and the second bonding structure is formed on the second interconnect structure.

6. The method of claim 5, wherein the first bonding structure and the second bonding structure are disposed between the first semiconductor substrate and the second interconnect structure.

7. The method of claim 1, wherein the first semiconductor die is laterally encapsulated by a second insulating encapsulant.

8. The method of claim 7, wherein laterally encapsulating the second semiconductor die with the first insulating encapsulant and the anti-arcing layer comprises:
    forming an anti-arcing material layer and an insulating material covering sidewalls of the second semiconductor die, a back surface of the second semiconductor die, and portions of the first bonding structure; and
    removing portions of the insulating material and portions of the anti-arcing material layer to form the first insulating encapsulant and the anti-arcing layer.

9. The method of claim 8, wherein the anti-arcing layer is formed to space apart the second semiconductor die and the first insulating encapsulant.

10. The method of claim 7, wherein the first semiconductor die and the second semiconductor die are bonded to each other by face-to-back manner.

11. The method of claim 7, wherein the first insulating encapsulant is spaced apart from the second insulating encapsulant by the first bonding structure and the anti-arcing layer.

12. A method for fabricating a device die, the method comprising:
    bonding a top tier semiconductor die to a bottom tier semiconductor die through a first bonding structure formed on a front surface of the top tier semiconductor die and a second bonding structure formed on a back surface of the bottom tier semiconductor die;
    forming an anti-arcing material layer covering sidewalls of the top tier semiconductor die, a back surface of the top tier semiconductor die and the back surface of the bottom tier semiconductor die, forming the anti-arcing material layer comprises:
        forming a metallic layer to cover the sidewalls of the top tier semiconductor die, the back surface of the top tier semiconductor die and the back surface of the bottom tier semiconductor die; and
        forming the anti-arcing material layer further comprises forming a dielectric layer over the metallic layer;
    forming an insulating material over the anti-arcing material layer; and
    partially removing the insulating material and the anti-arcing material layer until the back surface of the top tier semiconductor die is revealed such that an insulating encapsulant and an anti-arcing layer are formed, wherein the insulating encapsulant is formed over the bottom tier semiconductor die and laterally encapsulating the top tier semiconductor die, and the anti-arcing layer is formed to cover the sidewalls of the top tier semiconductor die and the back surface of the bottom tier semiconductor die.

13. The method of claim 12, wherein the anti-arcing material layer is conformally deposited to cover the sidewalls of the top tier semiconductor die, the back surface of the top tier semiconductor die and the back surface of the bottom tier semiconductor die.

14. The method of claim 12, wherein the bottom tier semiconductor die comprises a first semiconductor substrate and a first interconnect structure disposed on and electrically connected to the first semiconductor substrate, the first bonding structure and the first interconnect structure are formed on opposite sides of the first semiconductor substrate, and the top tier semiconductor die comprises a second semiconductor substrate and a second interconnect structure disposed on and electrically connected to the second semiconductor substrate, and the second bonding structure is formed on the second interconnect structure.

15. The method of claim 14, wherein the second bonding structure comprises a first bonding dielectric layer and first bonding conductors embedded in the first bonding dielectric layer, the first bonding structure comprises a second bonding dielectric layer and second bonding conductors embedded in the second bonding dielectric layer, and bonding the top tier semiconductor die to the bottom tier semiconductor die comprises bonding the second bonding structure to the first bonding structure comprising bonding the second bonding dielectric layer to the first bonding dielectric layer and bonding the second bonding conductors to the first bonding conductors.

16. The method of claim 12 further comprising:
    bonding the insulating encapsulant and the back surface of the top tier semiconductor to a carrier;
    forming conductive terminals over a front surface of the bottom tier semiconductor die; and
    after forming the conductive terminals, de-bonding the carrier from the insulating encapsulant and the back surface of the top tier semiconductor.

17. A method, comprising:
    laterally encapsulating a first semiconductor die with a first insulating encapsulant;
    disposing a second semiconductor die over the first semiconductor die and the first insulating encapsulant;
    forming an anti-arcing material layer in contact with the second semiconductor die; and
    forming a second insulating encapsulant over the first semiconductor die and the anti-arcing material layer to laterally encapsulate the second semiconductor die, wherein a top surface of the second insulating encapsulant substantially levels with a surface of the second semiconductor die.

18. The method of claim 17, wherein forming the anti-arcing material layer comprises forming a metallic layer in contact with the second semiconductor die.

19. The method of claim 17, wherein sidewalls of the second insulating encapsulant are substantially aligned with sidewalls of the first insulating encapsulant.

20. The method of claim 17, wherein the anti-arcing material layer comprises first portions and a second portion connected to the first portions, the first portions extend along sidewalls of the second semiconductor die, and the second portions extend along a surface of the first semiconductor die where the second semiconductor die is disposed.

\* \* \* \* \*